United States Patent
Zuckerman et al.

(10) Patent No.: US 7,822,856 B2
(45) Date of Patent: *Oct. 26, 2010

(54) OBTAINING ERASURE-CODED FRAGMENTS USING PUSH AND PULL PROTOCOLS

(75) Inventors: Gal Zuckerman, Petah-Tikva (IL); Gil Thieberger, Kiryat Tivon (IL)

(73) Assignee: PatentVC Ltd., Kiryat Tivon (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/579,724

(22) Filed: Oct. 15, 2009

(65) Prior Publication Data

US 2010/0095184 A1    Apr. 15, 2010

Related U.S. Application Data

(60) Provisional application No. 61/105,683, filed on Oct. 15, 2008, provisional application No. 61/251,437, filed on Oct. 14, 2009.

(51) Int. Cl.
*G06F 15/173* (2006.01)

(52) U.S. Cl. ............... 709/226; 709/217; 709/218; 709/219; 709/223; 709/230; 709/231

(58) Field of Classification Search ............ 709/217, 709/218, 219, 223, 230, 231, 226
See application file for complete search history.

(56) References Cited

U.S. PATENT DOCUMENTS

| 7,174,385 | B2 | 2/2007 | Li | |
|---|---|---|---|---|
| 2005/0033856 | A1* | 2/2005 | Li | 709/231 |
| 2005/0175008 | A1* | 8/2005 | Thompson | 370/390 |
| 2006/0005224 | A1* | 1/2006 | Dunning et al. | 725/115 |
| 2007/0130361 | A1* | 6/2007 | Li | 709/231 |
| 2007/0133420 | A1* | 6/2007 | Guven et al. | 370/238 |
| 2007/0174192 | A1 | 7/2007 | Gladwin | |
| 2008/0065975 | A1 | 3/2008 | Massoulie | |
| 2008/0134258 | A1 | 6/2008 | Goose | |
| 2008/0155061 | A1* | 6/2008 | Afergan et al. | 709/218 |
| 2008/0189429 | A1 | 8/2008 | DaCosta | |
| 2008/0253564 | A1* | 10/2008 | Kahn et al. | 380/200 |
| 2008/0256418 | A1 | 10/2008 | Luby | |
| 2008/0307107 | A1 | 12/2008 | Chen | |
| 2009/0083394 | A1 | 3/2009 | Diot | |
| 2009/0106441 | A1 | 4/2009 | Zuckerman | |
| 2009/0276402 | A1* | 11/2009 | Stiers | 707/3 |

FOREIGN PATENT DOCUMENTS

WO    WO 01/90903    11/2001

OTHER PUBLICATIONS

Suh, Push-to-Peer Video-on-Demand system design and evaluation, Thomson Technical Report, Nov. 29, 2006.

(Continued)

*Primary Examiner*—Liangche A Wang

(57) ABSTRACT

Obtaining erasure-coded fragments using push and pull protocols, including the steps of receiving a first set of erasure-coded fragments associated with segments via a transmission using push protocol, whereby the first set is not sufficient for reconstructing some of the segments; and retrieving a second set of erasure-coded fragments using a fragment pull protocol, wherein the first and the second sets together are sufficient for reconstructing the segments.

20 Claims, 34 Drawing Sheets

OTHER PUBLICATIONS

Lee, Parallel video servers: a tutorial, IEEE Multimedia, Apr.-Jun. 1998.

Suh, Push-to-Peer Video-on-Demand system, design and evaluation, 2007.

Mitzenmacher, Digital Fountains: A Survey and Look Forward, IEEE Information Theory Workshop, Oct. 2004.

Mahanti, Scalable on-demand media streaming with packet loss recovery, SIGCOMM'01, Aug. 2001.

Dimakis, Network Coding for Distributed Storage Systems, Proc. of IEEE INFOCOM, 2007.

Kubiatowicz, OceanStore: An Architecture for Global-Scale Persistent Storage, ASPLOS 2000, Cambridge, Massachusetts, Nov. 2000.

Agarwal, Fast data access over asymmetric channels using fair and secure bandwidth sharing, International Conference on Distributed Computing Systems, 2006.

Wu, Segment Based Proxy Caching of Multimedia Streams, WWW10, May 2001.

Huang, Loss-resilient On-demand Media Streaming Using Priority Encoding, Proc, of ACM Multimedia, Oct. 2004.

Dony, Video-on-Demand over Internet. A Survey of Existing Systems and Solutions, Universitaires Norte-Dame de la Paix, 2008.

Kostic, High-bandwidth data dissemination for large-scale distributed systems, ACM Transactions on Computer Systems, vol. 26 No. 1, Article 3, Feb. 2008.

Kostic, Maintaining high bandwidth under dynamic network conditions, Proc. USENIX'05, Anaheim, CA, USA, Apr. 2005.

Rodriguez, Parallel-Access for Mirror Sites in the Internet, Proceedings of IEEE INFOCOM, 2000.

Cleversafe, A Paradigm Shift in Digital Asset Storage, Cleversafe Whitepaper, 2008.

Arnab, e-SAFE: An Extensible, Secure and Fault Tolerant Storage System, Georgia Tech, 2005.

Lee, Performance Analysis of a Pull-Based Parallel Video Server, IEEE Transactions on Parallel and Distributed Systems, Dec. 2000.

Suh, Push-to-Peer Video-on-Demand system: design and evaluation; Thomson Technical Report, Nov. 29, 2006.

Cleversafe, A Paradigm Shift in Digital Assest Storage, Cleversafe Whitepaper 2008.

Lee, Performance Analysis of a Pull-Based Parallel Video Server; IEEE Transactions on Parallel and Distributed Systems, Dec. 2000.

Lee, Parallel video servers: a tutorial, Multimedia, IEEE, Apr.-Jun. 1998.

Huang, Loss-resilient On-demand Media Streaming Using Priority Encoding, Proc. of ACM Multimedia 2004, Oct. 2004.

Wu, Segment-Based Proxy Caching of Multimedia Streams, WWW10, May 2001.

Suh, Push-to-Peer Video-on-Demand system: design and evaluation, 2007.

Mitzenmacher, Digital Fountains: A Survey and Look Forward, Information Theory Workshop, 2004. IEEE, Oct. 24-29, 2004.

\* cited by examiner

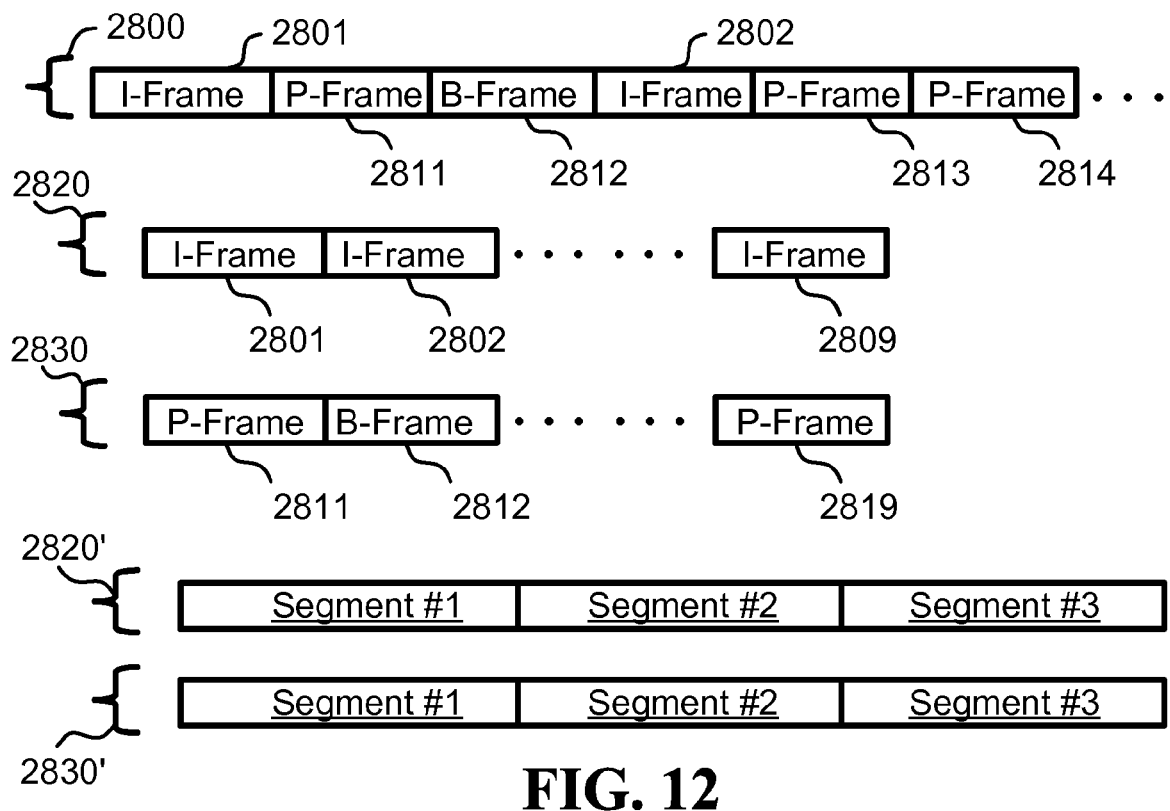

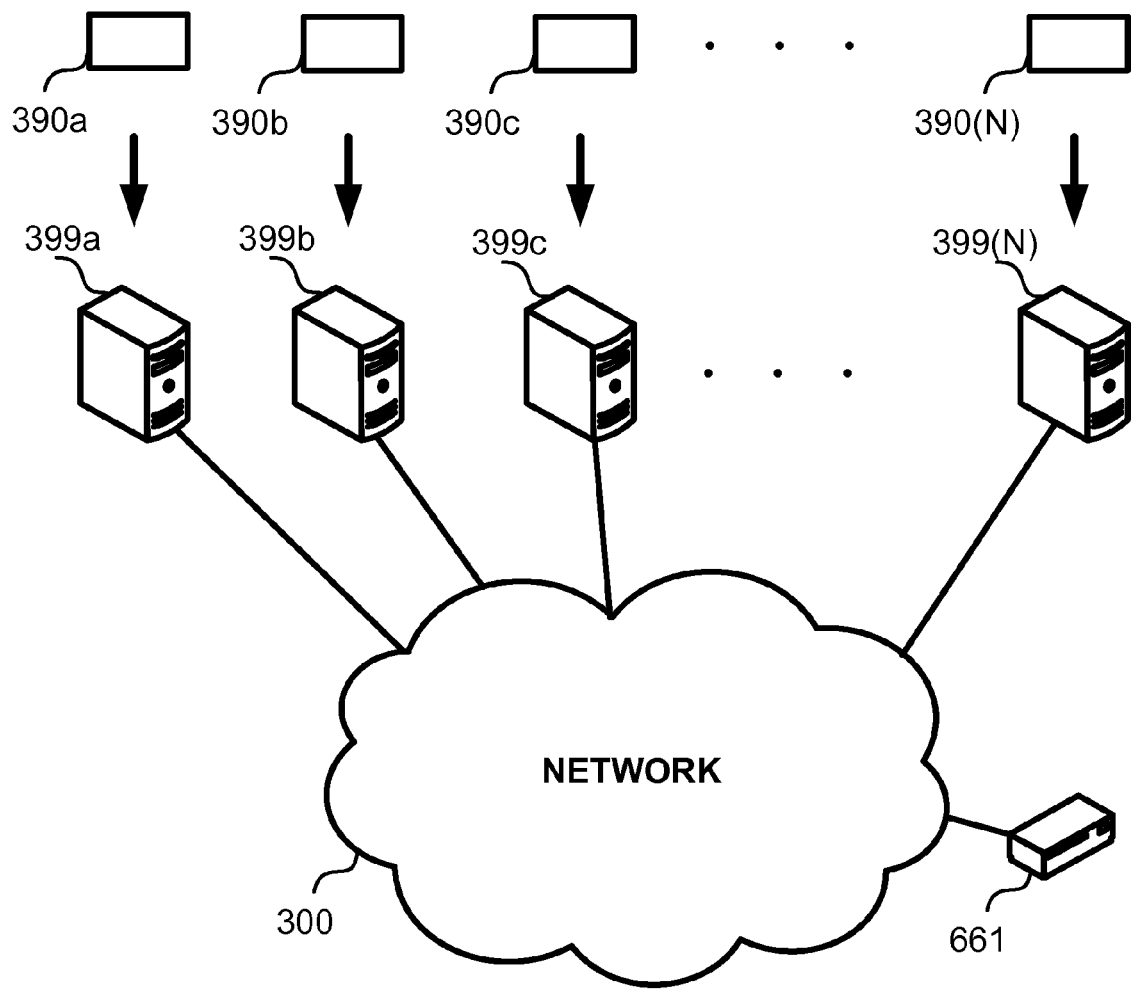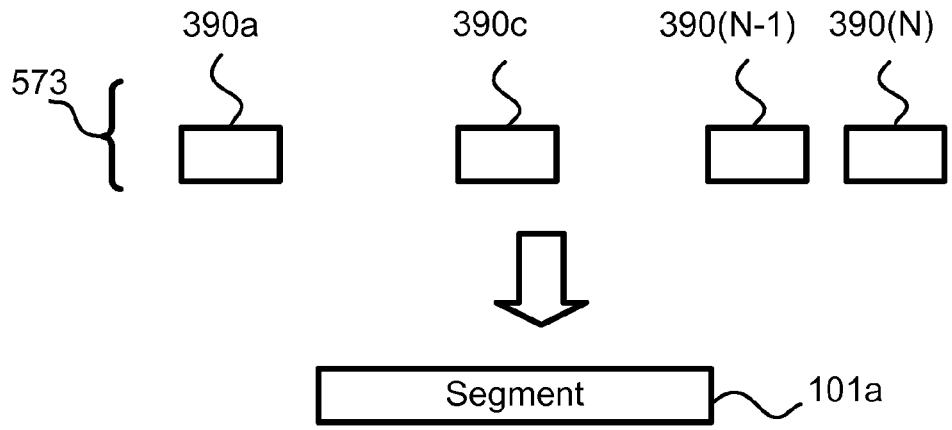
FIG. 17

○ = Internet Exchange Point (IX or IXP)
━━━ = Internet Backbone, or Tier 1 ISP network
─── = Tier 2 ISP network
----- = Tier 3 ISP network

OBTAINING ERASURE-CODED FRAGMENTS USING PUSH AND PULL PROTOCOLS

CROSS-REFERENCE TO RELATED APPLICATIONS

This application claims the benefit of U.S. Provisional Patent Application No. 61/105,683, filed Oct. 15, 2008, and U.S. Provisional Patent Application No. 61,251,437, filed Oct. 14, 2009.

The following co-pending US Patent Applications, filed on Oct. 14, 2009, include related subject matter: Ser. Nos. 12/579,044; 12/579,273; 12/579,291; 12/579,314; 12/579,327; 12/579,337; 12/579,355; 12/579,375; 12/579,380; 12/579,384; 12/579,386; 12/579,391; 12/579,396; 12/579,403; and 12/579,408. The following co-pending US Patent Applications, filed on Oct. 15, 2009, include related subject matter: Ser. Nos. 12/579,954; 12/580,181; 12/579,662; 12/580,200; 12/579,817; 12/579,858; 12/580,166; 12/579,774; 12/580,129; 12/580,104; 12/579,904; 12/580,205; 12/580,058; and 12/580,016.

BACKGROUND

In some architectures, an assembling device has to access many distributed servers in order to obtain a decodable quantity of erasure-coded fragments from a distributed storage system. Commonly used push protocols for accessing the distributed servers may be susceptible to fault conditions and may require a significant setup time. Basic principles and details relating to erasure codes and rateless codes may be found, for example, in the publication "Digital Fountains: A Survey and Look Forward" by Michael Mitzenmacher, Harvard University; and in publications by Michael G. Luby and Digital Fountain Inc.

BRIEF SUMMARY

In one embodiment, a method comprising: receiving a first set of erasure-coded fragments associated with segments via a transmission using push protocol, whereby the first set is not sufficient for reconstructing some of the segments; and retrieving a second set of erasure-coded fragments using a fragment pull protocol; wherein the first and the second sets together are sufficient for reconstructing the segments.

In one embodiment, a apparatus comprising: an assembling device configured to receive a first set of erasure-coded fragments from at least one server using a push protocol, wherein the first set is occasionally insufficient to decode the received fragments; the assembling device is further configured to retrieve a second set of erasure-coded fragments using a fragment pull protocol; wherein the first and second sets together comprise enough fragments to decode the fragments.

Implementations of the disclosed embodiments involve performing or completing selected tasks or steps manually, semi-automatically, fully automatically, and/or a combination thereof. Moreover, depending upon actual instrumentation and/or equipment used for implementing the disclosed embodiments, several embodiments could be achieved by hardware, by software, by firmware, or a combination thereof. In particular, with hardware, embodiments of the invention could exist by variations in the physical structure. Additionally, or alternatively, with software, selected functions of the invention could be performed by a data processor, such as a computing platform, executing software instructions or protocols using any suitable computer operating system. Moreover, features of the embodiments may be combined.

BRIEF DESCRIPTION OF THE DRAWINGS

The embodiments are herein described, by way of example only, with reference to the accompanying drawings. No attempt is made to show structural details of the embodiments in more detail than is necessary for a fundamental understanding of the embodiments. In the drawings:

FIG. 10 and FIG. 11 illustrate different embodiments of content segmentation.

FIG. 12 to FIG. 14 illustrate different embodiments of content segmentation according to components and/or properties.

FIG. 17 illustrates an assembling device obtaining erasure-coded fragments from fractional-storage servers.

DETAILED DESCRIPTION

Figure 1:
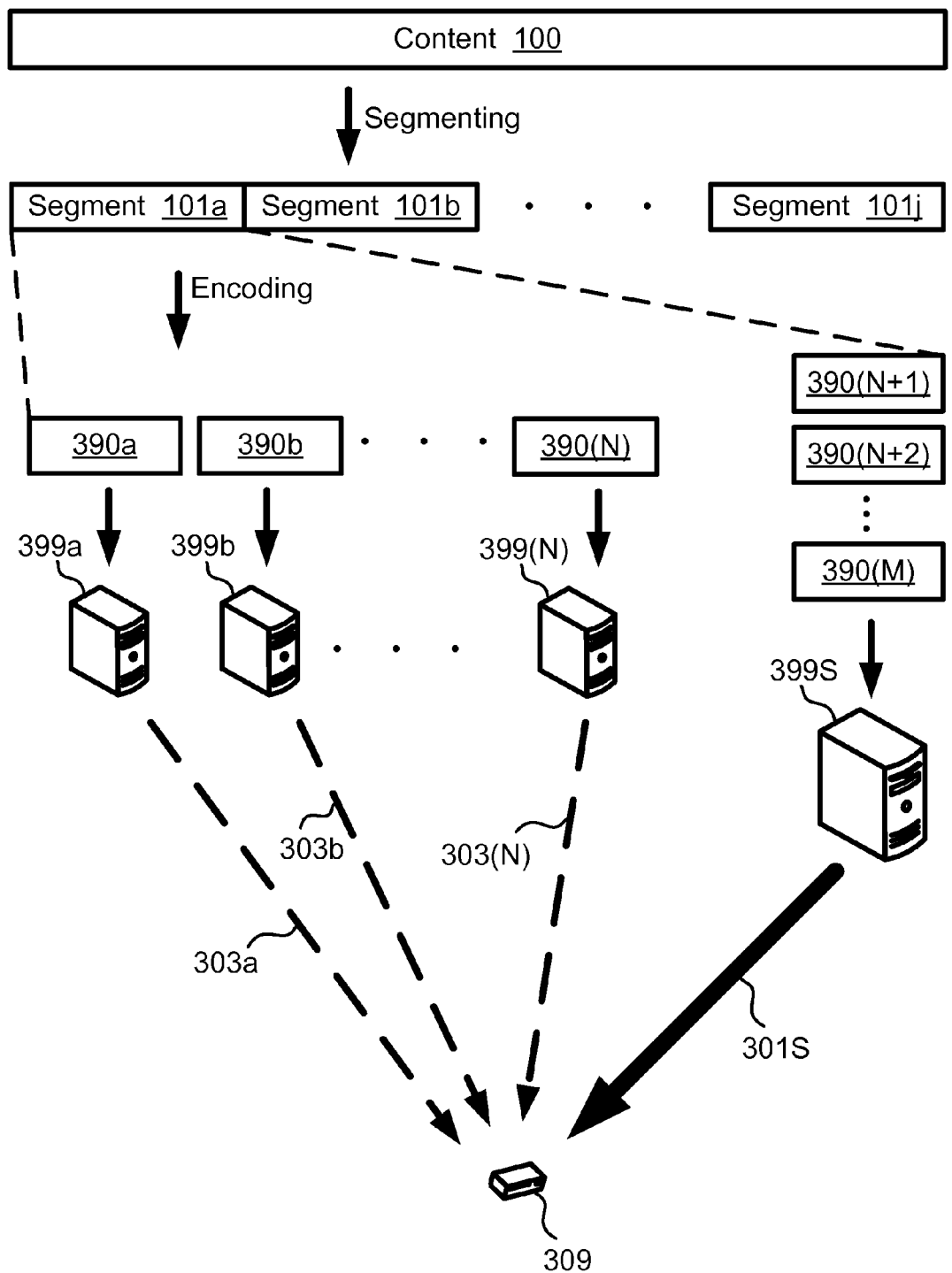
FIG. 1 illustrates operation of hybrid pull and push protocols.

FIG. 1 illustrates one embodiment, wherein segment 101a of content 100 is encoded into erasure-coded fragments 390a to 390(M), such that any sufficient subset of the fragments can be used to reconstruct segment 101a. Fragments 390a to 390(N) are stored in fractional-storage servers 399a to 399 (N) respectively, and fragments 390(N+1) to 390(M) are stored in streaming server 399S. In one example, fragments 390(N+1) to 390(M) form a group of fragments which are sufficient to reconstruct segment 101a. Subsequent segments 101b to 101j of content 100 may be similarly encoded into additional fragments stored on the servers (not illustrated). Assembling device 309 uses two different protocols approximately simultaneously to retrieve fragments for segment reconstruction: (i) a push protocol, and (ii) a fragment pull protocol. The push protocol 301S is used to deliver fragments 390(N+1) to 390(M) to assembling device 309. The push protocol may be RTP based or TCP-connection based, or any other type of transmission that does not require assembling device 309 to explicitly ask for each of fragments 390(N+1) to 390(M). In one example, fragments 390(N+1) to 390(M) are delivered to the assembling device using a single RTP stream 301S, such that upon reception of the fragments from the stream, the assembling device can immediately reconstruct the segment 101a. The fragment pull protocol is used by the assembling device to retrieve additional fragments that may be needed to reconstruct segment 101a if one or more fragments out of fragments 390(N+1) to 390(M) fail to reach the assembling device. In one example, fragment 390(N+2) fails to reach the assembling device due to Internet packet loss conditions (referred to as fragment loss). The assembling device, after concluding that fragment 390(N+2) is missing, uses a fragment pull protocol to retrieve a substitute fragment out of one of the fractional-storage servers 390a to 390(N), and uses this fragment to complete the reconstruction of the segment 101a (any one of fragments 390a to 390(N) will do). For example, the assembling device chooses fragment 390a as the one additional fragment, by requesting and receiving it 303a from server 399a, using a fragment pull protocol. If more fragments out of fragments 390(N+1) to 390(M) fail to reach the assembling device 309, it may compensate by pulling substitute fragments from some or all of servers 399a to 399(N), illustrated as fragment pull protocol requests and responses 303a to 303(N)).

In one embodiment, the fragment pull protocol requests for additional needed fragments are not made to fractional-storage servers 399a to 399(N), but are rather made to server 399S. In this case, the assembling device asks server 399S to retransmit the fragment which has failed to arrive. In this embodiment, only fragments that fail to reach the assembling device via the push transmission 301S cause an added communication overhead in the form of explicit fragment pull protocol requests, such that if no fragments are actually lost over transmission 301S, there is no need for fragment pull requests 303a to 303(N).

Figure 2:
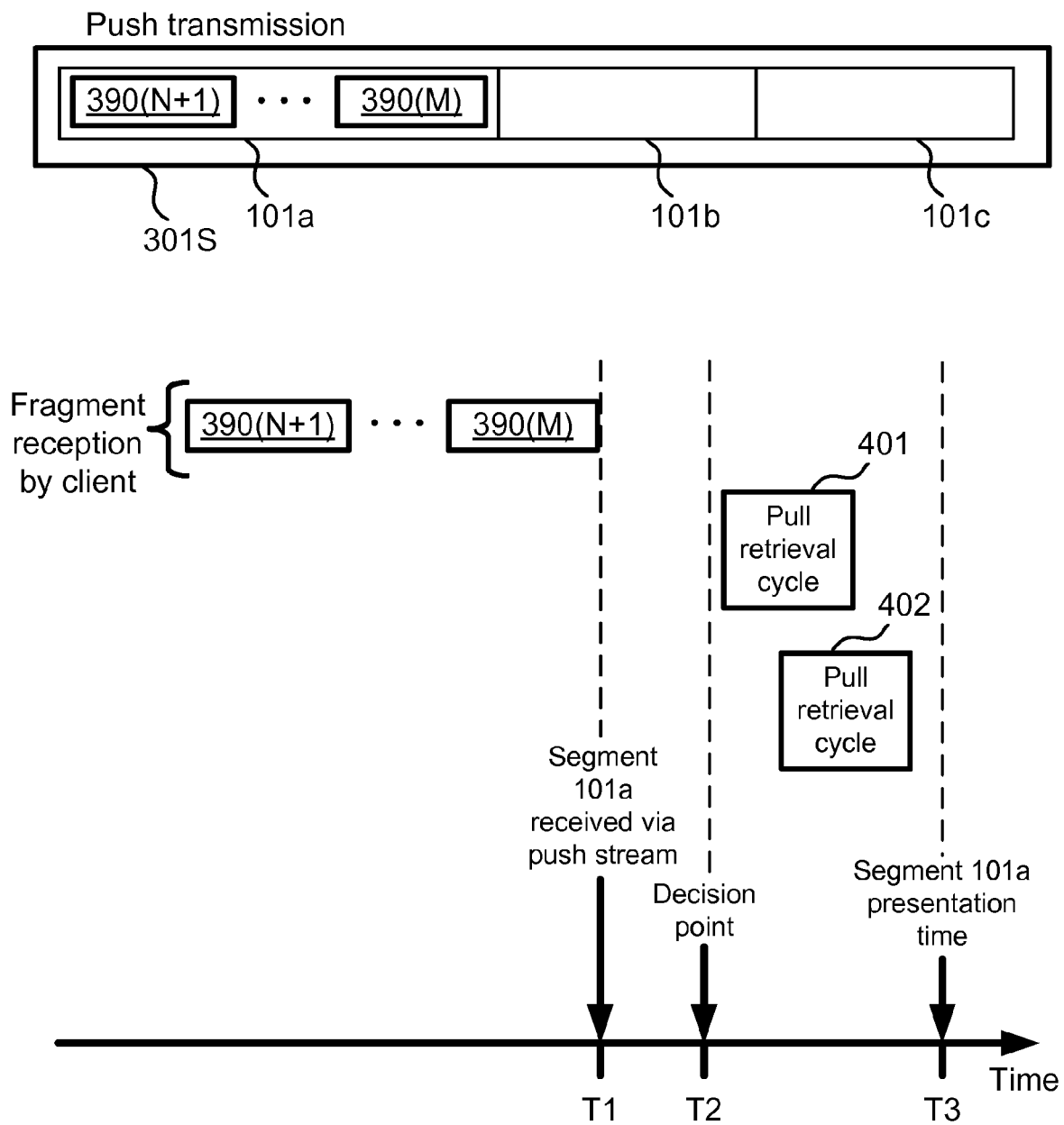
FIG. 2 illustrates operation of hybrid pull and push protocols.

FIG. 2 illustrates one example in which content 100 is streaming content, and segments 101a to 101j are approximately sequentially reconstructed by the assembling device 309 for presenting the streaming content. In this case, the stream 301S contains enough fragments from each segment, such that all needed fragments from all segments are streamed to the assembling device via stream 301S. The assembling device creates an intentional delay between reconstructed segments and displayed segments to have enough time to pull substitute fragments needed to compensate for lost or corrupted fragments arriving via stream 301S. Only fragments associated with segment 101a are illustrated for clarity. At time T1, the last fragment 390(M) of segment 101a has been received by the assembling device, and assuming no fragment loss or corruption in transmission, the assembling device may start reconstructing the segment 101a at that time. The presentation of the reconstructed segment 101a starts at time T3, such that the assembling device has the period of T3 minus T1 to obtain additional fragments of segment 101a, if some of the fragments of segment 101a fail to arrive via stream 301S. The assembling device has to decide prior to T3 whether enough fragments have been obtained, or, if one or more fragments have failed to arrive. The decision point is indicated as T2. T2 may be determined by various methods, such as one or more of the following: (i) waiting a predetermined period of T2 minus T1, where T2 includes the maximum delay allowed for the last fragment associated with segment 101a to be considered as properly obtained, (ii) allowing at least a period of T3 minus T2, wherein this period is the minimum period needed to supplement fragments that have failed to arrive using pull-protocol requests, or (iii) looking for discrepancies in the order of fragments arrival, and, upon detection of such discrepancy, immediately starting to retrieve additional fragments. At time T2, the assembling device has already estimated that not enough fragments will eventually arrive, or determines whether enough fragments have arrived.

Non-limiting examples of methods to determine whether enough fragments have arrived include, but are not limited to: (i) trying to reconstruct the segment, and, if not successful, deciding on supplementing with additional fragments, (ii) counting the received fragments, and determining if all fragments have arrived, or (iii) detecting discrepancies in the order of fragment arrival. At time T2, and assuming that the assembling device has reached a decision that additional fragments are required, the assembling device initiates optional fragment retrieval processes 401, 402, each requesting and receiving additional fragments needed to reconstruct the segment. All of the fragment retrieval processes should end prior to T3, in order for the assembling device to obtain enough fragments needed to reconstruct and present segment 101a. If not enough fragments are pulled during the period T3 minus T2, then the continuous presentation of the content to which segment 101a belongs may be interrupted. The process of retrieving the subsequent segments 101b, 101c is similar to the process described above, wherein pulled fragments supplement fragments which fail to be obtained correctly by the assembling device 309 via stream 301S.

Figure 3:
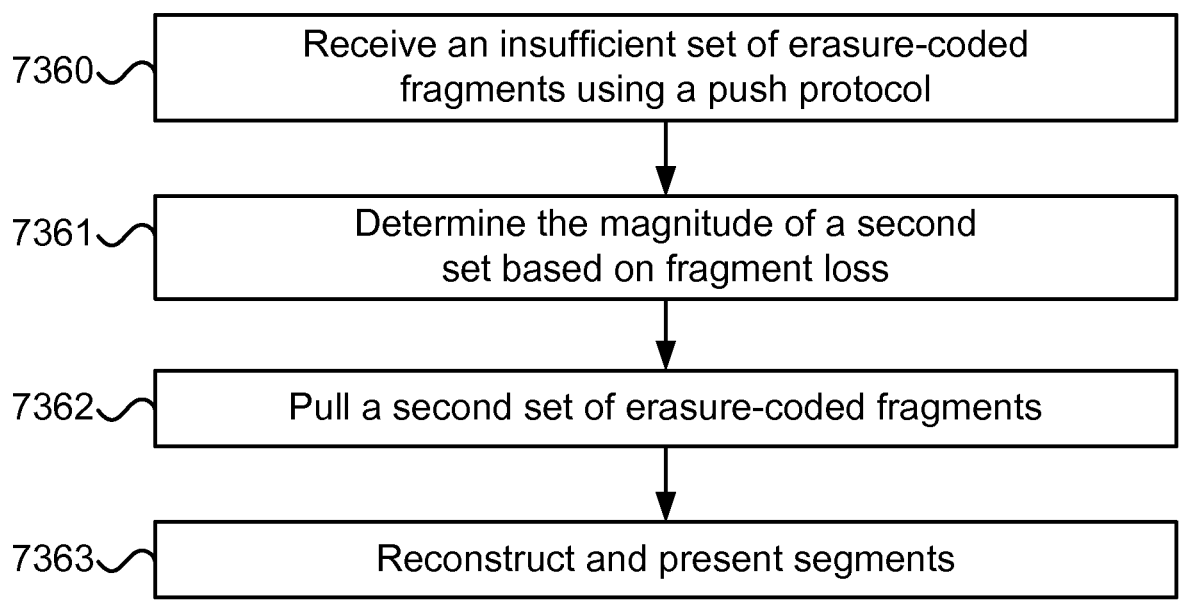
FIG. 3 is a flow diagram of one method in accordance with one embodiment.

FIG. 3 is a flow diagram illustrating one method, comprising the following steps: In step 7360, receiving a first set of erasure-coded fragments associated with segments via a transmission using push protocol, whereby the first set is not sufficient for reconstructing some of the segments. In optional step 7361, determining the magnitude of the second set based on the fragment loss associated with the transmission. In step 7362, retrieving a second set of erasure-coded fragments using a fragment pull protocol; wherein the first and the second sets together are sufficient for reconstructing the segments. And in optional step 7363, reconstructing the segments from the received and retrieved fragments, and starting to present the reconstructed segments while fragments are still being received and retrieved. Optionally, the transmission is a broadcast transmission. Optionally, the second set of fragments is retrieved from at least one fractional-storage CDN server. Optionally, the first set of fragments is received from at least two fractional-storage CDN servers.

Optionally, the first set of fragments is received from at least one streaming server using an HTTP or an RTP session. Optionally, at least a portion of the first set and at least a portion of the second set are obtained from the same server. Optionally, the erasure-coded fragments are rateless-coded fragments associated with segments of streaming content, and the first set of rateless-coded fragments is transmitted according to the sequential order of the segments. Optionally, the push protocol does not require a feedback channel from the receiver.

Figure 4:
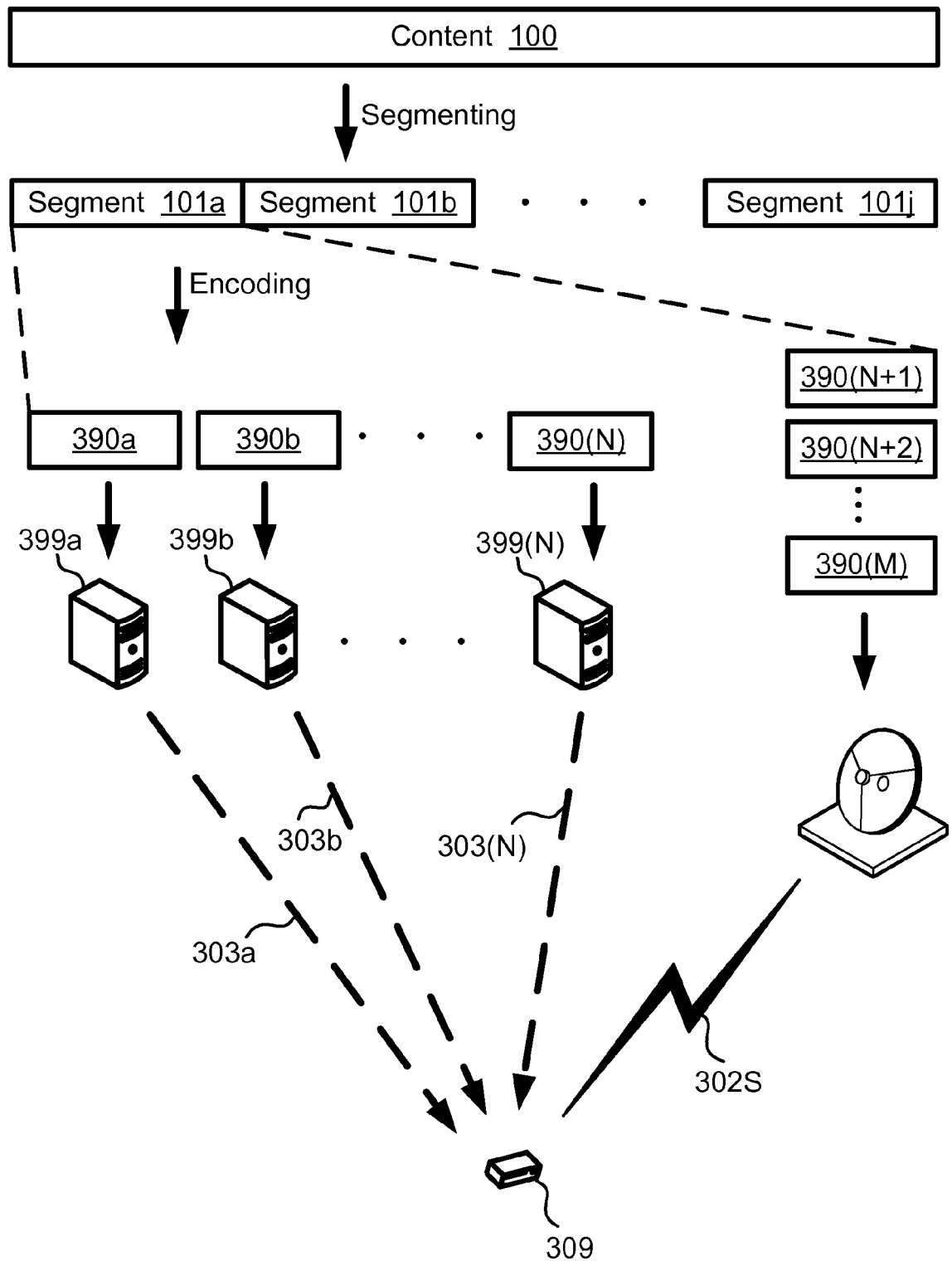
FIG. 4 illustrates operation of hybrid pull and broadcasted push protocols.

FIG. 4 illustrates one embodiment where the push-protocol transmission 301S of FIG. 1 is replaced by a broadcasted stream 302S. The broadcasted stream 302S may arrive via a satellite link, DVB-T (Digital Video Broadcasting-Terrestrial), DVB-H (Digital Video Broadcasting-Handheld), ATSC (Advanced Television Systems Committee), IP broadcast, IP multicast, WiMax, UMTS (Universal Mobile Telecommunications System), or any other broadcasting or broadcasting-like links. Fragments that fail to be correctly obtained by the assembling device are substituted with additional fragments using pull-protocol retrieval processes 303a to 303(N).

Figure 5:
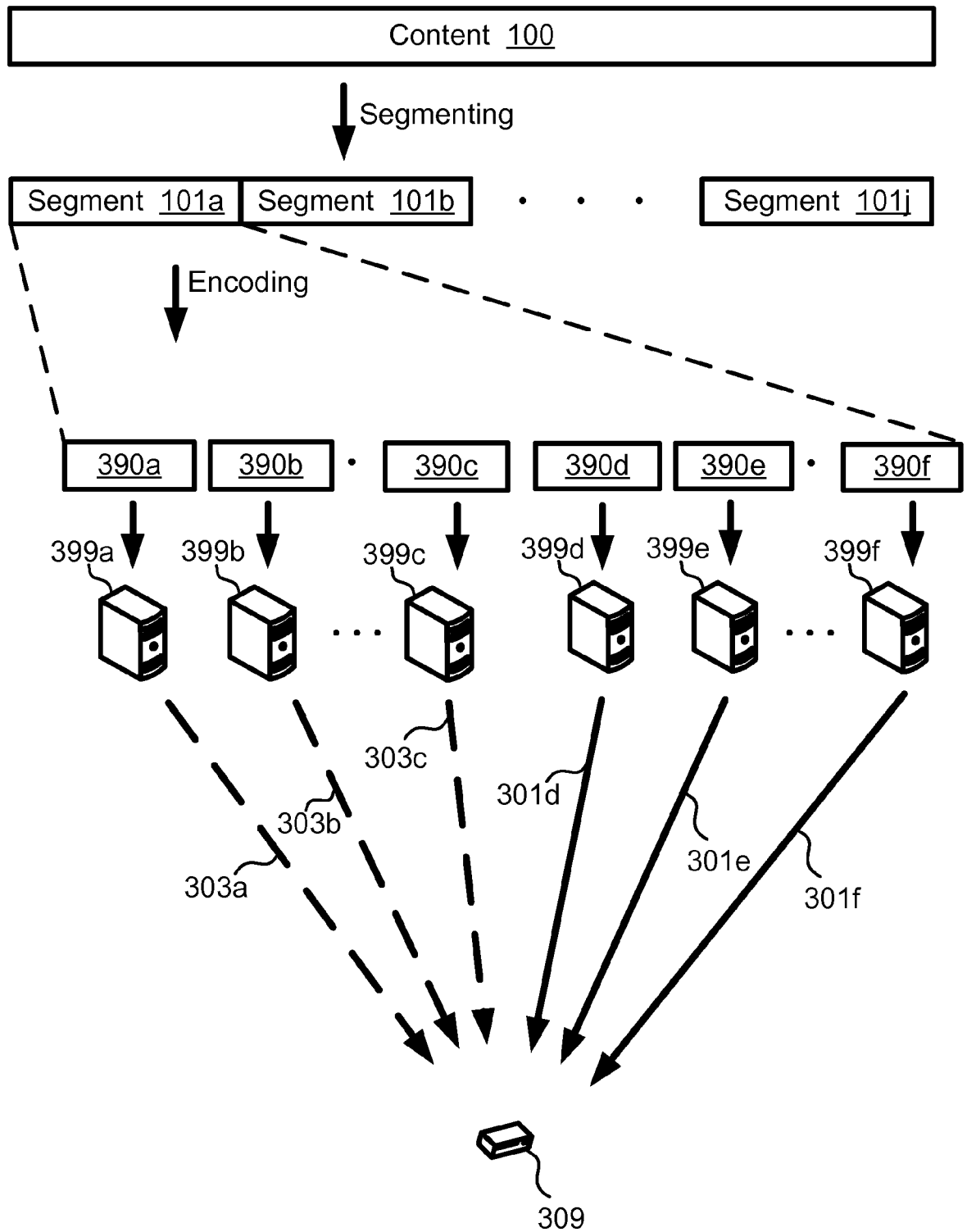
FIG. 5 and FIG. 6 illustrate operation of multiple hybrid pull and push protocols.

FIG. 5 illustrates one embodiment where the push-protocol transmission 301S of FIG. 1 is replaced by multiple push-protocol transmissions 301d to 301f, such that each transmission carries only a portion of the erasure-coded fragments carried by transmission 301S. In this case, servers 399d to 399f, which may be fractional-storage servers or store full replicas, replace the server 399S of FIG. 1. In one example, servers 399d to 399f are fractional-storage servers, and each of them transmits one erasure-coded fragment per segment to the assembling device 309. The assembling device aggregates fragments received by all transmissions 301d to 301f, and if one or more fragments fails to arrive correctly, the assembling device initiates one or more pull-protocol retrieval processes 303a to 303c to supplement with additional fragments.

Figure 6:
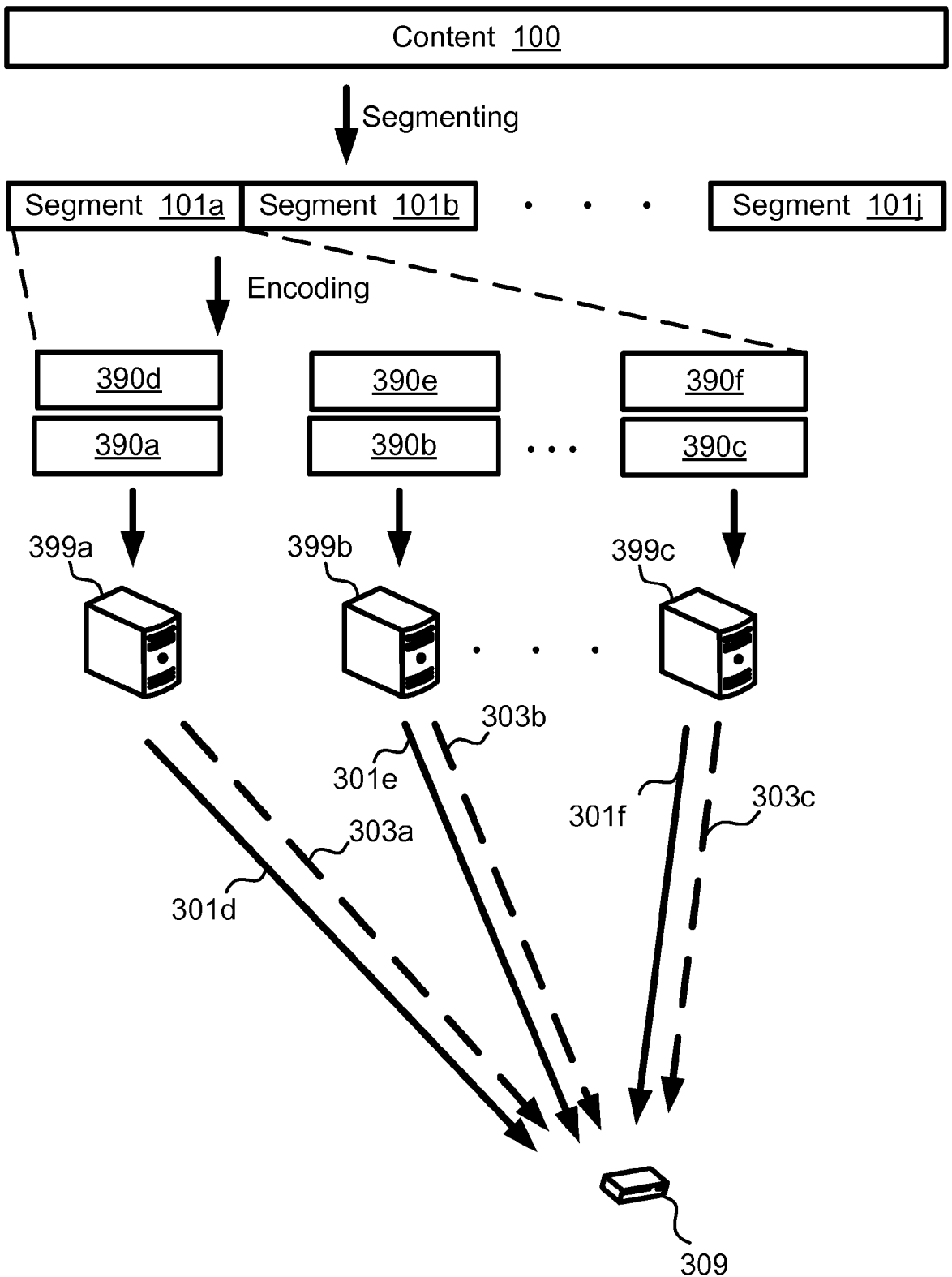

FIG. 6 illustrates one embodiment where the functionality of fractional-storage servers 399d to 399f of FIG. 5 is embedded within fractional-storage servers 399a to 399c, such that each of the servers 399a to 399c can send push-protocol transmissions to assembling devices, and service assembling devices requesting fragments via a fragment pull protocol. In one example, fractional-storage server 399a transmits a push-transmission 301d that contains fragment 390d to assembling device 309. Subsequent fragments associated with segments 101b to 101j may be included in transmission 301d, which may be a streaming transmission. Similarly, servers 399b and 399c transmit push-transmissions 301e and 301f containing fragments 390e and 390f respectively to assembling device 309. The assembling device 309 receives the push-transmissions, which are used to reconstruct segment 101a (and possibly subsequent segments as well), and determines whether enough erasure-coded fragments have been obtained. If not enough fragments have been obtained, the assembling device may use a fragment pull protocol to retrieve (303a to 303c) additional needed fragments (390a to 390c). In this example, the assembling device may approach any of the servers for substitute fragments, regardless of which fragment or fragments have failed to arrive, since all erasure-coded fragments 390a to 390f are unique.

In some embodiments, the push protocol is implemented using one or more sub-transmissions. Optionally, a push protocol transmission is implemented using multiple sub-transmissions, each transporting a fraction of the fragments transmitted by the push protocol transmission. A sub-transmission may be transported using an IP stream such as RTP, an HTTPS session, or any other form of transporting a sequence of fragments between a source server and a destination assembling device. For example, the push transmissions 301d to 301f in FIG. 5 and FIG. 6 may be transported using sub-transmissions.

In one example, content 100 segmented, erasure-coded, and fragments 390a, 390d are distributed to server 399a, fragments 390b, 390e are distributed to server 399b and fragments 390c, 390f are distributed to server 399c. Other fragments associated with other segments are similarly distributed to servers 399a to 399c. The servers may use a push protocol to transport the fragments to an assembling device. A push protocol may comprise a fragment transport protocol that sends a sequence of fragments associated with multiple segments from a source server to a destination assembling device. In one example, the fragments are ordered according to the sequential order of the segments in streaming content, and server 399a forms a push protocol transmission 301d to a destination assembling device 309. Transmission 301d may comprise a sequence of fragments starting from fragments 390a associated with segment 101a, and continuing with fragments associated with segment 101b (not illustrated), and other segments up to 101j. Push protocol transmission 301d can also be referred to as a sub-transmission, as it transports only a fraction of the fragments needed to reconstruct segments 101a to 101j. In a similar fashion, servers 399b, 399c may transmit additional push protocol transmissions 301e, 301f to assembling device 309, wherein each such transmission (also referred to as sub-transmission) comprises a sequence of fragments optionally starting from segment 101a and up to segment 101j. The first fragment in the sequence transmitted by server 399b may be fragment 390b (or 390e, or both), and the first fragment in the sequence transmitted by server 399c may be fragment 390c. When using a push transmission, the assembling device 309 may not ask explicitly for each fragment, but may instruct each of the different servers to start sending it a fragment sequence.

In one example (not illustrated), the storage gain equals one and if one fragment fails to arrive, the assembling device has to access the specific server storing the specific fragment, and request the specific fragment via a pull protocol. The push transmissions 301d to 301f may be synchronous (such as all servers sending the fragments of each segment approximately at the same time), or may be asynchronous. In the latter case, the arrival of different fragments associated with a specific segment at the assembling device side may be spread over a long period. This may occur, as an example, when some push servers are faster than others are. In this case, the assembling device aggregates whatever fragments it can before presentation time of each segment, and then supplements fragments using pull retrieval processes. A server that does not send fragments fast enough, and therefore approximately always causes supplemental requests, can be asked to stop the push-transmission. Another server may be asked by the assembling device to replace the slow server by initiating a new push-transmission.

In one embodiment, the push-transmissions carry more fragments than needed for segment reconstruction. In one embodiment, the push transmissions carry fewer fragments than needed for segment reconstruction, and the remaining fragments are pulled by the assembling device.

In one embodiment, an assembling device starts retrieving fragments using only fragment pull protocol processes, and then, when concluding that a specific server is responsive enough, instructs it to start sending a push-transmission for the remaining segments. In this case, the assembling device may start with pure pull-protocol based fragment retrieval, and gradually switch to push-protocol transmissions, up to the point that approximately all fragments are delivered using push-transmissions, and using the pull requests only as a means to overcome failure of obtaining specific fragments by the assembling device. In one embodiment, the fragment pull protocol and the push protocol are used interchangeably to obtain enough fragments to reconstruct segments. In one embodiment, the assembling device may start to obtain fragments using a push protocol and then switch to a fragment pull protocol. In one embodiment, the assembling device may use both fragment pull protocol and push protocol to obtain fragments at the same time, wherein the assembling device may change the ratio Fpull/Fpush on-the-fly to any value between zero and infinity, where Fpull denotes the number of fragments associated with a certain segment that are obtained using a fragment pull protocol, and Fpush denotes the number of fragments associated with the certain segment that are obtained using a push protocol.

In one embodiment, the assembling device uses a fragment pull protocol to start obtaining fragments needed to reconstruct at least one segment needed for fast-start playing of content, and then switches to a push protocol if and when possible. In this case, the fragment pull protocol provides a fast response from servers, allow minimization of the time between a user's request and corresponding content playing. In one example, at least one segment needed for the fast-start playing comprises enough data to enable continuous presentation of the streaming content, at least up to when a first fragment is obtained using the push protocol. In one example, the assembling device obtains the fragments associated with the at least one segment approximately as fast as the bandwidth available to the assembling device allows, and then plays the content approximately as soon as enough segments, out of the at least one segment, are reconstructed to allow doing so.

In the claims, sentences such as "wherein the assembling device is configured to use a fragment pull protocol to obtain the fragments" and "wherein the assembling device is configured to use sub-transmissions to obtain the fragments" are to be interpreted as open claim language. Therefore, an assembling device configured to use a fragment pull protocol to obtain fragments may also obtain fragments using sub-transmissions, and vice-versa.

The term "erasure coding" as used herein denotes a process in which a sequence of erasure-coded fragments can be generated from a segment such that the segment can be reconstructed from any or almost any subset of the erasure-coded fragments of size equal to or somewhat larger than the size of the segment (sometimes may be referred to as "enough erasure-coded fragments" or "sufficient subset of fragments"). Examples of erasure codes include, but are not limited to, rateless codes, Reed-Solomon codes, Tornado codes, Viterbi codes, Turbo codes, any Block codes, any Convolutional codes, and any other codes that are usually used for forward error correction (FEC).

The term "rateless coding" as used herein denotes refers to a type of erasure coding in which a very long, potentially limitless, sequence of rateless-coded fragments can be generated from a segment such that the segment can be reconstructed from any or almost any subset of the rateless-coded fragments of size equal to or somewhat larger than the size of the segment (sometimes may be referred to as "enough rateless-coded fragments"). Examples of rateless codes include, but are not limited to, Raptor codes, LT codes, online codes, any Fountain codes, and any other Rateless codes.

The term "erasure-coded fragment" denotes a fragment comprising data encoded with an erasure code (which may also be a rateless code in some embodiments). The term "rateless-coded fragment" denotes a fragment comprising data encoded with a rateless code.

The term "assembling device" as used herein denotes a computing device that retrieves erasure-coded fragments from servers over a network. The assembling device may perform one or more of the following: (i) Decode the retrieved erasure-coded fragments into segments. (ii) Present the content reconstructed from the retrieved erasure-coded fragments. (iii) Act as a bandwidth amplification device, by receiving, storing, and forwarding erasure-coded fragments. In some embodiments, the assembling device may be any device located at the user premises, like an STB, PC, gaming console, DVD player, PVR device, or any other device able to retrieve erasure-coded fragments from a communication network. In some embodiments, the assembling device may be an assembling server. In some embodiments, the assembling device may be any computational device with access to a communication network, located at a central office, data center, BRAS location, ISP premises, or any other place with direct network connectivity. In one embodiment, the assembling device is coupled to a display device used for content presentation.

The abbreviation CDN denotes "Content Delivery Network". The term "CDN server" as used herein denotes a server having one or more of the following characteristics: (i) A bandwidth (CDN_BW) that is much greater than the average bandwidth consumed by a user premises device (User_BW) receiving video streaming content. In some examples, the CDN_BW is at least 10 times, 100 times, 1,000 times, or 10,000 times greater than the User_BW. (ii) The server is located outside the last mile communication infrastructure of the end users, such that the CDN server and the end users are located in different networks. For example, the CDN server is not located under a BRAS, while the end users are located under a BRAS. Moreover, in some embodiments, the CDN servers are deployed over a wide area across the Internet and optionally located close to or on the Internet backbone. In some embodiments, the CDN server does not usually retrieve and play streaming content. In some embodiments, the CDN server has a much greater storage space than the storage space of an average player of streaming content.

The term "fractional-storage server" in the context of erasure-coded fragments (also applicable to "fractional-storage CDN server"), as used herein denotes a server that (i) stores less than the minimum quantity of erasure-coded fragments required to decode the erasure-coded fragments, and (ii) where at least a meaningful quantity of the stored erasure-coded fragments is not stored in order to be consumed by the fractional-storage server.

The term "streaming content" as used herein denotes any type of content that can begin playing as it is being delivered. Streaming content may be delivered using a streaming protocol, a progressive download protocol, or any other protocol enabling a client to begin playing the content as it is being delivered. Moreover, the term "streaming protocol" includes "progressive download protocol". In addition, the verb "streaming" refers to using a streaming protocol, using a progressive download protocol, or using any other protocol enabling the receiver to begin playing the content as it is being delivered.

In some embodiments, expressions like "approximately sequential segments" may denote one or more of the following non-limiting options: segments that are sequential (in time or according to a file's order), segments that are approximately sequential (such as segments with some interlace, or segments without a great amount of non-sequential data), segments generated sequentially and/or approximately sequentially from different components of content (such as storing the i-frames and p-frames of a compressed content in different segments), and/or other sequential or approximately sequential segmentation after classification or separation into different components and/or elements.

The term "redundancy factor" as used herein denotes the following ratio: (total size of the unique erasure-coded fragments generated from a segment and actually stored on the servers)/(size of the segment).

Assuming all segments have approximately the same size and all fragments generated from the segments have approximately the same size (without limiting any of the embodiments), the term "storage gain" as used herein denotes the following ratio: (size of a segment)/(size of an erasure-coded fragment). If the server stores more than one erasure-coded fragment per segment, the storage gain denotes the following ratio: (size of segment)/((size of erasure-coded fragment)*(number of stored erasure-coded fragments per segment)).

The term "approximately random" as used herein refers to, but is not limited to, random, pseudo random, and/or based on a long list of numbers featuring very low autocorrelation and very low correlation with other similar lists of numbers.

Figure 7:
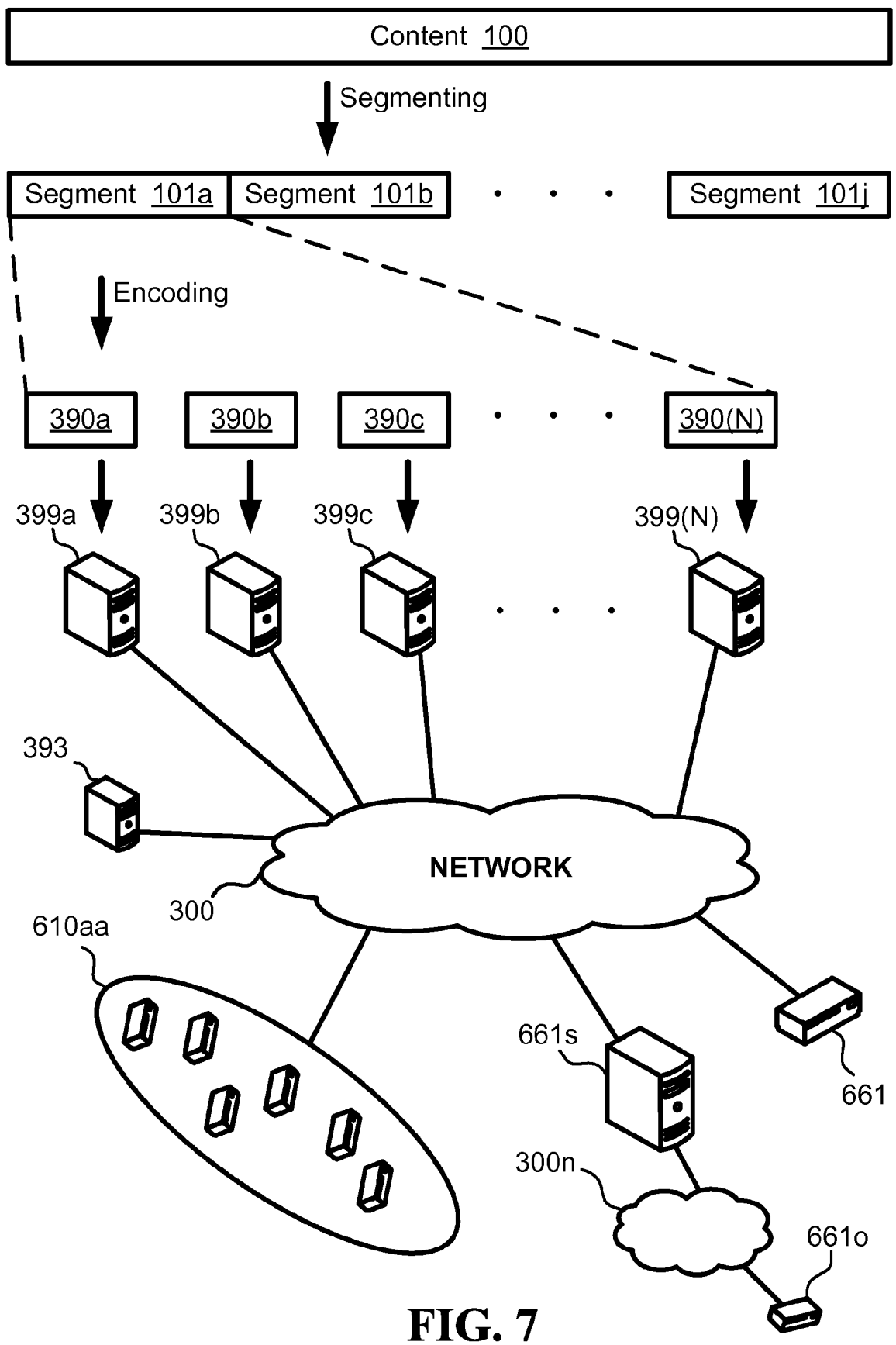
FIG. 7 illustrates one embodiment of segmenting content, encoding the segments into erasure-coded fragments, distributing the fragments to fractional-storage servers, and obtaining the fragments by assembling devices and assembling servers.

FIG. 7 illustrates one embodiment of a fractional-storage system storing erasure-coded fragments. Content 100, which may optionally be streaming content, is segmented into content segments 101a, 101b to 101j (for brevity referred to as segments). Each of the segments is encoded into erasure-coded fragments. For example, segment 101a is encoded into erasure-coded fragments 390a to 390(N). The erasure-coded fragments are distributed to the fractional-storage servers 399a to 399(N) and/or to the bandwidth amplification devices 610aa. The erasure-coded fragments are then obtained by assembling devices like 661 or proxy servers like proxy server 661s from the fractional-storage servers 399a to 399(N) and/or the bandwidth amplification devices 610aa. The obtained erasure-coded fragments are decoded to reconstruct the segments. The proxy server 661s may broadcast/multicast and/or re-stream the reconstructed content, optionally using standard streaming technique, to its client(s) 661o, optionally over network 300n. In some embodiments, the content distribution is performed in real time. In some embodiments, the content assembly is performed in real time and the presentation starts a short time after the content request.

Similarly to content 100, additional contents are segmented, encoded into erasure-coded fragments, and distributed to the fractional-storage servers and/or to the bandwidth amplification devices. Each segment may be reconstructed independently of other segments by obtaining and decoding enough erasure-coded fragments generated from that segment.

In some embodiments, the encoding scheme is erasure codes and/or rateless codes. In some embodiments, the fractional-storage servers 399a to 399(N) are Content Delivery Network (CDN) servers, optionally accessed over the public Internet. In some embodiments, the control, management, content reception, content segmentation, segment encoding, erasure-coded fragment distribution, allocation of bandwidth amplification devices, and/or other kind of central supervision and operation may be performed by managing server(s) 393, which may be a part of the CDN network. It is noted that the term "fractional-storage server" is not limited to a large server and, according to the context, may include a fractional-storage bandwidth amplification device, a fractional-storage peer server, or other types of fractional-storage servers.

In one embodiment, a distributed system is located in a few to dozens of data centers (also known as server farm or datacenter), located close to or on the Internet backbone, together housing at least 100 fractional-storage CDN servers. The servers store erasure-coded fragments associated with approximately sequential segments of streaming contents, with a storage gain of at least 5, and transmit the stored fragments on demand to assembling devices approximately according to the sequential order of the segments. In many cases, the data centers provide a convenient place to place the CDN servers close to or on the Internet backbone. A data center can be also a collocation center, or an Internet Exchange Point. In one example, a single data center can house many fractional-storage CDN servers.

In one example, a streaming system comprising at least several hundreds of fractional-storage CDN servers located close to or on the Internet backbone, storing erasure-coded fragments encoded with a redundancy factor greater than one, and associated with approximately sequential segments of streaming contents. At least 100,000 assembling devices concurrently obtain fragments from the CDN servers, wherein the system achieves efficient load balancing and fault tolerance between the various CDN servers by determining for each of the assembling devices from which servers to obtain the fragments.

In one example, a system comprising at least 1,000 fractional-storage CDN servers is connected to the public Internet. The servers store erasure-coded fragments associated with approximately sequential segments of streaming contents, with a storage gain greater than 5, and transmit the stored fragments on demand to assembling devices approximately according to the sequential order of the segments. Wherein the aggregated bandwidth utilized by the servers for transmitting the fragments to the assembling devices exceeds 1 Giga bit per second times the number of the CDN servers. In one optional example, the system comprises at least 10,000 fractional-storage CDN servers and the aggregated bandwidth utilized by the servers exceeds 10 Giga bit per second times the number of the CDN servers.

In one embodiment, different quantities of erasure-coded fragments are generated per different segments. In one embodiment, some segments store data that is considered more important than data stored in other segments, and relatively more erasure-coded fragments are generated from the segments storing the more important data than from the segments storing the less important data.

In one example, a compressed video content is segmented into segments storing i-frames and segments storing p-frames. Optionally, all segments are approximately of the same size, and more erasure-coded fragments are generated from the segments storing the i-frames than from the segments storing the p-frames. Alternatively, the segments storing the i-frames are shorter than the segments storing the p-frames, and approximately the same quantity of erasure-coded fragments are generated from the segments storing the i-frames and from the segments storing the p-frames.

In one example, a DCT content is segmented into segments storing low frequencies and segments storing high frequencies. Optionally, all segments are approximately of the same size, and more erasure-coded fragments are generated from the segments storing the low frequencies than from the segments storing the high frequencies, where in addition, the size of the erasure-coded fragments generated from the segments storing the low frequencies is smaller than the size of the erasure-coded fragments generated from the segments storing the high frequencies. Alternatively, the segments storing the low frequencies are shorter than the segments storing the high frequencies, and approximately the same quantity of erasure-coded fragments are generated from the segments storing the low frequencies and from the segments storing the high frequencies.

In some embodiments, generating different quantities of erasure-coded fragments per different segments may provide different probabilities to recover the different segments, may require less storage space because smaller quantities of erasure-coded fragments are generated from the less important data, may provide a more efficient infrastructure for coping with peak demand, and/or may enable the fractional-storage system to operate with a lower redundancy factor because the less important data will probably be damaged first.

In one embodiment, different segments are encoded differently. For example, a video content is segmented to segments storing pixel data and segments storing audio data. Because audio data is generally more sensitive to errors than the pixel data, it may be advantageous to encode the audio-related erasure-coded fragments with a high redundancy factor. Therefore, the segments storing the audio data are encoded using rateless Raptor code while the segments storing the pixel data are encoded using fixed rate Tornado code. In another example, different objects of a Scalable Video Coding (SVC) extension of H.264/AVC/MPEG-4 Part 10 are segmented into different segments, which are encoded using different erasure codes.

In one embodiment, in order to reduce the time to play from requesting a content until the content begins playing, or the time from jumping to a specific location within the content until playing from that location, the assembling device may significantly increase its average consumption rate of erasure-coded fragments for some time, for example, 2 to 50 times higher than its steady state consumption rate of erasure-coded fragments. When many assembling devices simultaneously attempt to retrieve the same content using high consumption rate of erasure-coded fragments, some servers may become saturated because of the peak in the demand. Therefore, in one embodiment, the number of unique erasure-coded fragments a fractional-storage server can supply in such cases is increased. Moreover, in one embodiment, the erasure-coded fragments are retrieved from nearby servers in order to achieve low latency; but the nearby servers may not store sufficient unique erasure-coded fragments per the required segments. Therefore, an extra quantity of erasure-coded fragments is generated from segments expected to require the higher consumption rate of erasure-coded fragments, such as the segments at the beginning of a content, and/or segments at some predefined trick play start points. In one embodiment, the extra quantity of erasure-coded fragments is distributed among more servers. As a result, the load of retrieving the erasure-coded fragments is distributed among more servers, which in turn, weakens the peak effect.

Figure 8:
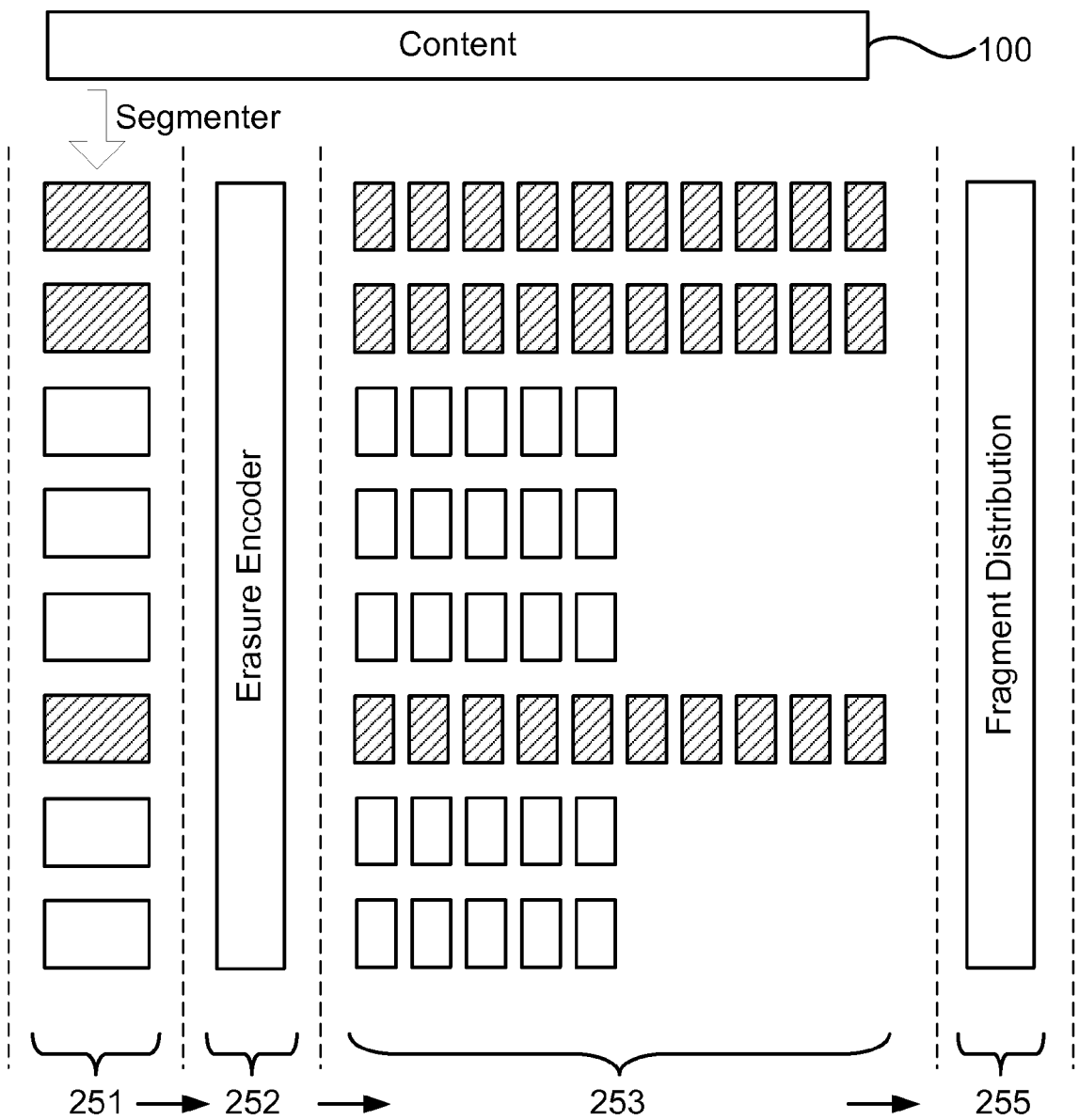
FIG. 8 and FIG. 9 illustrate generation of a larger quantity of erasure-coded fragments near fast start points.
Figure 9:
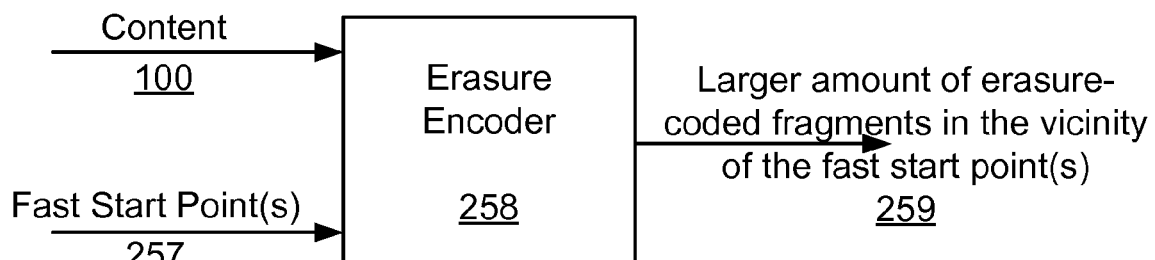

FIG. 8 illustrates the process of generating a larger quantity of erasure-coded fragments in the vicinity of the fast start points. The content 100 is segmented into segments 251. The segments 251 that are in the vicinity of the one or more fast start points, marked in dashed lines, are encoded by the erasure encoder 252 into a larger quantity of erasure-coded fragments (illustrated by more rectangles in part 253), which may then be distributed 255 among fractional-storage servers. FIG. 9 is a schematic view of generating erasure-coded fragments from the content 100, wherein larger quantities of erasure-coded fragments are generated in the vicinity of the fast start point(s).

In some embodiments, the content is segmented into a plurality of segments to enable beginning to play the content as it is being obtained, and optionally enable trick play. The different segments may or may not be of the same size.

The following embodiments discuss different methods for segmenting the content. In one embodiment, at least one portion of the content is segmented into multiple segments in sizes within a first size range, and the remainder of the content is segmented into a plurality of segments in sizes within a second size range (additional size/s may be added similarly). The sizes included in the second size are larger than the sizes included in the first size range. Pluralities of erasure-coded fragments are generated from each of the segments. The segments of sizes within the first size range are better suited for fast retrieval, and the segments of sizes within the second size range are better suited for high-gain storage. In one example, the segments in sizes within the first size range belong to approximately the beginning of the content. In one example, the segments in sizes within the first size range belong to locations within the content requiring trick play access. In one embodiment, the segments of the first type are encoded into fewer fragments than the segments of the second type. This allows a fast retrieval of the shorter segments.

In one embodiment, a first sub-group of the servers stores segments of the first type, and a second sub-group of the servers stores segments of the second type, whereby the first and the second sub-groups may overlap. In one example, the sub-group storing the short segments comprises a large number of servers, in order to facilitate high level of availability and responsiveness.

In one embodiment, the segments of the first type are encoded with a first redundancy factor, and the segments of the second type are encoded with a second redundancy factor, where the first redundancy factor is significantly higher than the second redundancy factor. In one example, the high redundancy factor allows the fragments of the short segment to be available on a large number of servers. In one example, the fragments associated with the first type of segments are stored on a significant amount of the servers, such that an assembling device can potentially retrieve a decodable set of fragments from nearby servers.

In one embodiment, an assembling device reconstructs segments of streaming content by obtaining, from fractional-storage servers, decodable sets of erasure-coded fragments associated with the first or the second type of segments. Each type of segment requires different amount of fragments in order to be decoded. The assembling device obtains the fragments according to information describing the position of the different types of segments within the streaming content. In one example, the information contains the number of fragments needed to decode the different types of segments. In one example, content is composed of one initial short segment requiring 20 fragments for reconstruction, followed by 1,000 long segments, each requiring 200 fragments for reconstruction. The assembling devices receive information from a control server regarding the above structure, and obtain at least 20 fragments for the first segment, followed by at least 200 fragments for each additional segment.

In one example, the content 100 is a 1 GByte encoded H.264 file, storing a 2-hour motion picture, and is segmented into approximately 10,000 segments of approximately 100 Kbytes each. In another example, the content 100 is a 4 MByte web-site information (HTML, FLASH, or any other combination of information that encodes the presentation of a website), and is segmented into 4 segments of approximately 1 MByte each.

In one example, the content supports streaming presentation, and the segments are small enough to enable presentation shortly after beginning the reception of the first segment (s). For example, each segment may include 96 KByte, allowing a 5 Mbps receiver to download the segment in approximately 0.2 seconds, and optionally begin the presentation shortly thereafter. In one embodiment, the time to play is reduced by segmenting certain portions of the content into smaller segments, while the remaining portions are segmented into larger segments. A smaller segment can be retrieved faster, while a larger segment may be better optimized for storage gain and/or efficient transmission.

In one embodiment, the short segments are 96 Kbytes in size, and the long segments are 960 Kbytes in size. The redundancy factors used for encoding short and long segments into fragments are 100 and 5 respectively. 1500 Bytes fragments are used for both sizes. The short segments are therefore encoded into (96K/1500)×100=6,400 fragments, from which only about 64 are needed for reconstruction, and the long segments are encoded into (960K/1500)×5=3,200 fragments, from which only about 640 are needed for reconstruction. Short segments are reconstructed more quickly than long ones, as they require fewer fragments to be decoded. Optionally, each fragment is stored on a different server, resulting in a storage gain of 64 for short segments, and 640 for long segments.

FIG. 10 illustrates one example in which the content 100 is segmented into segments, such that the first segment 104a is smaller than the consecutive segment 104b, which is smaller than following segments 104c and 104d. In another example, the content 100 is segmented into segments, such that the first several segments (e.g. 104aa and 104bb, which are the same size), are smaller than consecutive segments (e.g. 104cc and 104dd, which are the same size).

FIG. 11 illustrates one example in which the content 100 is segmented into cyclic sets of successive segments increasing in size. For example, 105b is equal or larger in size than 105a, and so on, up to segment 105d; 105f is equal or larger in size than 105e, and so on, up to segment 105h. In one example, segment 105e is equal in size to segment 105a. Point 105EP represents the ending of the first set, and the beginning of the second set.

In some embodiments, the content is segmented according to its components and/or properties. FIG. 12 illustrates one embodiment in which a content 2800 is a compressed video file. The component comprising Intra-Coded Pictures (i-frames) 2801 and 2802 is processed as one sequence 2820 directed to a first set of segments 2820', while the component comprising Predicted Pictures (P-Frames) and/or Bi-Predictive Pictures (B-Frames) 2811 to 2814 is processed as a separate sequence 2830 directed to a second set of segments 2830'. Since any segment and segment sequence can be decoded independently of other segments or segment sequences, the i-Frame component can be separately decoded from segment sequence 2820', without decoding the P/B-Frames that are placed in segment sequence 2830'. In one example, i-Frame component can be decoded to present only the i-frame-related video sequence, while P/B-frames component may be obtained and decoded only when it is available.

In one embodiment, the content is compressed using Discrete Cosine Transform (DCT). The low frequencies component is directed to a first set of segments, while the higher frequencies component is directed to a second set of segments.

In one embodiment, the content is available in different compressions, sometimes known as different rates, and the different compression components are directed to different sets of segments.

Figure 13:
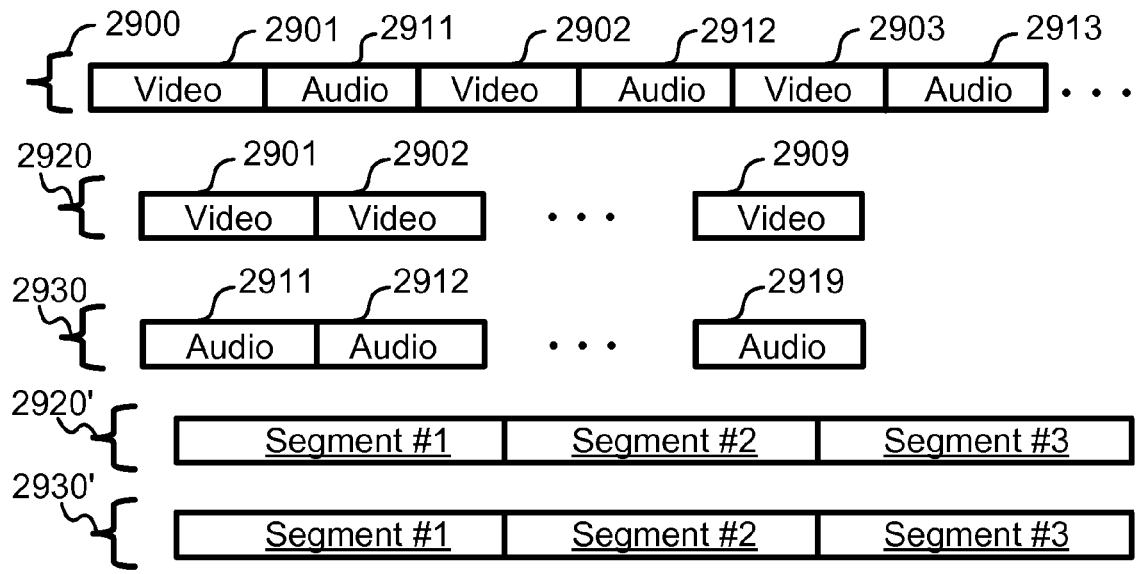

In one embodiment, the content includes one or more of the following components: video pixel data, audio data, or other data such as control data, meta-data, or Internet communication. Different components may be directed to different sets of segments and/or stored on different servers. For example, different dubbing of the same movie may be stored on different segments. In one embodiment, the content is encrypted and certain encryption elements are stored in certain segments. FIG. 13 illustrates one example of a compressed multimedia file 2900 containing both video pixel data 2901 to 2903, and audio data 2911 to 2913 (the two types of data are illustrated as being interlaced, but they may also be encapsulated side by side, in a sequence, or simply be contained in two separate files or containers). The video pixel data is processed as a single component 2920 directed to a first set of segments 2920', while the audio data is processed as a separate single component 2930 directed to a second set of segments 2930'. An assembling device needs to separately obtain and separately decode segments in order to obtain both the video pixel and audio data.

Figure 14:
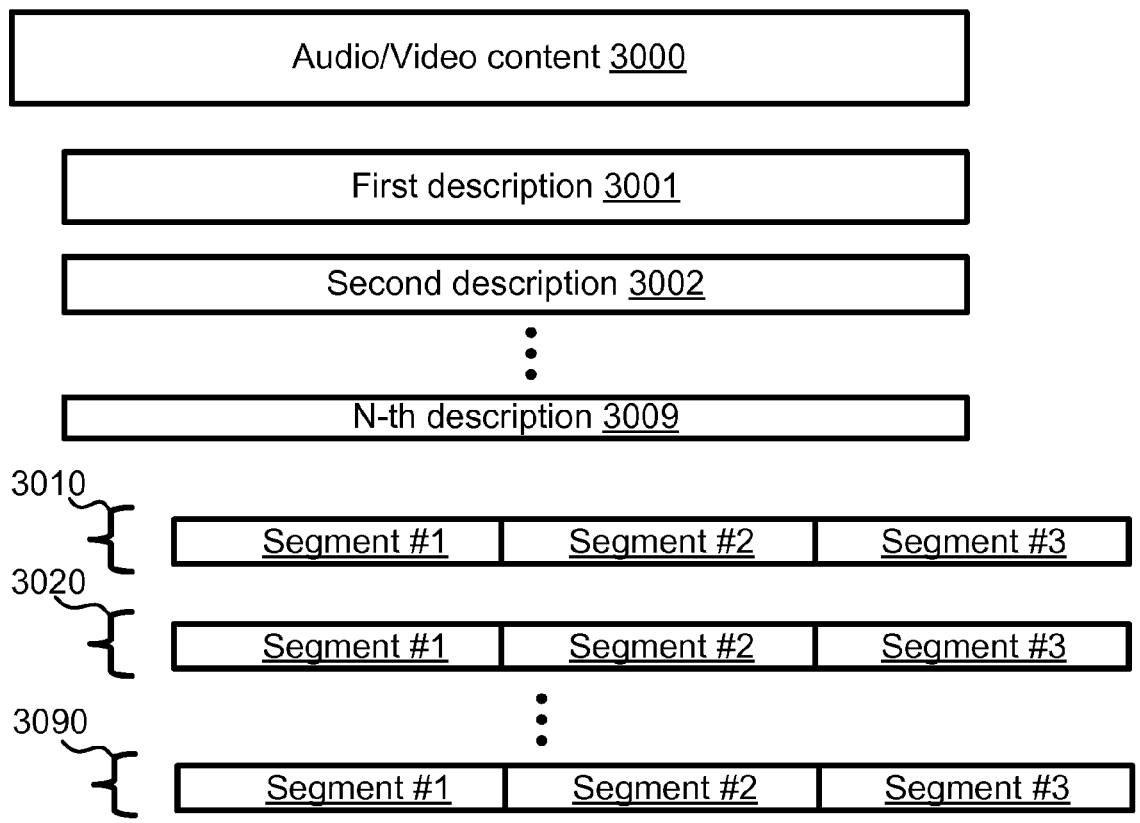

In one embodiment, the content is composed of different descriptions, in which the more descriptions received, the better the quality, as in the case of Multiple Description Coding (MDC) or Layered Coding (LC). Each description component may be encoded, stored, and/or assembled separately. For example, the different descriptions may be stored in different segments, encoded with different erasure-codes, and/or retrieved independently. FIG. 14 illustrates one example of an Audio/Video content 3000 encoded using MDC into multiple description components 3001 to 3009. The first description 3001 may be the base description, meaning that it is only necessary to obtain the base description in order to enable basic presentation of content 3000. As more descriptions are obtained, a better quality of presentation is possible, up to the maximal quality possible by obtaining all descriptions 3001 to 3009. Each description is independently segmented, such that segment sequences 3010 to 3090 correspond to descriptions 3001 to 3009 respectively. Every description may be obtained by retrieving and decoding the appropriate segment sequence.

In one embodiment, some of the content is segmented approximately sequentially, and the rest non-sequentially. For example, dividing the beginning of a video content sequentially in time, and the rest of the video content non-sequentially in time.

In one embodiment, a scalable, secured, moderate storage space, and durable wide-area storage system is achieved by erasure-encoding the content, then chopping the encoded content into a plurality of erasure-coded fragments, and then distributing the erasure-coded fragments to the fractional-storage servers. In this embodiment, the retrieving clients may retrieve the stored erasure-coded fragments using their maximum incoming bandwidth until approaching the server's aggregated bandwidth, the content may be any type of data file, and the chopping may be performed according to any reproducible method.

In one embodiment, segments are created on-the-fly, such as during a live event or when the content is made available to the segmentation process as an on-going stream. In one embodiment, the content supports streaming presentation, and the segments are of the small size, to enable content presentation shortly after beginning the reception of the first segment (or any other segment). In addition, the erasure-coded fragments are kept as small as possible, while still enabling efficient transport over an IP network. For example, each erasure-coded fragment is about 1500 Bytes and can be transported using one IP packet.

It is to be noted that streaming content may also be manifested as an intermediate product of a process. For example, in a case where a video camera outputs erasure-coded fragments that can be decoded into streaming content, the intermediate data from which the erasure-coded fragments are generated is considered to be streaming content (even if the video camera does not output that intermediate data). Moreover, streaming content may include: content that is produced and then immediately transmitted to a receiving server, content that is produced but stored for any length of time before being transmitted to a receiving server, content that is transmitted to a receiving server and then immediately sent from the receiving server to a client, content that is transmitted to a receiving server, then buffered for some time at the receiving server and then sent from the receiving server to a client, content that is solely played at a client, and content that is manipulated or changed or reacted to at the client while a continuation of the content is still being played at the client.

In one embodiment, an assembling device obtains first and second sets of erasure-coded fragments from fractional-storage servers, decodes the first and second sets of fragments into a first and second set of segments belonging to a first and second components of streaming content, correspondingly, and progressively combines the first and second components, obtained from the segments, into the content. Both components include data relevant to most of the content's duration. In one embodiment, the assembling device obtains less than all sets of fragments when the servers are approximately overloaded. In one example, the assembling device decodes the first set using a first erasure-coding, and the second set using a second erasure-coding that is different from the first erasure-coding.

In one example, the first component comprises video pixel data and the second component comprises audio data. In one example, the streaming content is encoded using multiple description coding (MDC) or layered coding (LC), and the first and the second components of the content are different descriptions or layers. In one example, the streaming content is compressed video; the first component comprises Intra-Coded Pictures (i-frames), and the second component comprises Predicted Pictures (p-frames). In one example, the compressed streaming content comprises Discrete Cosine Transform (DCT); the first component comprises mainly low DCT frequencies, and the second component comprises mainly higher DCT frequencies. In one embodiment, the assembling device is located at the user premises, and the servers are fractional-storage CDN servers. In one embodiment, the assembling device is configured to obtain the fragments using a fragment pull protocol. In one embodiment, the assembling device is configured to obtain the fragments using sub-transmissions.

In one embodiment, a content delivery system stores erasure-coded fragments, each fragment associated with one of a first and second component of content. Assembling devices obtain the erasure-coded fragments from the servers, build both components from the fragments, and combine the components to reconstruct the content. Both components include data relevant to most of the content's duration.

It is noted that when fractional-storage servers are used to store fragments belonging to segments of content's components, and when most of the servers store more than one component of the content, the following is possible: in a case of congestion, in which servers do not have enough fragment delivery bandwidth to meet all demands, approximately the full bandwidth of all of the servers may be used to deliver only one component. In one example, the above principle is beneficial when the first component is the base layer of Multiple Description Coding (MDC), and the second component is an enhancement layer. In this case, when the system is congested, the full bandwidth of all participating servers may be used to deliver only the base layer in order to enable a basic operation of all demanding assembling devices, despite the congestion condition.

Figure 15:
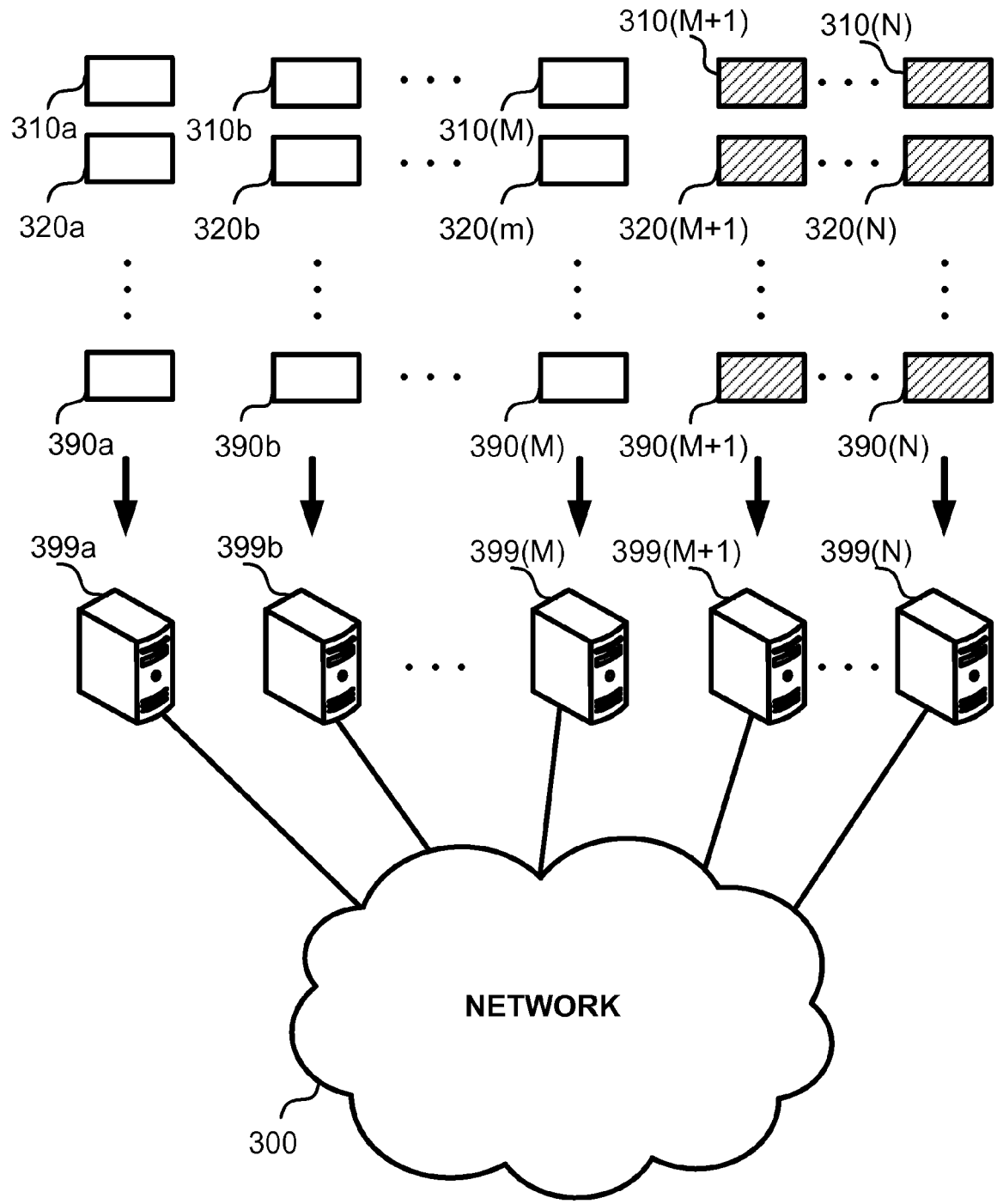
FIG. 15 illustrates distribution and storage of erasure-coded fragments on fractional-storage servers.

FIG. 15 (without the fragments marked with dashed lines) illustrates one example of distributing the erasure-coded fragments to 'M' CDN servers 399a to 399(M), connected to a network 300. Encoded fragments 310a to 310(M) of a first segment are sent for storage in servers 399a to 399(M) respectively. Similarly, erasure-coded fragments 320a to 320 (M) of a second segment are sent for storage in servers 399a to 399(M) respectively. In addition, other erasure-coded fragments associated with other segments of other contents, illustrated as erasure-coded fragments 390a to 390(M), are sent for storage in servers 399a to 399(M) respectively. The number of unique erasure-coded fragments from each segment that are stored on the servers (399a to 399(M)) is equal to M in this example, where M may be smaller than the maximum number of unique erasure-coded fragments, meaning that only a subset of the potential erasure-coded fragments are actually stored. It is also possible to store the maximum number of unique erasure-coded fragments, or store more than one unique erasure-coded fragment per segment per server. The network 300 may be the Internet for example, or any other data network connecting multiple nodes, such as a private IP network, or a Wide Area Network ("WAN"). In one embodiment, the fragments marked with dashed lines illustrate one example where (N-M) additional servers are added to the array, and (N-M) new unique erasure-coded fragments per segment per content (310(M+1) to 310(N), 320(M+1) to 320(N), and 390(M+1) to 390(N)) are generated and added to the array. In one embodiment, only M out of the maximum possible erasure-coded fragments (L) are actually generated for storage in the first place. In one embodiment, when the additional N-M erasure-coded fragments are needed for storage (e.g., when additional servers are made available), the remainder of the N-M erasure-coded fragments are actually generated. Any time that additional unique erasure-coded fragments are needed, this process of calculating the additional erasure-coded fragments is repeated, up to the point that all L possible erasure-coded fragments are used.

In one embodiment, and especially when using rateless coding, L may be chosen as a sufficiently large number to account for any realistic future growth of the server array. For example, a segment of 96 Kbytes is expanded using a rateless code with a ratio of 1 to $2^{16}$ original symbols to encoded data, into an encoding symbol of potential size 6.29 GBytes. Assuming a 1500 Bytes erasure-coded fragment size, then potentially 4.19 million unique erasure-coded fragments can be generated. Now, it is safe to assume that for all practical uses, the server array will not grow to more than 4.19 million nodes, and may contain several thousands of servers, meaning that the encoded data can be used in all cases where additional unique erasure-coded fragments are needed, by generating new erasure-coded fragments out of the segment. Optionally, a server may store erasure-coded fragments for only some of the segments.

In one example of redundancy factor and storage gain (without the fragments marked with dashed lines), server 399a stores only erasure-coded fragment 310a from a first segment, erasure-coded fragment 320a from a second segment, and erasure-coded fragment 390a from a third segment. Assuming that: (i) the segment size is 1024 Kbytes; (ii) the segment is encoded using erasure code into a 4096 KByte encoded segment; (iii) the encoded segment is segmented into 256 erasure-coded fragments of size 4096/256=16 KByte; and (iv) the erasure-coded fragments are stored on 256 servers (M=256); it turns out that each server stores only a 1/64 portion of the original size of the segment. This means that each server can manage with only 1/64 of the storage requirements in comparison to a situation where it had to store the entire segment. In addition, there are 256 erasure-coded fragments altogether from each encoded segment, meaning that an assembling device that is assembling the erasure-coded fragments from the servers need only select slightly more than 64 erasure-coded fragments in order to completely reconstruct the segment, and it can select whichever slightly more than 64 erasure-coded fragments it desires out of the 256 possibly available. The redundancy factor in this example is approximately 256/64=4. All contents in this example enjoy a factor of 64 in storage gains, meaning that server 399a, for example, stores only 1/64 of the information associated with the first segments and any additional segments belonging to other contents. In one example, each server supports high volume storage of between about 500 GByte and 500 TBytes, optionally utilizing hard drive, Solid State Drive, or any other high volume storage device(s). In these cases, each server may store many millions of erasure-coded fragments, associated with millions of segments, belonging to hundreds of thousands of different contents, and possibly more.

In one embodiment, new content initially encoded with a low redundancy factor is distributed to an initial number of fractional-storage servers. As the content is distributed to more servers, additional unique fragments are encoded and therefore the redundancy factor increases. Optionally, as the content's popularity increases, and/or as the load on the fractional-storage servers increases, the redundancy factor is increased, and vice versa.

In one embodiment, multiple unique erasure-coded fragments per segment of a new content are distributed to an initial number of fractional-storage servers with a low storage gain (i.e. each server stores multiple unique erasure-coded fragments per encoded segment). As the content is distributed to more fractional-storage servers, some of the erasure-coded fragments stored on the initial number of fractional-storage servers are removed and thereby the storage gain is increased. Optionally, as the demand for the content increases, the storage gain is decreased, and vice versa.

Figure 16:
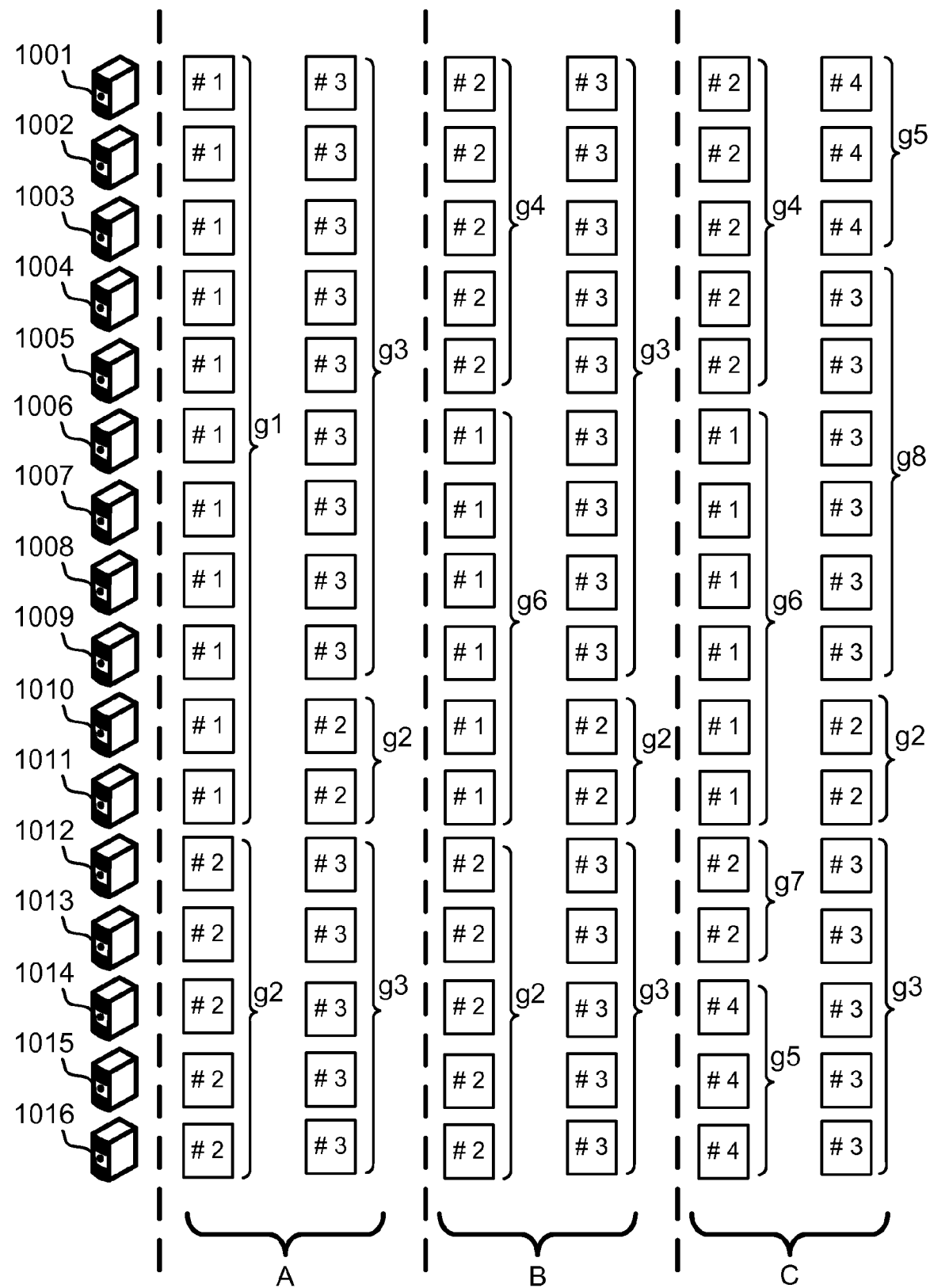
FIG. 16 illustrates three examples of changes made to redundancy factors according to changes in demand.

FIG. 16 illustrates three examples (each depicted by one of the columns A-C) of changing the redundancy factor according to the demand. Column A illustrates one simplified example of a storage array including 16 servers (1001 to 1016). Each server stores up to 2 different erasure-coded fragments, and can service an erasure-coded fragment transmission bandwidth of up to B. Assuming three contents (#1, #2, and #3) processed to segments and erasure-coded fragments with a storage gain of 4.

Assuming content #1 is the most popular, and requires a peak bandwidth of 11×B. Since each server can service up to bandwidth B, at least 11 servers are needed to service content #1 bandwidth requirements. Content #1 is therefore encoded into 11 unique erasure-coded fragments per segment, illustrated as group g1 of erasure-coded fragments stored on servers 1001 to 1011. Out of these 11 erasure-coded fragments, it is sufficient to obtain slightly more than 4 erasure-coded fragments in order to reconstruct a segment of content #1. Therefore, the resulting redundancy factor of the stored fragments associated with content #1 is approximately 11/4=2.75. Content #2 requires less bandwidth, and manages with a peak of 7×B. It is therefore encoded into 7 unique erasure-coded fragments per segment, illustrated as group g2 of erasure-coded fragments on servers 1010 to 1016. Therefore, the redundancy factor of the stored fragments associated with content #2 is 7/4=1.75. Content #3 requires a peak bandwidth of 5×B, but for some reason (for example, being a more critical content), it is encoded into 14 erasure-coded fragments per segment, illustrated as group g3 of erasure-coded fragments on servers 1001 to 1009 and 1012 to 1016. Therefore, the redundancy factor of the stored fragments associated with content #3 is 14/4=3.5. This concludes the storage availability of the servers in this example, as every server stores two erasure-coded fragments.

Column B illustrates an example where content #2 becomes more popular than content #1, and therefore requires more bandwidth and hence more of a redundancy factor. This is achieved by eliminating 5 erasure-coded fragments associated with content #1 that were previously stored on servers 1001 to 1005, and replacing them with 5 new unique erasure-coded fragments g4 associated with content #2. This brings the total number of erasure-coded fragments per segments of content #1 and #2 to 6 and 12 respectively. In column C, new content #4 is stored on servers 1001 to 1003 and 1014 to 1016 (illustrated as g5), by eliminating 3 erasure-coded fragments of content #1 and 3 erasure-coded fragments of content #2.

Throughout the examples of FIG. 16, a record of "what erasure-coded fragments are stored where" may be: (i) kept in each of the servers 1001 to 1016. In this case, when an assembling device is assembling content #2, it will send a query to servers 1001 to 1016, asking which one is storing erasure-coded fragments of content #2; (ii) kept in a control server. In this case, an assembling device will ask the control server to send back a list of all servers storing erasure-coded fragments of its required content.

FIG. 17 illustrates one embodiment of a server array including fractional-storage servers 399a to 399(N) storing erasure-coded fragments 390a to 390(N) associated with content. In order for assembling device 661 to reconstruct a segment 101a of the content, it has to retrieve at least K erasure-coded fragments. In one example, k=4 and the assembling device 661 chooses approximately randomly from which servers to retrieve the 4 different erasure-coded fragments. It chooses to retrieve fragments 390a, 390c, 390(N−1) and 390(N), which are noted as group 573, and reconstruct the segment 101a. Consequent segments of the content are reconstructed in a similar fashion, and the content may eventually be fully retrieved by combining all relevant segments. If the assembling device 661 cannot reconstruct the segment 101a, it retrieves one or more additional unique erasure-coded fragments, and tries again.

In one embodiment, the content being distributed supports stream presentation, and segment 101a is of small size, to enable content presentation by assembling device 661 shortly after beginning the reception of the segment (or any other segment of the content). For example, segment 101a is 96 KByte, allowing a 5 Mbps download speed receiver to obtain the entire segment (by requesting enough erasure-coded fragments to enable the reconstruction of the segment, and such that the total size received of all requested erasure-coded fragments is slightly larger than the segment) after approximately 0.2 seconds from request, and beginning the presentation shortly or right after the successful decoding and reconstruction of segment 101a.

In some embodiments, the fragments are small enough to be contained in one packet. In one embodiment, each fragment is about 1400 bytes, and can fit into one UDP or RTP packet transmitted over Ethernet. The stateless nature of UDP and RTP allows the servers to send one packet with one fragment very quickly, without the need for any acknowledgement or hand shaking. In some embodiments, the fragment pull protocol requests use one stateless packet, like UDP or RTP. In one embodiment, the assembling device requests about 100 fragments approximately in parallel, using 100 separate requests or one or few aggregated requests. About 100 servers respond by sending about 100 fragments, each encapsulated in one stateless packet, after a short delay, and the assembling device receives the fragments within a fraction of a second. Assuming an Internet round trip delay of 100 ms, and server processing latency of 100 ms, then after 200 ms the assembling device starts receiving all 100 fragments. With a modem of 5 Mbps, and assuming 1400 bytes per fragment, all 100 fragments are received 1400×100×8/5 Mbps=224 ms after the initial delay, meaning that content can be presented 200+224=424 ms after request (decoding and other process time has been ignored in this example).

Figure 18:
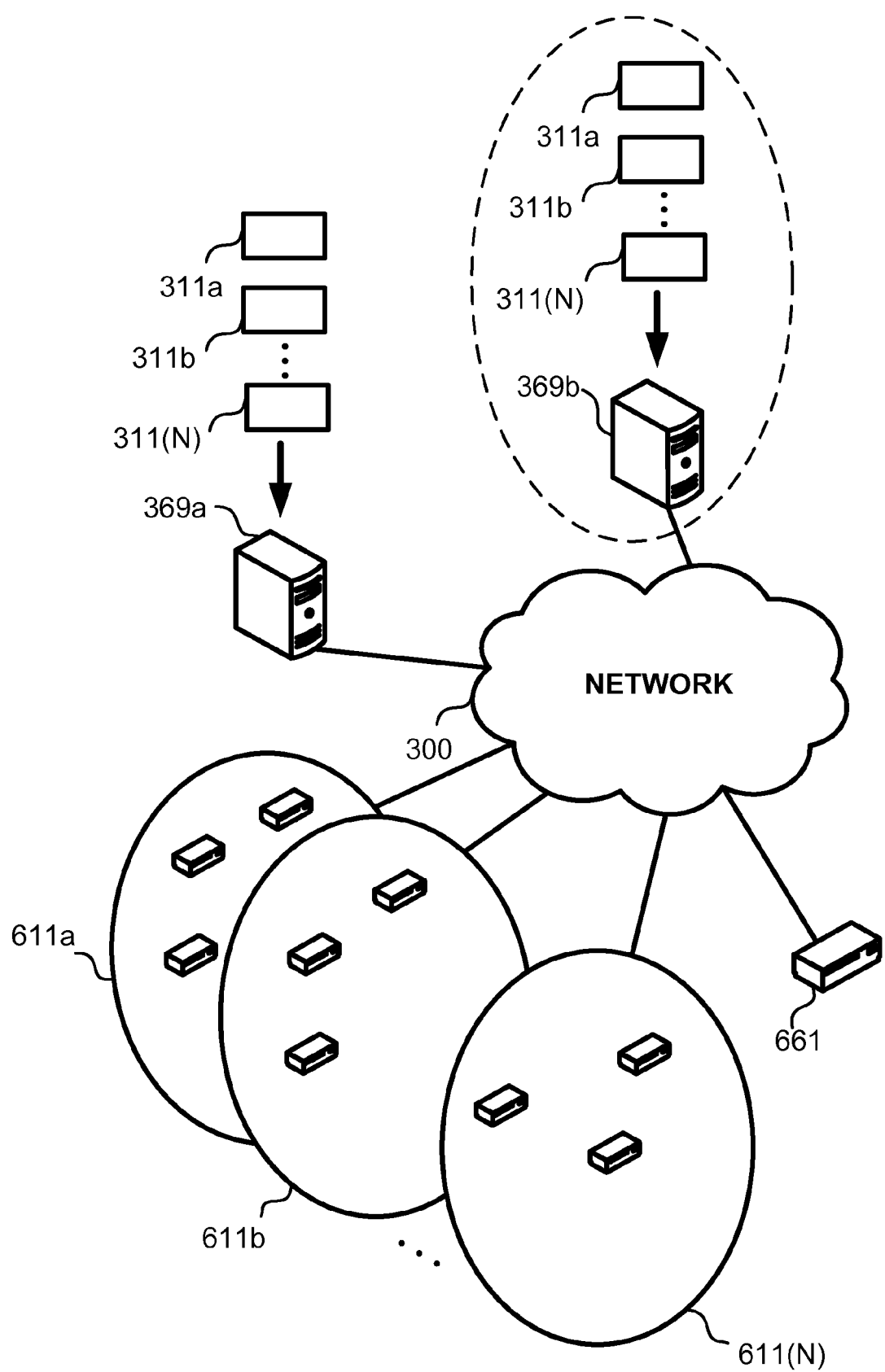
FIG. 18 illustrates a stand-alone content delivery server.

FIG. 18 illustrates in one embodiment wherein server 369a operates as a stand-alone content distributor. Server 369a stores all the erasure-coded fragments 311a to 311(N) of the content. Assembling device 661 assembles the content from server 369a, by requesting the relevant erasure-coded fragments. The request may be per specific erasure-coded fragment, or per a cluster of erasure-coded fragments. Upon each request, server 369a sends the one or more requested erasure-coded fragments. The erasure-coded fragments 311a to 311 (N) may be encoded using erasure codes, or, alternatively, not encoded at all and simply constituting a fragmented sequence of the content. The optional groups of bandwidth amplification devices 611a, and 611b to 611N store fragments 311a, and 311b to 611(N) correspondingly (and other fragments). In one embodiment, assembling device 661 can request fragments from a group of bandwidth amplification devices instead of the server 369a. In one embodiment, the bandwidth amplification devices are fractional-storage assembling devices that receive their fragments from a single server 369a containing all the fragments, or from a group of servers or a control entity that contain some or all of the fragments. Upon adding another server 369b, which stores the same erasure-coded fragments as server 369a, assembling device 661 may retrieve the fragments from server 369a, and/or from server 369b, and/or from the optional bandwidth amplification devices 611a to 611N. For assembling device 661, switching between servers is seamless when using a fragment pull protocol because it simply means requesting the next fragments from a different source.

The following embodiments describe processes for on-the-fly erasure-coded fragment retrieval from fractional-storage servers.

In one embodiment, a method for obtaining erasure-coded fragments from fractional-storage servers to reconstruct a segment includes the following steps: (i) identifying the next segment to be obtained; optionally, the segments are approximately sequential segments of streaming content obtained according to their sequential order; (ii) optionally, determining the minimum number of fragments needed to reconstruct the segment; (iii) are enough identified relevant servers (i.e. servers storing the required fragments) available from the process of obtaining prior segment/s? (iv) if no, identifying enough relevant servers; (v) if yes, requesting enough fragments from the identified relevant servers; if less than enough fragments are obtained from the identified relevant servers, go back to step iv and identify additional relevant server/s; (vi) reconstruct the segment from the obtained fragments; and (vii) optionally, go back to step i to obtain the next segment.

In one embodiment, a method for obtaining erasure-coded fragments from fractional-storage servers to reconstruct multiple segments includes the following steps: (i) identifying multiple segments to be obtained, optionally according to their sequential order; (ii) optionally, determining the minimum number of fragments needed to reconstruct the segment; (iii) optionally, determining the number of fragments to be obtained approximately in parallel; (iv) are enough identified relevant servers available from the process of obtaining prior segment/s? (v) if no, identifying enough relevant servers; (vi) if yes, requesting enough fragments from the identified relevant servers, optionally in parallel and according to the sequential order of the segments; (vii) if less than enough fragments are obtained from the identified relevant servers, go back to step iv and identify additional relevant server/s; (viii) reconstructing the segment/s from the obtained fragments; and (ix) optionally, go back to step i to obtain the next segments.

In one embodiment, a method for obtaining erasure-coded fragments from fractional-storage servers to reconstruct a segment in a burst mode includes the following steps: (i) identifying the next segment to be obtained; (ii) optionally, determining the minimum number of fragments needed to reconstruct the segment; (iii) are more than the minimum number of relevant servers available from the process of obtaining prior segment/s? (iv) if no, identifying more than the minimum relevant servers; (v) if yes, requesting more than the minimum number of fragments needed to reconstruct the segment; if less than enough fragments are obtained, go back to step iv and identify additional relevant server/s; (vi) reconstructing the segment from the obtained fragments; and (vii) optionally, go back to step i to obtain the next segment.

The various methods for obtaining erasure-coded fragments from the fractional-storage servers for reconstructing one or more segments may be combined as needed. In one example, the initial segment/s are obtained using a burst mode and the following segments are retrieved without requesting extra fragments. In another example, the initial segment/s are obtained approximately in parallel and optionally using a burst mode, and the following segments are obtained one by one and optionally without requesting extra fragments. The fragments may be obtained using a pull protocol and/or a push protocol. Moreover, the servers from which to retrieve the fragments may be selected according to one or more of the various discussed methods for selecting the servers and/or load balancing the servers.

In some embodiments, a broadcast-like effect is achieved by distributing to and retrieving from fractional-storage servers a broadcast channel/live content in real time, using a combination of real time distribution and real time retrieval techniques. In a broadcast-like effect, a given channel or content for broadcasting is distributed to at least one assembling device, optionally by means of pushing relevant fragments to the assembling device, or by pulling the relevant fragments by the assembling device, and potentially to many assembling devices at approximately the same time, which creates a similar effect to traditional broadcasting.

Figure 19:
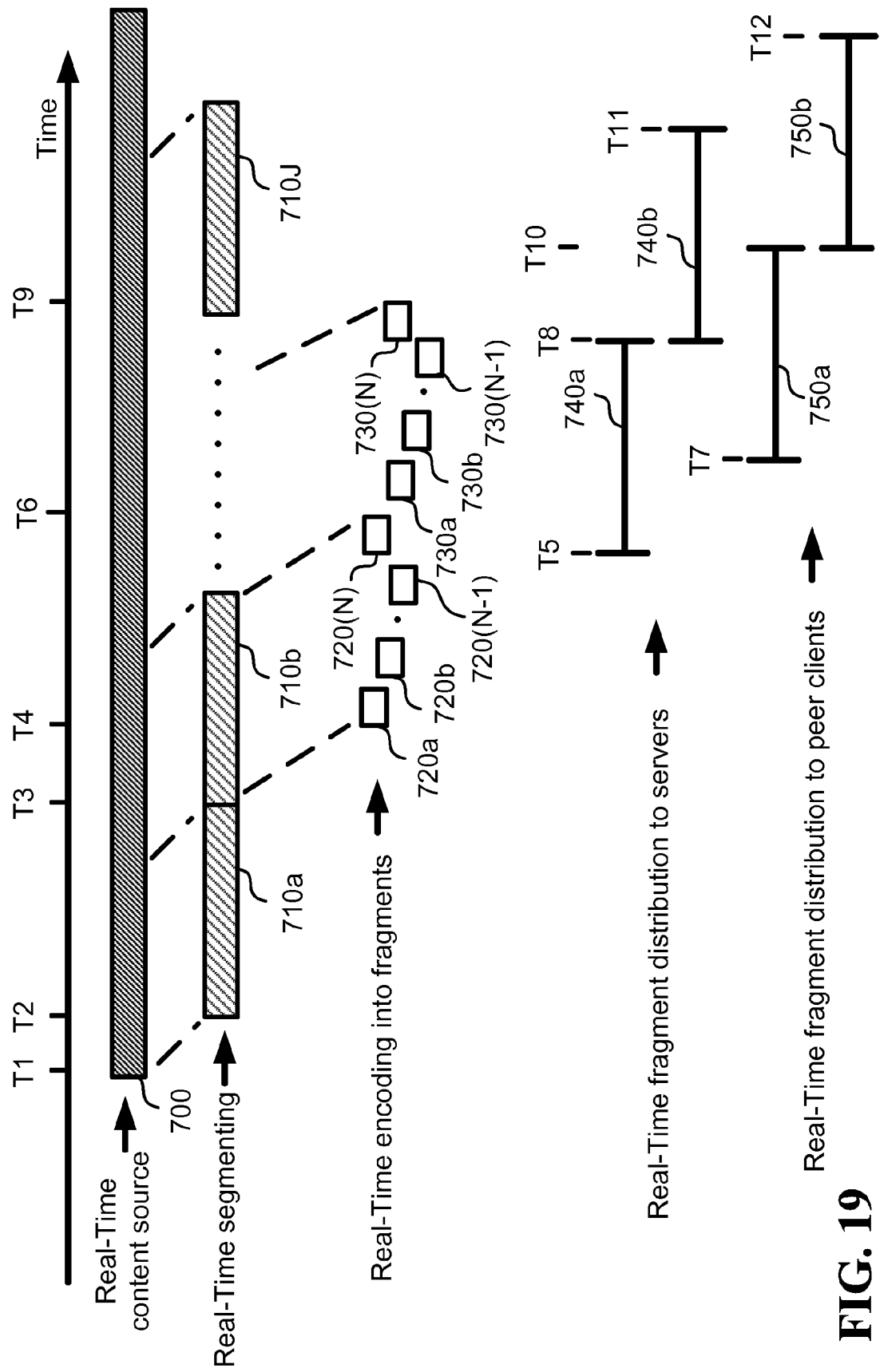
FIG. 19 illustrates real-time content segmentation, encoding, and distribution.

FIG. 19 illustrates one embodiment of processing a content source 700 for real time presentation. Content examples include, but are not limited to, a live video broadcast event, a pre-recorded show, or any real time conditioned source. The content 700 is available at time T1=0. The content 700 is segmented in real time into multiple segments, such that the first segment 710a is available at T3. T3 is determined by the size of the segment and the selected compression scheme. For example, if an H.264 compression is used to generate an average stream of 1 Mbps, and the size of the segment is 96 Kbytes, then T3 minus T2 equals 96 KByte×8(Bits/Byte)/1 Mbps=0.77 seconds on average, where T2 is the process delay. If T2 is about 0.2 second, then the first segment 710a can be ready for the next step after about 1 second from the time that content 700 is first made available. Subsequent segments 710b to 710J are made available sequentially in time.

Next, at T4, erasure-coded fragments 720a to 720(N) are being encoded from segment 710a. At T6, the encoding process is performed for segment 710a, and all the erasure-coded fragments 720a to 720(N) are made available. In one example, the time between T4 and T6 is equal to or less than the average segment creation time, in order to allow the process to maintain real time performance, such that at any point in time during the on-going availability of segments, the encoding process generates all erasure-coded fragments without picking up any delay above T6 minus T3 (which is the latency between segment availability and erasure-coded fragment availability). T6 minus T1 may be typically 2-3 seconds if T3 minus T2 is 0.77 seconds. T4 minus T3 may be typically a fraction of a second. Similarly, erasure-coded fragments 730a to 730(N) are being encoded from segment 710b, and are made available at time T9. The process of fragment encoding is repeated in real time up to the last segment 710J of content 700.

Next, at T5 (which can potentially occur before T6, but also after T6) the erasure-coded fragments 720a to 720(N) are distributed 740a to a server array. The distribution process 740a ends at T8. In one example, T8 minus T5 is equal to or less than the average segment creation time, in order not to have delays. The process of distributing the erasure-coded fragment is repeated 740b for erasure-coded fragments 730a to 730(N), and for all subsequent erasure-coded fragments associated with the next segments.

Optionally, at T7, the erasure-coded fragments 720a to 720(N) are distributed 750a from the servers to groups of bandwidth amplification devices. In one example, the distribution ends at T10, such that T10 minus T7 is equal to or less than the average segment creation time, in order not to have delays. Subsequent erasure-coded fragments associated with the next segment are distributed 750b, and the process continues until the erasure-coded fragments associated with the last segment 710J are distributed.

Figure 20:
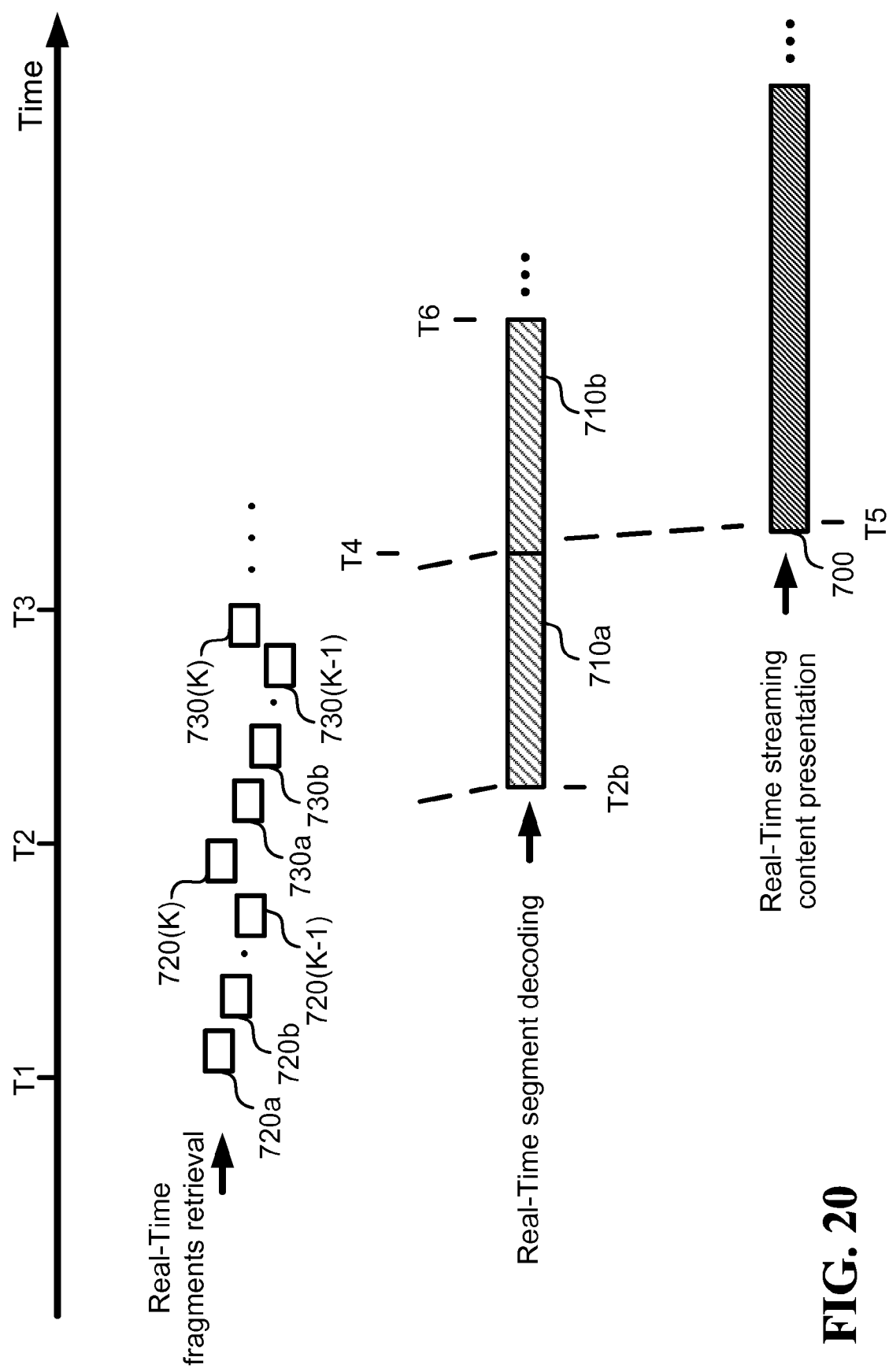
FIG. 20 illustrates real time fragment retrieval, segment reconstruction, and content presentation.

FIG. 20 illustrates one embodiment of real time streaming content retrieval from fractional-storage servers. An assembling device begins a process of obtaining streaming content 700 for presentation. Starting at T1, the assembling device requests erasure-coded fragments 720a to 720(K). By T2, all K erasure-coded fragments are obtained, and at time T2b until T4, erasure-coded fragments 720a to 720(K) are decoded into segment 710a. The retrieval time of the erasure-coded fragments and the segment decoding time should be equal to or faster than the corresponding presentation time, in order to enable a continuous presentation, once presentation begins at T5. T2b minus T2 is a short delay, and can be fractions of a second. Subsequent erasure-coded fragments 730a to 730(K) are retrieved between T2 and T3, and are decoded into subsequent segment 710b between T4 and T6.

In one example, the streaming content 700 is encoded at 1 Mbps, and the segment size is 96 Kbytes. The presentation of each segment takes about 0.77 seconds. Retrieving fragments 720a to 720(K) takes no more than 0.77 seconds, meaning that the assembling device's connection bandwidth must be 1 Mbps or higher. Decoding segment 710a takes no more than 0.77 seconds. If a small delay of 0.2 seconds is assumed for both T2b minus T2 and T5 minus T4, then T5 can start at 0.77+0.2+0.77+0.2=1.94 seconds after T1, meaning that presentation can begin about 2 seconds following request of the first erasure-coded fragment. In another example, the retrieval process and the decoding process are performed faster than the real time presentation bounds, therefore enabling a shorter time to play and a download rate that exceeds the presentation rate.

In one embodiment, the erasure-coded fragments 720a to 720(K) are retrieved in approximately random order, or any other order, as long as at least the K erasure-coded fragments needed for decoding the segment 710a are available until time T2.

In one embodiment, the fragments associated with sequential segments of streaming content are delivered to an assembling device as a plurality of sub-transmissions. In this case, each fractional-storage server participating in the delivery of the fragments to the assembling device sends a transmission to the assembling device comprising a sequence of erasure-coded fragments. This transmission is referred to as a sub-transmission. In one example, each sub-transmission contains at least one fragment per each sequential segment of the streaming content. In one example, the sub-transmission starts at a segment indicated by the assembling device, and continues from that point onwards, approximately according to the sequential order of segments, until the assembling device instructs the server to stop, or until reaching the last segment of the content. Each sub-transmission carries only a fraction of the fragments (per segment) needed to reconstruct the segments of the streaming content, such that the combination of at least two sub-transmissions received by the assembling device from the servers allows the assembling device to obtain enough fragments needed to reconstruct each segment.

In one embodiment, each sub-transmission is delivered to the assembling device via a streaming session, such as an RTP session, wherein the RTP packets transport the fragment sequence approximately according to the order of the sequential segments. In one embodiment, each sub-transmission is delivered to the assembling device via an HTTP connection, or other closed-loop data transfer mechanisms over TCP/IP. In one embodiment, the assembling device may change one or more transmitting servers on the fly, by instructing the server(s) to stop sending an already active sub-transmission—as may be needed in a case of an RTP session, and initiating new sub-transmissions from other servers instead. Replacement of transmitting servers on the fly may be needed in a case of a server failure, network failure, or high load or latency conditions.

Figure 21:
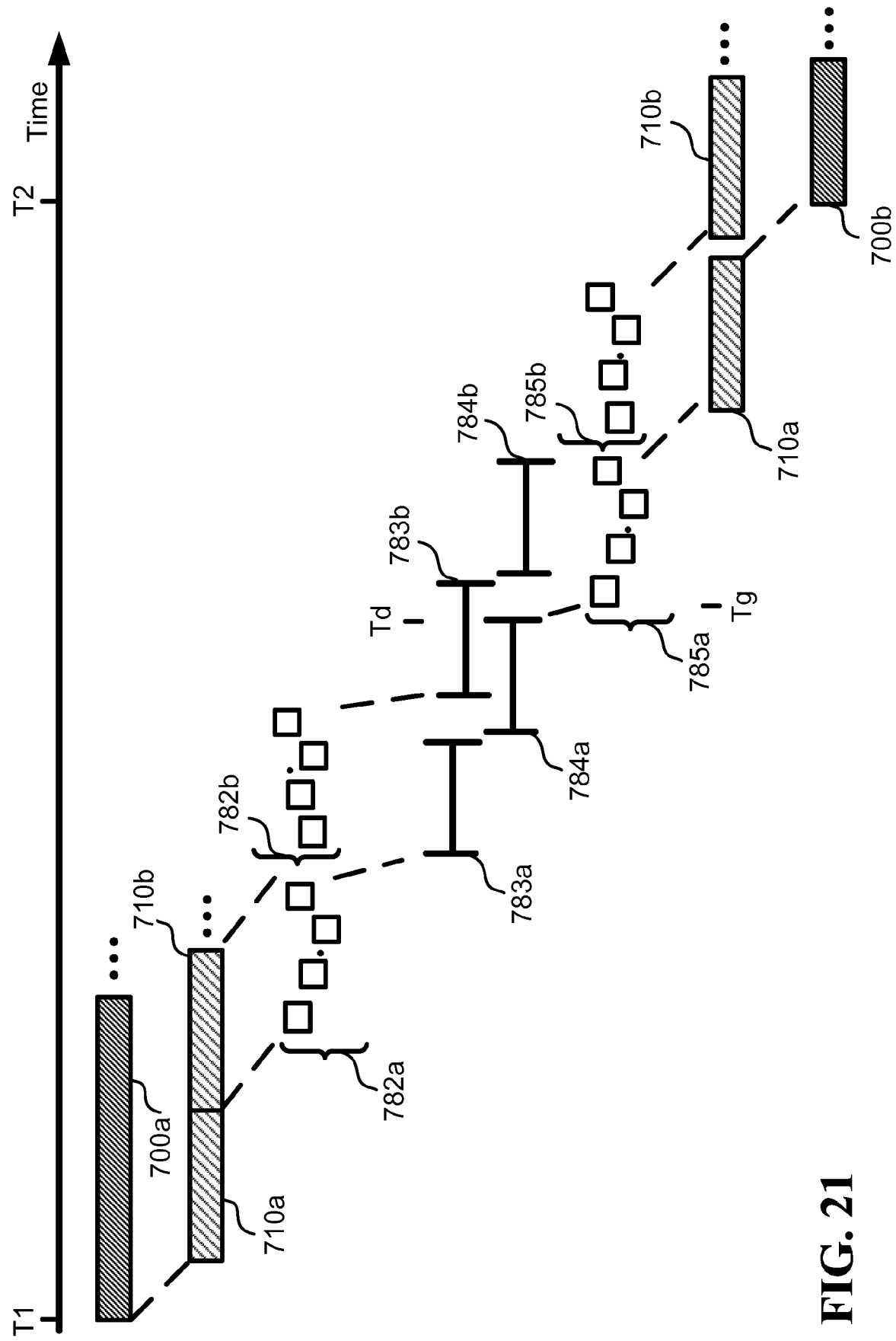
FIG. 21 illustrates a broadcast-like effect.

FIG. 21 illustrates one example of creating a broadcast-like effect (i.e. retrieving the content while it is distributed). Streaming content 700a, which may be ready in advance or received on-the-fly, is to be received and presented by multiple assembling devices at approximately the same time. Content 700a is segmented into segments on-the-fly, such that the first segment 710a is ready shortly after the data is available, and subsequent segment 710b is ready right after that. Segments 710a and 710b are sequentially encoded into erasure-coded fragments 782a and 782b correspondingly, such that the average rate of encoding segments into erasure-coded fragments does not fall below the average rate of introducing new segments (as content 700a is being received for broadcast).

As the erasure-coded fragments 782a are ready, they are distributed 783a to the fractional-storage servers. Subsequent erasure-coded fragments 782b are similarly distributed 783b to the servers, such that the average rate of distributing the erasure-coded fragments associated with each segment does not fall below the rate of introducing new segments (or in other words, such that there is approximately no piling-up of undistributed segments). Optionally, the erasure-coded fragments 782a are also distributed 784a by the servers to bandwidth amplification devices at an average distribution rate per segment that does not fall below the average rate of introducing new segments.

The assembling devices obtain erasure-coded fragments 785a associated with segment 710a from the fractional-storage servers, and optionally also from the bandwidth amplification devices. Subsequent erasure-coded fragments, such as 785b associated with segment 710b, are obtained at an average rate that does not fall below the average rate of introducing the new segments. The segment 710a is then reconstructed from the obtained erasure-coded fragments 785a. The subsequent segment 710b is reconstructed from the obtained erasure-coded fragments 785b, such that reconstructing each segment is performed at an average rate that does not fall below the average rate of introducing the new segments.

Then, the reconstructed segments are presented, optionally on-the-fly, as reconstructed content 700b. In one embodiment, the entire process end-to-end is performed in real time, such that the presentation of 700b starts at T2 minus T1 after the availability of content 700a, and such that the delay of T2 minus T1 (between the availability of new segments and their subsequent presentation by the assembling device) is kept approximately constant throughout the entire presentation of the streaming content 700b, once begun.

In one example, the content 700a is a 4 Mbps video stream, and the segment size is 96 Kbytes, meaning that new segments 710a, 710b are made available at a rate of one every 0.19 seconds. Assuming that each process as described takes 0.19 seconds, and that all processes are performed sequentially (with no overlapping in time, which may be possible for some of the processes), then the accumulated process time, which includes 710a, 782a, 783a, 784a, 785a and 710a, takes about 6×0.19=1.14 seconds. This means that an assembling device may begin with content presentation 1.14 seconds after the content is first made available to the system.

Still referring to FIG. 21, in one embodiment, the fragments are obtained from the servers using multiple sub-transmissions, such that each transmitting server sends a fraction of the needed fragments to the assembling device, according to the sequential order of segments. Each sub-transmission transmits the fragments approximately at a rate at which the fragments are being created on-the-fly from segments of the content to be received by the assembling device. According to another embodiment, the fragments are obtained from the servers using fragment requests made by the assembling device using a fragment pull protocol.

The Audio/Video compression utilized in creating content 700a is not necessarily a fixed rate compression, meaning that the various resulting segments do not necessarily contain the same amount of presentation time.

In one embodiment, once starting to retrieve a broadcast-like stream, the assembling device may use one of the following methods to synchronize the retrieval of the stream's segments with the ongoing availability of new segments of the stream: (i) The assembling device retrieves additional segments such that the average rate of obtaining new frames approximately equals the average rate of presenting frames. (ii) The assembling device retrieves additional segments such that it does not try to retrieve segments that are not yet indicated as being available. And (iii) The assembling device retrieves additional segments so as to approximately maintain a constant distance (in segments) between the most currently available segment and the segment currently being retrieved.

In one embodiment, the assembling device presents the broadcast-like stream at approximately the same frame rate as the rate of producing new frames for the broadcast-like stream. In one example, the frame rate is constant throughout the stream, such as the case of fixed 24, 25, 50, or 60 frames per second.

In one embodiment, the assembling device obtains an indication regarding the most newly available segment (per specific broadcast-like stream) for retrieval. The assembling device then starts to retrieve from the most newly available segment. In one example, the most newly available segment is the last segment that was distributed to the fractional-storage servers. In another example, the most newly available segment is a segment that was recently distributed to the fractional-storage servers, but wherein there are newer distributed segments, which are not yet indicated as being available.

In one embodiment, the broadcast-like stream is of a pre-recorded content, such that it is possible to distribute the entire content to the fractional-storage servers, and after any period of time allow the real time consumption of the content by any number of assembling devices. In such a case, an indication is made to the assembling devices regarding the real time allowance to retrieve the related segments. The allowance can start at a certain point in time (which corresponds to the beginning of the broadcast-like "transmission") for the first segment, and then the allowance may continue for subsequent segments, at a rate that approximately corresponds to sustaining the frame rate of the broadcast-like stream.

Figure 22:
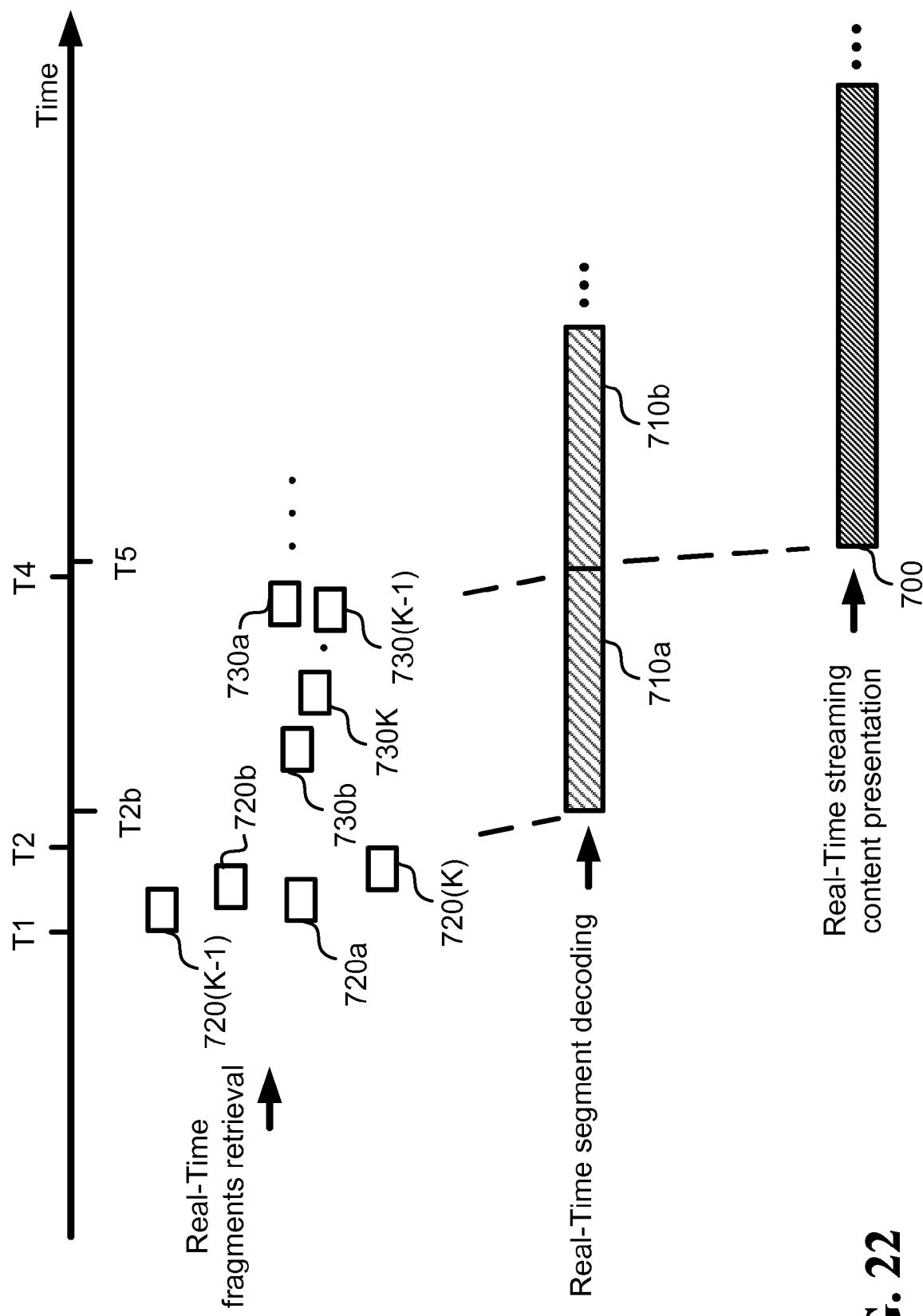
FIG. 22 illustrates fast real time fragment retrieval.

FIG. 22 illustrates one embodiment of real time streaming content retrieval from fractional-storage servers, wherein erasure-coded fragments 720a to 720(K) are retrieved in a fast cycle, meaning that several erasure-coded fragments are obtained approximately in parallel. As a result, the interval T2 minus T1 is more or less limited only by the download bandwidth of the assembling device's modem. Referring to the example of FIG. 20, T2 minus T1 can be reduced from 0.77 seconds to 0.15 seconds, if the modem operates at 5 Mbps (instead of 1 Mbps).

In one embodiment, T1 to T2 represents a fragment fetch cycle that corresponds to the beginning of streaming content to be presented (in that case, segment 710a is the first segment of the content, and presentation 700 corresponds to the beginning of the streaming content), or corresponds to a certain point within the streaming content to be presented starting this point onwards (in that case, segment 710a is a segment within the content, and presentation 700 corresponds to playing the content starting not from the beginning, but rather from segment 710a, located somewhere within the content). This is also known as trick play. In one embodiment, erasure-coded fragments 720(a) to 720(K) are obtained such as to result in approximately a maximum utilization of the download capabilities of the assembling device, and such that the rate of requesting erasure-coded fragments results in a data arrival rate that on average utilizes the assembling device's maximum download bandwidth.

In one embodiment, the fragment pull protocol request includes a priority indication. A high priority indication means that the servers should give a preference to responding with a fragment transmission. High priority requests are served before other requests. Optionally, high priority requests are served even if the server's bandwidth quota is exceeded. In one embodiment, the high priority requests are used by the assembling devices for receiving priority in the reception of the first segment, or several first segments, in order to facilitate fast starting of content presentation after content request by the user (either when starting to play a content, or in trick play mode, when starting to play a content from a certain point).

Figure 23:
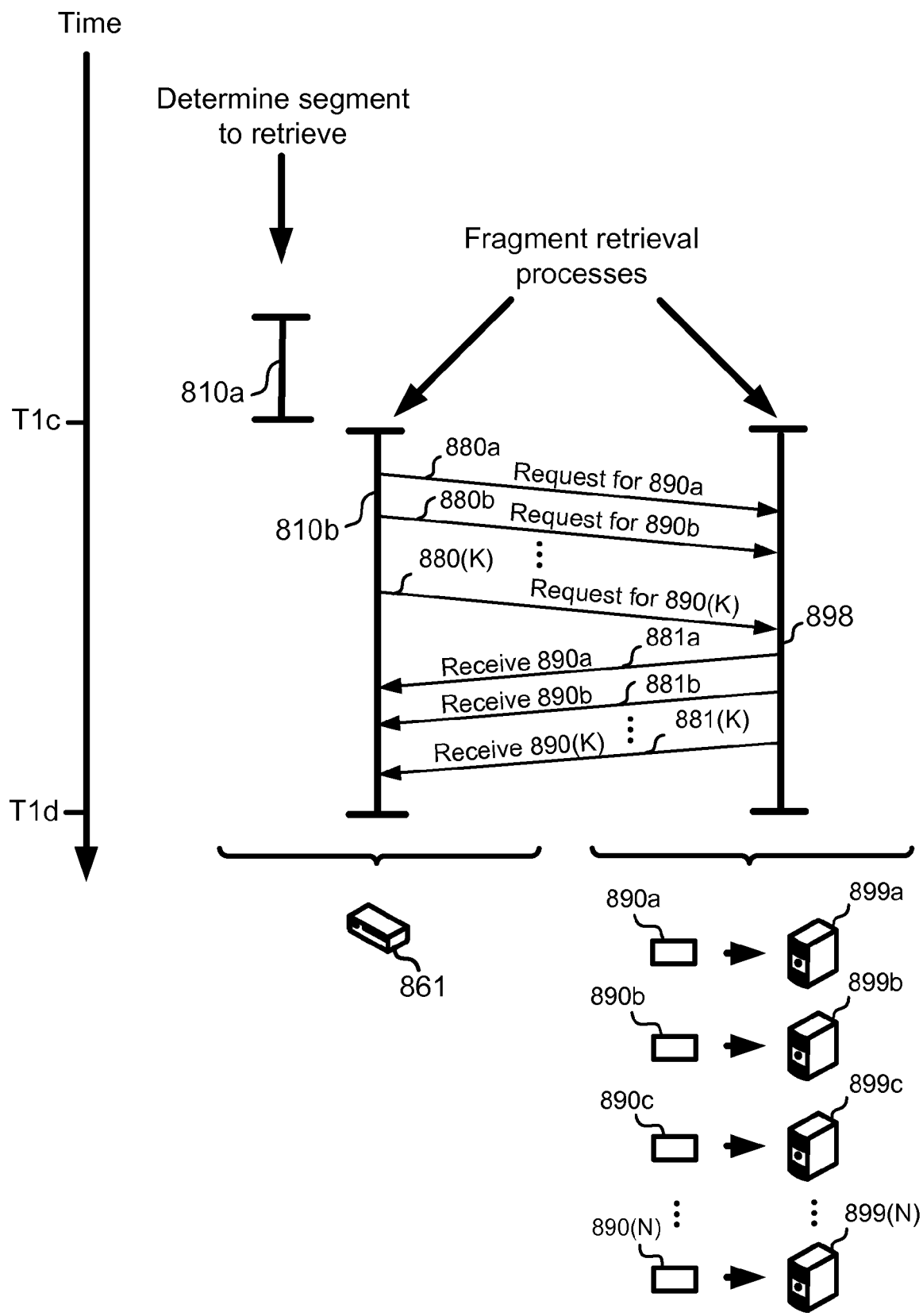
FIG. 23 to FIG. 26 illustrate various embodiments of fragment pull protocols.

FIG. 23 illustrates one embodiment of a fragment pull protocol. Assembling device 861 (also represented by protocol diagram element 810b) obtains erasure-coded fragments from fractional-storage servers 899a to 899(N) (also represented by protocol diagram element 898), utilizing the following steps: (i) deciding 810a which segment to retrieve; (ii) device 861 sending requests to some of the fractional-storage servers for erasure-coded fragments associated with the desired segment. For example, requests 880a to 880(K) for erasure-coded fragments 890a to 890(K), from servers 899(a) to 899(K), correspondingly; and (iii) the servers respond by sending the requested erasure-coded fragments. For example, servers 899a to 899(K) send 881a to 881(K) erasure-coded fragments 890a to 890(K) to device 861. The fragment request and receipt process begins at T1c and ends at T1d. At time T1d, device 861 has enough erasure-coded fragments (K) to reconstruct the segment selected at 810a. In one embodiment, the process from T1c to T1d occurs in real time, in support of streaming content presentation.

Figure 24:
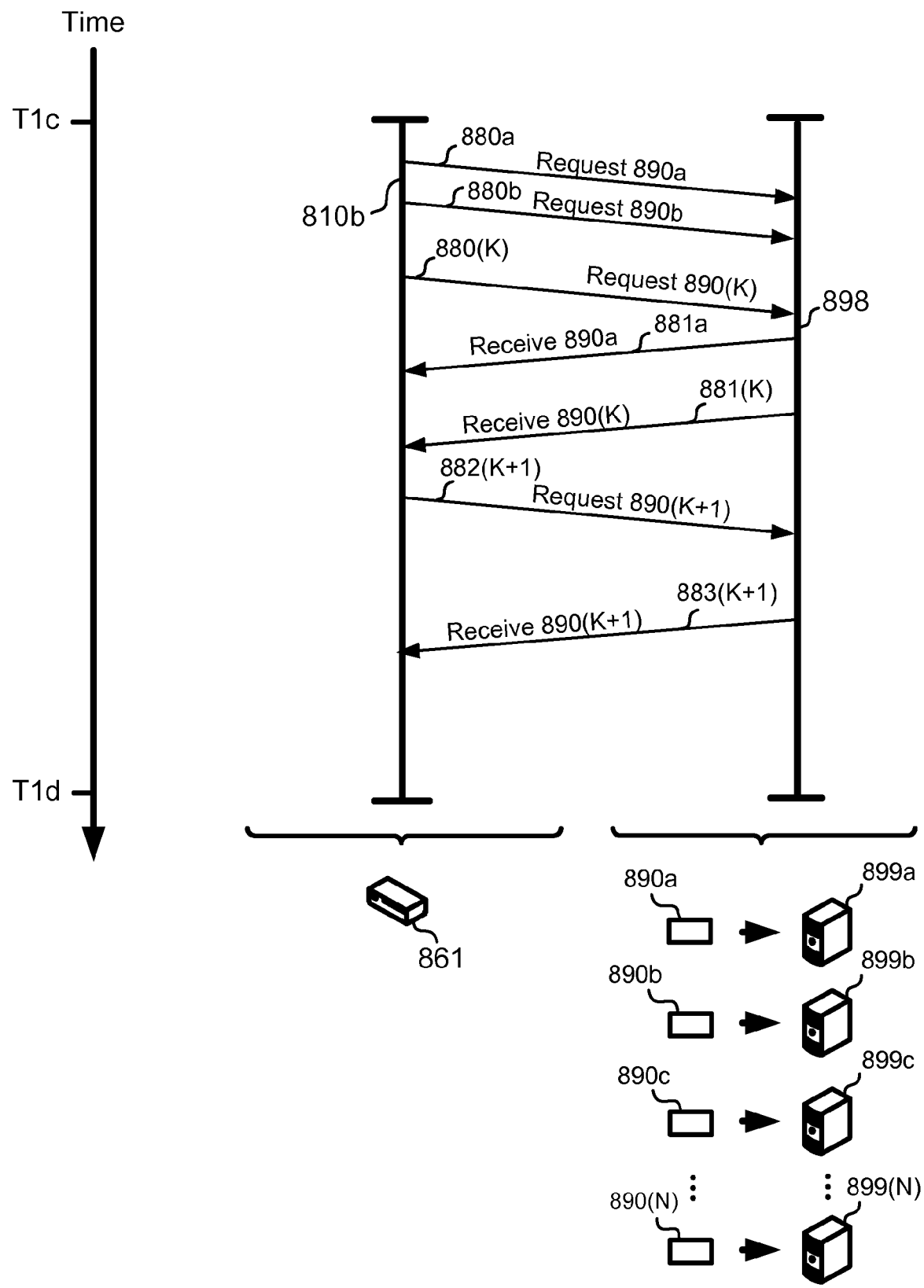

FIG. 24 illustrates a similar process to FIG. 23, where request 890b fails to result in a reception of erasure-coded fragment 890b for any reason (such as a server fault, network congestion, or abnormal latency conditions). Assembling device 861 therefore issues another request 882(K+1) for erasure-coded fragment 890(K+1) in response, and receives 883(K+1) the additional erasure-coded fragment 890(K+1) needed to reconstruct the segment.

Figure 25:
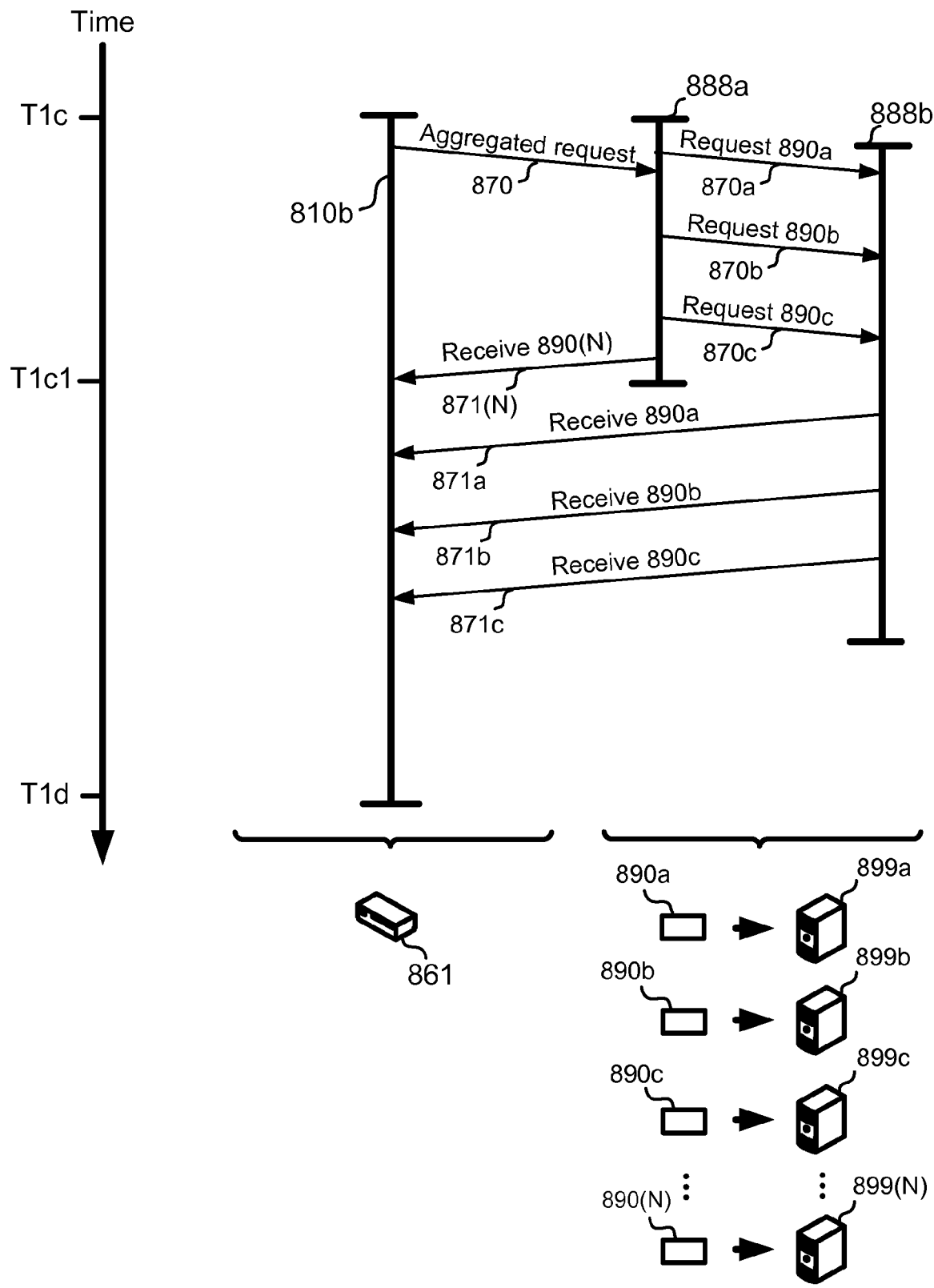

FIG. 25 illustrates a similar process to FIG. 23, where requests for erasure-coded fragments are loaded into one aggregated request 870, that is sent to one of the fractional-storage servers (the receiving server is illustrated as protocol diagram element 888a, and will be also referred to as a "relay server"). In one example, if the relay server is 899(N), then, it will forward the request to additional servers 899a to 899c (protocol element 888b) via new requests 870a to 870c (on behalf of assembling device 861). Servers 899a to 899c will then respond by sending the erasure-coded fragments 890a to 890c (871a to 871c) to the assembling device 861. Server 899(N) will send 871(N) fragment 890(N) to the assembling device.

The term "fragment pull protocol for high latency" as used herein denotes a protocol enabling an assembling device to request one or more fragments from one or more providing sources, wherein the time to transmit the one or more fragments in response to the assembling device request, through the slowest communication link connecting the responding source and the assembling device, is smaller than the round trip communication delay between the assembling device and the responding source, excluding the processing time of the providing source. For example, if the round trip communication delay between Israel and the USA is about 200 ms, the assembling device requests one fragment sized about 1500 bytes, and the slowest communication link is an ADSL line connecting the assembling device at 1.5 Mbps, then the time it takes to transmit the requested fragment through the slowest communication link is about 1500*8/1500000=8 ms, which is much smaller than the round trip delay. Many of the disclosed embodiments using fragment pull protocol may use fragment pull protocol for high latency for retrieving the fragments.

Figure 26:
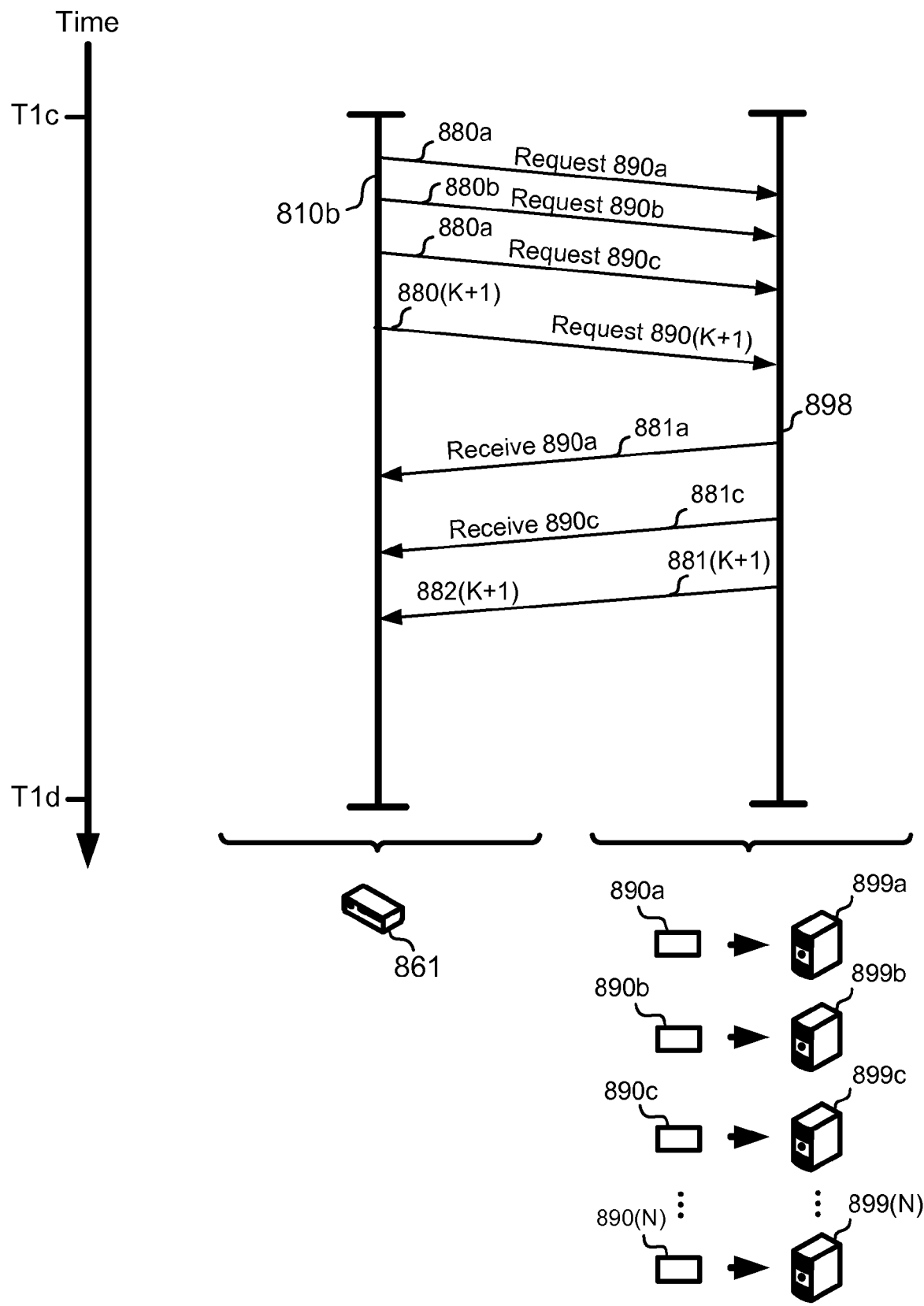

FIG. 26 illustrates a similar process to FIG. 23, where one or more extra erasure-coded fragments (in addition to the needed K) are requested in advance (illustrated as request 880(K+1) for erasure-coded fragment 890(K+1)), such that if, as an example, request 890b fails to result in a reception of erasure-coded fragment 890b, assembling device 861 does not have to request new erasure-coded fragments to reconstruct the segment, since there are still at least K erasure-coded fragments that were successfully received and therefore the segment can be reconstructed.

In one embodiment, more fragments than needed to reconstruct a segment are requested, such that the additional requested fragments approximately compensate for fragment failure conditions. If, statistically, F fragment requests are expected not to result in the reception of a fragment (i.e. fragment loss), out of a total number of K+F fragment requests (wherein K is the minimal number of fragments needed to reconstruct a segment), then it is possible to request K+F fragments instead of just K. In one embodiment, more than K+F fragments are requested, since the quantity of the received fragments is a statistical variable. In this case, K+F+S fragments are requested, wherein S is a safeguard amount of additional requests to assure that at least K fragments are received. In one embodiment, the fragment loss F changes over time, and the assembling device handles the change by increasing or decreasing the number of fragments requested per segment. In one embodiment, the assembling device may determine F based on previous fragment failure rates.

In one embodiment, requesting K+F+S fragments for a segment will almost always result in the reception of at least K fragments, and therefore the assembling device may request K+F+S without being concerned about which fragment has not arrived, and without trying to actively compensate for fragment failures by issuing additional fragment requests. In this case, the assembling device requests the fragments in an "open loop" fashion, meaning that it requests the K+F+S fragments, and moves on to another segment. In one embodiment, even when requesting K+F, or K+F+S fragments per segment, it is still possible not to receive the needed K fragments. Therefore, the assembling device may compensate for undelivered fragments by issuing additional fragment requests (a "closed loop" operation).

In one embodiment, the K+F, or K+F+S fragment requests are issued approximately in parallel, in order to achieve the fastest response possible for reconstructing a segment. In this case, the fragments start to arrive at the assembling device a short while after being requested, such that as soon as at least K out of the requested fragments arrive, the assembling device may immediately proceed with reconstructing the segment.

In one embodiment, an assembling device may aggregate several fragment requests into one message. The aggregated message is then sent to a fractional-storage server, possibly in a payload of a single packet, and optionally in order to conserve outgoing bandwidth and/or to reduce the number of packets needed to convey the requests. The fractional-storage server may then read the aggregated message and act accordingly by sending a plurality of fragment responses to the assembling device. The fragment responses may include one fragment at each payload, as is the case of responding to a single fragment request, or it may include an aggregated response including multiple fragments at each payload.

In one embodiment, fragment aggregation is used for retrieving fragments associated with segments of streaming content, and each aggregated message requests fragments associated with a specific segment. For example, three fractional-storage servers store together 12 fragments associated with a certain segment, such that each stores four fragments. The assembling device needs the 12 fragments in order to reconstruct the segment and therefore issues three aggregated fragment request messages—one for each server. The three servers receive the aggregated request messages, and each server responds by sending its four fragments to the assembling device. Therefore, only three aggregated request messages were needed to retrieve the 12 fragments. The assembling device may request fragments associated with the next segment(s) in a similar manner using additional aggregated requests, optionally until receiving all required segments.

Figure 27:
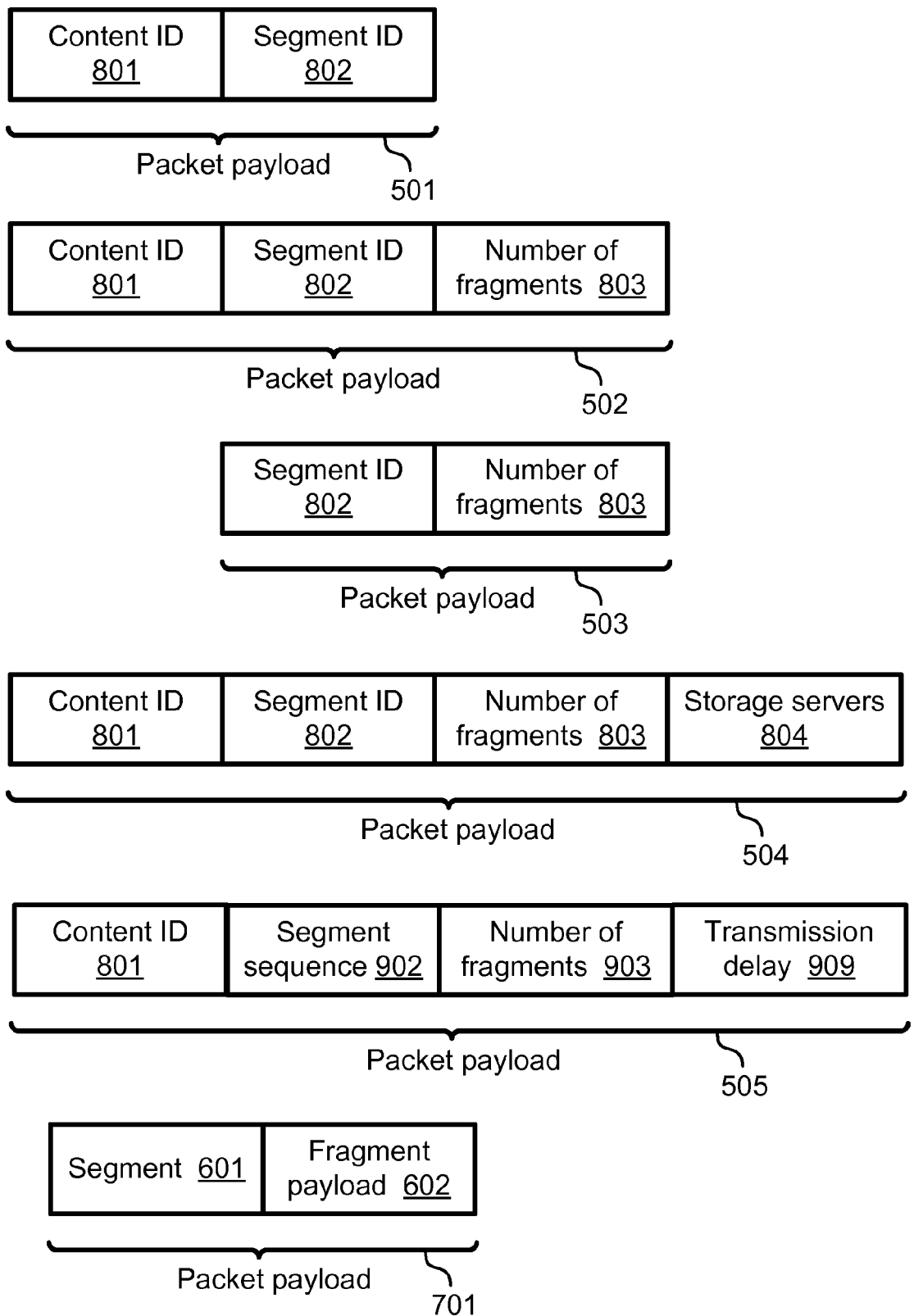
FIG. 27 illustrates various aggregated and non-aggregated fragment request messages.

FIG. 27 illustrates various examples of aggregated fragment request messages. In one example, the aggregated fragment request messages 503, which may be transported using one packet payload, uses a format (or a data structure) comprising a segment identification 802 and the number-of-fragments 803 requested by the assembling device. The receiving fractional-storage server uses the segment identification information to locate the relevant fragments associated with the identified segment, and then uses the number-of-fragments parameter 803 to determine how many fragments, out of the located fragments, should be transmitted to the requesting device as a response.

In one embodiment, the fragments are erasure-coded fragments and the fractional-storage servers store unique erasure-coded fragments. The assembling device receives multiple erasure-coded fragments from multiple servers, such that the number of received fragments is at most the sum of all number-of-fragments 803 values as has appeared in all of the aggregated requests messages. In this case, the various fractional-storage servers need no inter-coordination to respond to message 503, as the assembling device does not care which of the fragments associated with the identified segment were received, as long as at least the requested number of unique erasure-coded fragments were received. In some embodiments, aggregated fragment request messages and single fragment requests are used concurrently.

In another example, an aggregated fragment request message 502 further comprises a content identification field 801. In still another example, an aggregated fragment request message may comprise requests for fragments associated with different segments of streaming content. In this case, and according to one example, the aggregated request 505 comprises a sequence of identified segments 902 containing the identification of all segments for which the assembling device requests fragments. Optionally, in the absence of additional information in the aggregated message, the fractional-storage server may assume that one fragment per each of the segments identified in sequence 902 is required. In this case, the server will locate such fragment per each of the identified segments, and will send them to the requesting device. The requesting device may include information regarding how many fragments are required per identified segment, as a number-of-fragments parameter 903. The number-of-fragments 903 may be a scalar value that indicates how many fragments are requested per each identified segment, or it may be a vector value, indicating the number of required fragments per each of the identified segments in the sequence.

In one embodiment, fractional-storage server responds to a message, comprising aggregated requests for fragments associated with multiple segments, by sending all of the requested fragments to the requesting device, or by sending all of the requested fragments to the requesting device in a certain order. The order may follow the sequential order of the segments in streaming content. In one example, the fractional-storage server first sends the fragments associated with the first identified segment, and then sends the fragments associated with the next identified segments. Packet payload 505 illustrates one example of an aggregated fragment request message comprising a transmission delay 909 instructing the fractional-storage servers to incorporate intended delays while transmitting the different fragment responses. In one example, the transmission delay 909 sets the desired time delay between transmission of each group of fragments associated with the segments identified in the sequence 902. In this case, the fractional-storage server responds to the aggregated request message by transmitting a sequence of fragments, associated with the identified segments, at a duty cycle determined by the transmission delay 909. In one example, the segments belong to streaming content and the effective rates at which the servers transmit their responses are controlled using the transmission delay 909.

In one embodiment, the fragments are erasure-coded fragments and the assembling device uses multiple aggregated fragment request messages for obtaining the required content. Each message comprises multiple fragment requests associated with one sequence of segment(s) and addressed to a different fractional-storage server storing the relevant fragments. Each such sequence of segments may be referred to as a portion of streaming content, whereby the assembling device uses multiple aggregated messages to obtain each portion of the streaming content at a time. In one embodiment, the assembling device uses a wireless interface, such as WiFi, to connect to the Internet and communicate with the fractional-storage servers, and the fragment request aggregation techniques may dramatically reduce the number of time such an assembling device needs to gain access to the outgoing wireless interface. Moreover, the fragment request aggregation techniques may be combined with many of the disclosed embodiments for retrieving erasure-coded fragments.

Still referring to FIG. 27, in one embodiment, requests for fragments are transmitted via an IP network, in the form of packet payloads. The packet payload may be, as an example, the payload of a UDP packet carried over IP. In one embodiment, packet payload 501 contains a fragment request comprising content identification 801 and segment identification 802. A server receiving such a request uses the content and segment identifications to locate a relevant erasure-coded fragment, and transmits it back to the requester. Optionally, if no references are made as to how many fragments are requested per the identified segment, the server may assume that only one fragment is requested.

In one embodiment, the fragment responses are transported over an IP network, using packet payloads. In one example, packet payload 701 includes an actual requested fragment payload 602, and, optionally, information regarding the segment 601 to which the fragment payload belongs. The segment information may be needed if the requester retrieves fragments associated with more than one segment, and therefore it must know to which segment the fragment payload belongs. In one example, the fragment response is transported over UDP/IP, or TCP/IP, such that the payload 701 is a UDP or TCP payload.

In one embodiment, multiple segments of content, which, in one example, is streaming content, are reconstructed by an assembling device retrieving multiple erasure-coded fragments associated with the multiple segments. Since a fragment request does not always result in a reception of the fragment, some requested fragments may fail to arrive at the assembling device. Therefore, the assembling device checks (from each of the segments for which fragments have already been requested) which requested fragments have failed to result in a correct reception of a fragment. For each such failure, the assembling device issues an additional request for a fragment. The additional requests are associated with segments for which fragments have already been requested before, and therefore, in one example, the resulting fragment retrieval process includes the following two sub-processes: a first sub-process of requesting fragments associated with new segments to be reconstructed, and a second sub-process of requesting additional fragments needed to complement already requested fragments, in order to reconstruct the segments. The first and second sub-processes work together, such that the second sub-process may complement fragments associated with a first segment, while the first sub-process runs ahead in an attempt to obtain fragments needed to reconstruct a second segment; wherein the second segment is located ahead of the first segment. The first and the second sub-processes can also be described as two different quantities of fragments being requested: a first quantity associated with the first sub-process requests, and a second quantity associated with the second sub-process requests.

Figure 28:
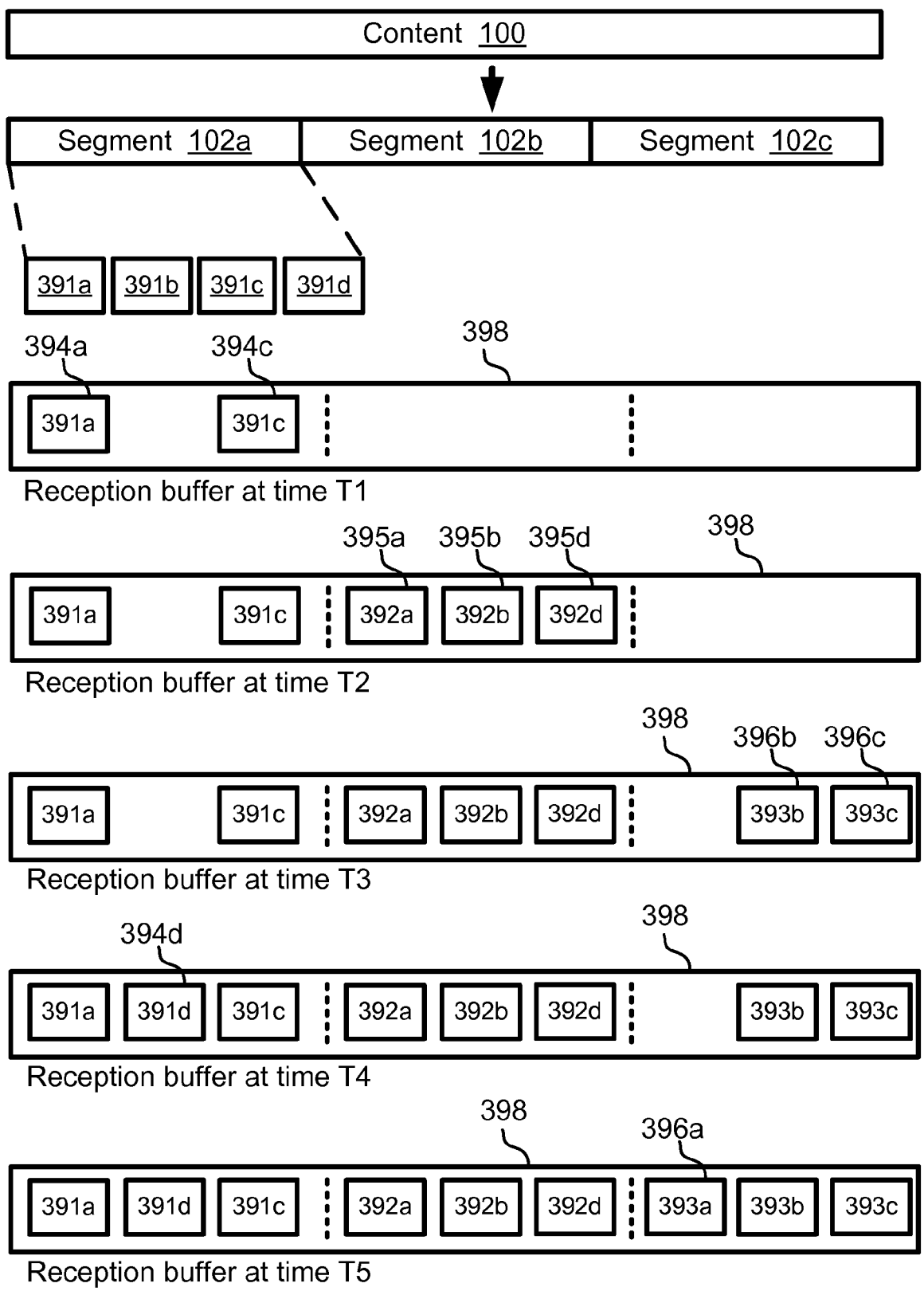
FIG. 28 illustrates retrieving fragments and compensating for failures.

FIG. 28 illustrates one example of retrieving fragments and compensating the failures. Content 100 is segmented into segments 102a, 102b, and 102c, and each segment is erasure-coded into four fragments, as illustrated for segment 102a, which is coded into fragments 391a to 391d. This example assumes that each segment can be reconstructed by obtaining any three fragments associated with it. Prior to time T1, the assembling device requests fragments 391a, 391b, and 391c in order to reconstruct segment 102a. At time T1, only two of the requested fragments 391a and 391c have resulted in fragment reception, and were placed 394a, 394c in the buffer 398. Fragment 391b has not yet been received at time T1, but can still be received later, and therefore at time T1 the assembling device does not yet try to complete the missing fragment with an additional fragment request. Instead, it proceeds and requests fragments associated with segment 102b. At time T2, all of the fragments requested for segment 102b have arrived, and have been placed 395a, 395b, 395d in the buffer 398. Prior to time T2, the assembling device transmits additional requests for fragments associated with segment 102c, and at time T3 two out of the requested fragments have arrived, and have been placed 396b, 396c in the buffer 398. At time T3, the assembling device realizes that the chances on receiving the previously requested fragment 391a (associated with segment 102a) are too small. This may be concluded, for example, as a long time having elapsed since the request, or by receiving a message from a fractional-storage server saying it is too loaded to respond with a fragment. Either way, the assembling device chooses to request an additional fragment 391d, instead of the previously requested 391b. At time T4, the additional request is met with the reception of fragment 391d, and with its placement 394d in the buffer 398. At time T5, the third fragment previously requested for segment 102c has finally arrived and has been placed 396a in the buffer 398, so there is no need to complement with an additional fragment request. At time T5 all fragments needed to reconstruct segments 102a to 102c are stored in the buffer 398. It is noted that only one additional fragment request was needed in order to account for the lack of reception of fragment 391b, and that this additional fragment request was issued after consequent fragments had already been requested for consequent segments.

In one embodiment, significant communication latency and/or other latencies between requesting and receiving a fragment exists. A significant latency may result in a case where the average latency in responding to fragment requests is in the order of magnitude of the total transmission time of all fragments needed to reconstruct a segment. As an example, if a segment needs 64 fragments of 1500 Bytes each to be reconstructed, and the assembling device has a 1.5 Mpbs incoming connection, then it takes about (64 (fragments)× 1500 (bytes per fragment)×8 (bits per byte))/1.5 Mbps=0.512 seconds to transmit the fragment via the incoming connection. If the average latency is 0.2 seconds (which is within the order of magnitude of 0.512 seconds), then from the time of requesting the first fragment to the time all fragments have arrived, a period of no less than 0.512+0.2=0.712 seconds may elapse. If the process takes 0.712 seconds, the resulting effective incoming throughput will be only (64 (fragments)× 1500 (bytes per fragment)×8 (bits per byte))/0.712 (seconds) =1.07 Mbps, which is significantly less than the potentially 1.5 Mbps. In a case where some fragments are lost, and need to be requested again, the total time for segment retrieval may reach as high as 0.512+0.2+0.2=0.912, and the effective incoming throughput down to only 842 Kbps. The significant latency therefore adversely affects the effective incoming throughput. The effective throughput can be made to approach the incoming bandwidth available to the assembling device by utilizing the above-described fragment retrieving process comprising the two sub-processes of requesting fragments and complementing the failures. In this case, the first sub-process can be made to result in an average targeted fragment reception throughput, and span multiple segments, without handling the lost fragments. The second sub-process can then complement with additional needed requests, approximately per each fragment request that seems not to result in an actual fragment reception. According to another view, the first sub-process is an open loop retrieval process, in which the assembling device does not wait to check whether enough fragments have arrived per segment. And the second sub-process is the process, which closes the loop on fragments arrival, in order to make sure that every segment has enough fragments to enable reconstruction.

In one embodiment, an assembling device may control the erasure-coded fragment reception throughput by controlling the rate of fragment request. For example, each of n fragments has a known size S1 to Sn. Therefore, issuing n requests over a period of T will result in an average fragment reception throughput of (S1+S2 . . . +Sn)/T. In one example, if each fragment is 1500 Bytes, and 64 fragment requests are issued over a period of 0.5 seconds, then the average expected fragment arrival throughput is (64×150×8)/0.5=1.53 Mbps. The fragment requests do not need to be uniformly spread over the period of 0.5 seconds, although such a spread may result in a more stable throughput, which means that less communication buffering will be needed. Using the above-described rate-control technique may result in one or more of the following: retrieving the content at a target fragment reception throughput; preventing communication buffer spill at the last mile network resulting from uncontrolled fragment requests; and/or reducing fragment loss due to averaging the fragment traffic.

Using the fragment pull protocol may result in a significant amount of requests, which may consume a significant percent of the outgoing bandwidth of the assembling device. In one embodiment, the assembling device aggregates two or more fragment pull protocol requests for erasure-coded fragments in one aggregated request. The aggregated request is transmitted to a relay server, which, in turn, distributes the aggregated requests between two or more fractional-storage servers. Aggregating the requests may save bandwidth and significantly reduce the number of packets needed to convey the requests. For example, a request for a single fragment, transported over UDP/IP or similar protocols, requires about 60 bytes of overhead. Meaning that even if one request, containing only several bytes of request-related payload, is needed, the resulting message will probably exceed 80 bytes. Therefore, transmitting, as an example, 64 fragment requests per single segment will result in a total uplink bandwidth requests of about 80×64=5 Kbyte. Using the relay approach can result in a much more efficient communication. In a case where 64 fragment requests are aggregated into one message to a relay server, and assuming that each fragment request has a payload of about 10 bytes (the payload may comprise segment and content information, as an example), then one aggregated message may contain about 60+64×10=700 bytes, instead of the 5 Kbytes. In addition, one packet containing the aggregated requests may be used instead of 64 separate packets needed in the non-aggregated case. This may be significant when, as an example, the assembling device is connected to the Internet via a wireless connection, such as a WiFi connection. In this case, instead of having to gain access to the air interface 64 times per segment, the assembling device accesses the air interface only once per segment, under the assumption that 64 fragment requests are loaded into one aggregated request.

In one embodiment, the assembling device transmits an aggregated message containing multiple fragment requests to a relay server. The relay server, in turns, creates multiple fragment requests, and transmits the requests to multiple fractional-storage servers on behalf of the assembling device.

In one embodiment, an aggregated fragment request message sent to a relay server identifies the destined storage server(s). In one example, the destined storage servers are identified by their IP addresses. The relay server, in turn, uses the identification information in the message to create multiple requests for fragments on behalf of the assembling device. In this embodiment, the assembling device determines the destined servers (via the aggregated relayed message), and the relay server creates the multiple fragment requests according to the assembling device's instructions.

Referring to FIG. 27, in one embodiment, a single request payload 504 is used to relay multiple fragment requests to multiple storage servers via a relay server. The payload 504 comprises the identified content 801 and segment 802, the number of requested fragments 803, and a list of servers 804, which contain relevant fragments. The relay server, in turns, relays multiple fragment requests to the servers identified in the list 804, according to some embodiments.

In one embodiment, an assembling device transmits aggregated messages to a relay server, including the number of fragments needed per certain segment, but without identifying the storage servers from which fragments are to be requested. The relay server selects the appropriate storage servers to which the fragment requests are to be transmitted, and transmits discrete or aggregated fragment requests, corresponding to the number of fragments requested by the assembling device, to the selected storage servers. The storage servers receive the fragment requests from the relay server, and transmit the requested fragment to the assembling device. The relay server may select the storage servers according to one or more criteria, as long as the selected storage servers store relevant fragments. Optionally, the relay server forwards the address of the assembling device to the selected storage servers, and/or adds the address of the assembling device to the fragment requests transmitted to the selected servers, in order to enable the storage servers to transmit the fragment response to the assembling device.

Referring to FIG. 27, in one example, the assembling device transmits a single request payload 502 to the relay, which identifies the content 801, the segment 802, and the number of requested fragments 803. The relay server, in turns, selects the relevant storage servers, generates the fragment request messages, and transmits the messages to the selected storage servers on behalf of the assembling device.

In one embodiment, shifting the process of selecting the storage servers from the assembling device to the relay server enables the design of a relatively thin and simple assembling device, having a relatively simple software, since all the assembling device has to decide in order to issue an aggregated fragment request to the relay server is how many fragments it needs per segment and, optionally, when it needs them.

In one embodiment, an assembling device transmits aggregated messages to a relay server, comprising general information regarding a portion of streaming content for which fragments are needed. Optionally, the portion of the streaming content comprises several consecutive segments. In one embodiment, the portion is defined by a starting point and an ending point within the streaming content, and the relay server uses these points to determine the actual segments comprising the portion. Then the relay generates and transmits the corresponding fragment requests to the relevant storage servers.

In one embodiment, the starting point and ending point are time stamps within the streaming content. In one embodiment, the portion is indicated by including a starting point and duration of the portion.

In one embodiment, an assembling device transmits an aggregated message to a relay server, comprising fragment pull protocol requests that identify the destined storage servers. The relay server analyzes the fragment pull protocol requests and may change one or more of the destined storage servers based on the network related information it holds, such as network congestion, server load, and/or cost.

Figure 29:
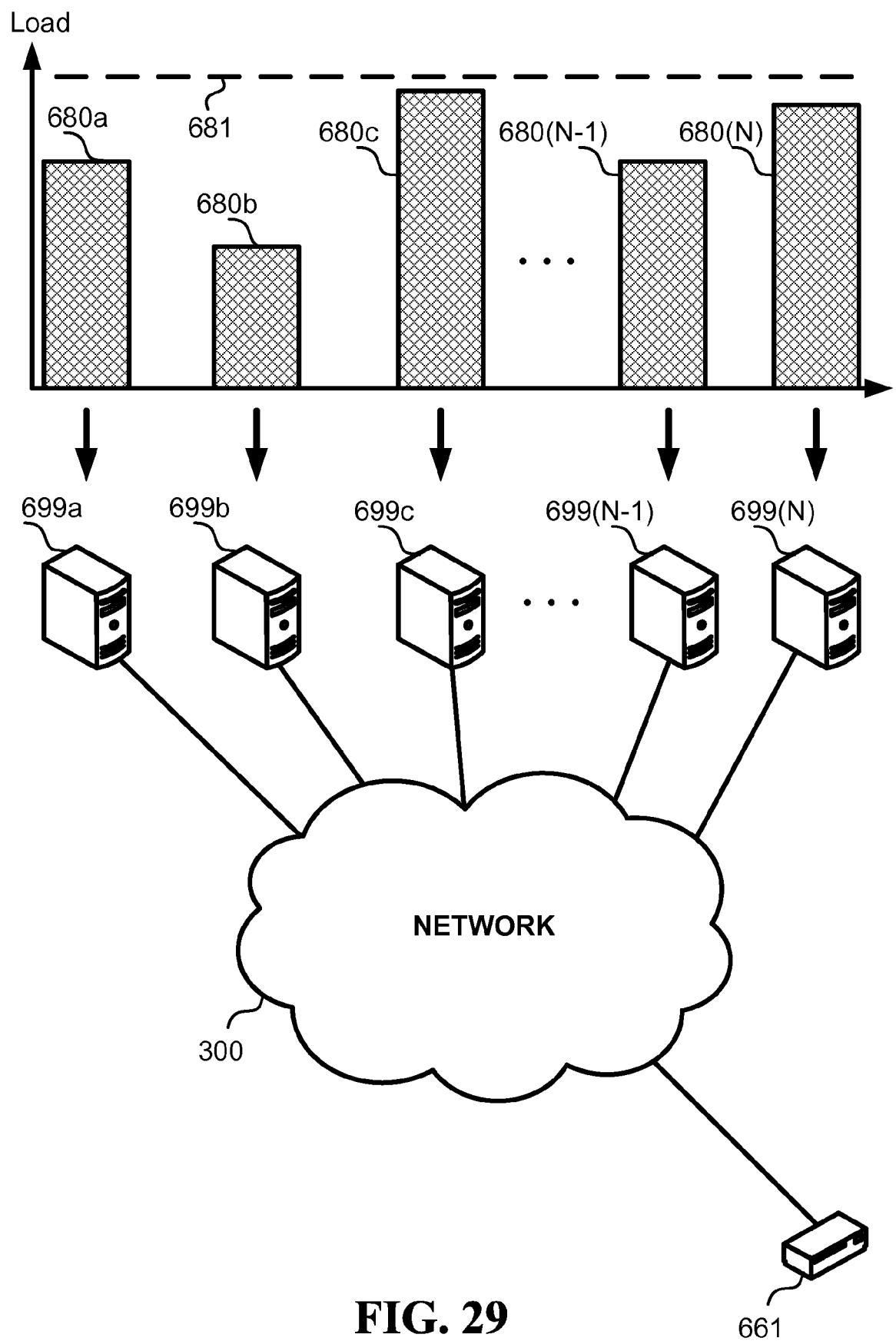
FIG. 29 illustrates fractional-storage servers having the same bandwidth capability.

FIG. 29 illustrates one example of a fractional-storage system comprising servers 699a to 699(N) having a bandwidth capability 681. In other words, no server can send data at a rate higher than 681. Assembling device 661 can select from which servers to obtain erasure-coded fragments for reconstruction of a segment. In one example, each server stores one relevant, unique, erasure-coded fragment. Therefore, from the N servers storing N possible unique fragments, the assembling device needs only K erasure-coded fragments for complete reconstruction of the segment (K<N). Since it is not important which K fragments from the N are retrieved, the assembling device may retrieve from the least loaded servers, so as to keep the load between the different servers balanced. When many assembling devices assemble contents in parallel, and since all assembling devices can select the least loaded servers, the end effect is that the load on the servers is balanced, with the potential for most servers to approach their maximal bandwidth capabilities. Optionally, that load balancing is achieved without significant coordination between the servers.

In the example of FIG. 29, assuming that K=3, the assembling device 661 may select servers 699b, 699(N−1), and 699a for fragment retrieval, as they have the lowest load of all N servers. Servers 699c and 699(N), as an example, will not be chosen, as they have relatively higher loads.

The assembling device may select the least loaded servers using any appropriate method, such as, but not limited to (i) accessing a central control server having data about the load conditions on the various servers, or (ii) periodically querying the various servers on their load conditions.

In one embodiment, instead of, or in addition to, selecting the least loaded servers, the assembling device 661 tries a random set of K servers from the N, and retrieves erasure-coded fragments from all servers reporting a load below a threshold, while higher loaded servers will be replaced by least loaded servers from the possible N servers. The end result is that the server array is balanced because the K erasure-coded fragments are retrieved from servers loaded below the threshold.

In one embodiment, the assembling device does not know which of the servers store erasure-coded fragments related to the content to be retrieved, but the assembling device knows over how many servers (from the total number) the erasure-coded fragments are distributed. Therefore, the assembling device compensates for the infertile requests by enlarging the number of requests for erasure-coded fragments. Optionally, the requested servers are selected based on approximately random algorithm.

Figure 30:
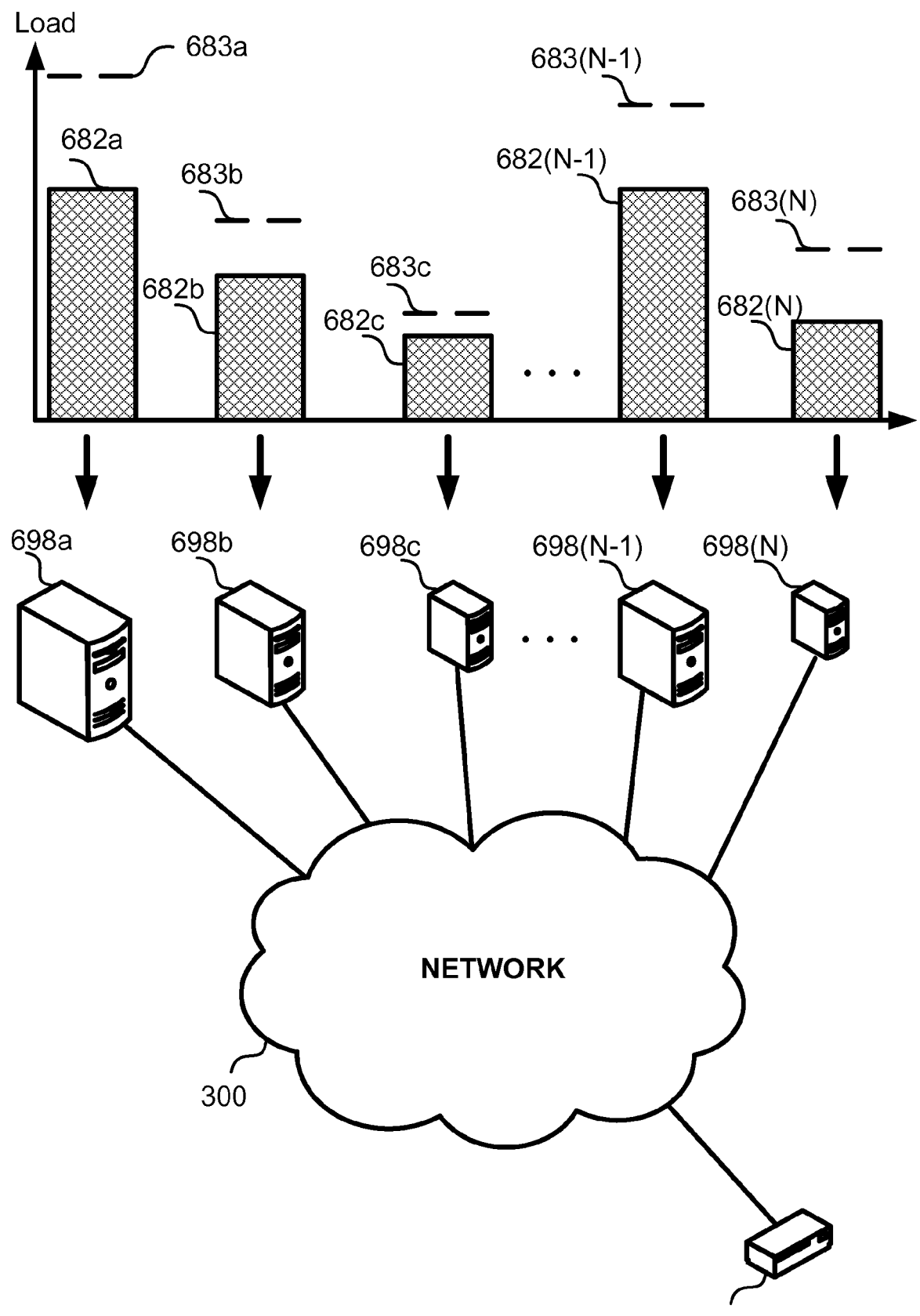
FIG. 30 illustrates fractional-storage servers having different bandwidth capabilities.

FIG. 30 illustrates one embodiment of different servers 698a to 698(N) having different bandwidth capabilities of 683a to 683(N) correspondingly. Assembling device 661 selects from which K servers, out of the possible N, to retrieve the fragments for segment reconstruction, wherein each server may have different unutilized bandwidth and different bandwidth capability. When many assembling devices assemble contents in parallel, while rejecting servers with a high load, the end effect is that the server array is approximately balanced and most servers can approach their maximal bandwidth capabilities. In one embodiment, the server array is balanced by enabling many assembling devices to select the least loaded servers. In the example, and assuming that K=3, servers 698a, 698(N−1) and 698(N) will be selected, as they have the highest unutilized bandwidth. In another example, the servers having the highest percentage of unutilized bandwidth will be selected.

In one embodiment, servers 698a to 698(N) represent completely different types of server hardware, operating systems and capabilities, all put together in an array, and achieving load balance without the need for significant inter-server coordination. In one example, the fragments are distributed to at least two different classes of servers; the first class comprises high bandwidth CDN servers directly connected to the Internet backbone, and the second class comprises lower bandwidth CDN servers not directly connected to the Internet backbone.

In one embodiment, the servers are selected for fragment retrieval according to their unutilized fragment delivery bandwidth. For example, the servers report their unutilized bandwidth, and the assembling devices, or a control server, obtain the report and decide which servers to use for fragment delivery based on the unutilized bandwidth of each server.

In one embodiment, the servers are selected for fragment retrieval according to their ability to support additional fragment delivery load. For example, the servers report their ability to support additional fragment delivery loads. And the assembling devices, or a control server, obtain the report, and select the servers that report an ability to support additional fragment delivery loads.

In one embodiment, the assembling device, or a control server, looks for a pool of servers that may be used as replacements for servers that are loaded to a degree that does not allow continuation of fragment delivery. For example, the assembling device looks for potential unloaded servers, while retrieving fragments from other servers. The assembling device may sample relevant servers approximately randomly, and/or according to indications from a control server. The sampling process may comprise querying the potential server for load information, or measuring the latency or latency variance to the servers in order to estimate the current load on the server.

In one embodiment, it is desired to replace one or more servers by other servers for the delivery of erasure-coded fragments, wherein the replacement servers are selected using a second criterion from a pool of servers identified using a first criterion. For example, the first criterion for identifying the pool of replacement servers comprises looking for servers capable of increasing their fragment delivery throughputs, and the second criterion for selecting the replacement servers from the pool comprises selecting the best latency response server from the pool. In one example, the first criterion is a latency criterion, and the second criterion is a load criterion. In another example, the first criterion is a latency criterion, and the second criterion is a latency variance criterion. In another example, the second criterion is an approximately random selection. In one embodiment, a server selected using the second criterion is compared to the server to be replaced based on the second criterion. For example, the second criterion is latency, and the replacing server, selected from the pool, has a smaller latency than the server it replaces.

In one embodiment, the server to be replaced is identified by comparing the actual performance level of the server with a threshold performance level. For example, when the compared performance is latency, a server having response latency above a certain threshold is replaced. In another example, the compared performance is the load on the server, which may be measured in terms of the amount of the unutilized fragment delivery bandwidth, or in terms of the percent of the server's unutilized fragment delivery bandwidth, or measured by any other appropriate technique.

In some embodiments, the assembling devices use a fragment pull protocol to retrieve the fragments and approach the servicing servers. In some embodiments, the assembling devices use a push protocol to obtain the fragments and approach the servicing servers, possibly by obtaining multiple sub-transmissions comprising fragment sequences.

In some embodiments, a push protocol is used to obtain fragments. A push protocol may be implemented using one transmission carrying fragments from a source server to a destination receiver, or may be implemented using a plurality of sub-transmissions. When using sub-transmissions, each sub-transmission transports a fraction of the fragments needed for segment reconstruction. Segments may be reconstructed from fragments received via sub-transmissions after obtaining decodable sets of erasure-coded fragments; optionally one set per segment. A sub-transmission may be transported using an IP stream such as RTP, an HTTPS session, or any other protocol suitable for transporting a sequence of fragments between a source server and a destination assembling device.

FIG. 17 illustrates one embodiment, in which content is segmented and erasure-coded. Fragments 390a to 390(N), belonging to a first segment, are distributed to servers 399a to 399(N) respectively. Other fragments belonging to subsequent segments are similarly distributed to servers 399a to 399(N). The servers may use a push protocol to transport the fragments to an assembling device. A push protocol sub-transmission may comprise a sequence of fragments associated with multiple segments. In one example, the fragments are ordered according to the sequential order of the segments in a streaming content. Server 399a sends a first sub-transmission to a destination assembling-device. Optionally, the first sub-transmission comprises a sequence of fragments starting with fragment 390a, associated with the first segment, and continuing with fragments belonging to subsequent segments. Server 399c sends a second sub-transmission to the destination assembling-device, optionally starting with fragment 390c, associated with the first segment, and continuing with fragments belonging to subsequent segments. In a similar fashion, servers 399(N−1) and 399(N) send additional sub-transmissions to the destination assembling-device, each comprising a unique fragment sequence.

When using a push transmission, the assembling device does not explicitly ask for each fragment, but instead instructs each of the different servers to start sending it a fragment sequence using a sub-transmission. The destination assembling-device receives the sub-transmissions sent by servers 399a, 399c, 399(N−1) and 399(N). It gathers 573 the first fragment from each sub-transmission to reconstruct the first segment 101a. In a similar fashion, additional fragments belonging to subsequent segments are obtained from the sub-transmissions, and used to reconstruct the segments. It is noted that any combination of sub-transmissions may be used, as long as a decodable set of fragments is obtained per each segment. It is also noted that FIG. 17 illustrates a non-limiting embodiment and a sub-transmission may include two or more unique erasure-coded fragments per segment.

In one embodiment, the push sub-transmissions is synchronous (all servers sending the fragments of each segment at approximately the same time). In another embodiment, the push sub-transmission is asynchronous and the arrival of different fragments associated with a specific segment at the assembling device side may be spread over a long period. This may occur, as an example, when some push servers are faster than others. In one embodiment using asynchronous sub-transmissions, the assembling device aggregates whatever fragments it can before presentation time of each segment, and then optionally supplements fragments using a pull retrieval process. A server that does not send fragments fast enough, and therefore usually causes supplemental requests, may be ordered to stop the sub-transmission. Another server may be requested, optionally by the assembling device, to replace the slow server by initiating a new sub-transmission.

In one embodiment, the push-transmissions carry more erasure-coded fragments than needed for segment reconstruction. In one embodiment, the push transmissions carry fewer erasure-coded fragments than needed for segment reconstruction, and the remaining fragments are pulled by the assembling device.

Figure 31:
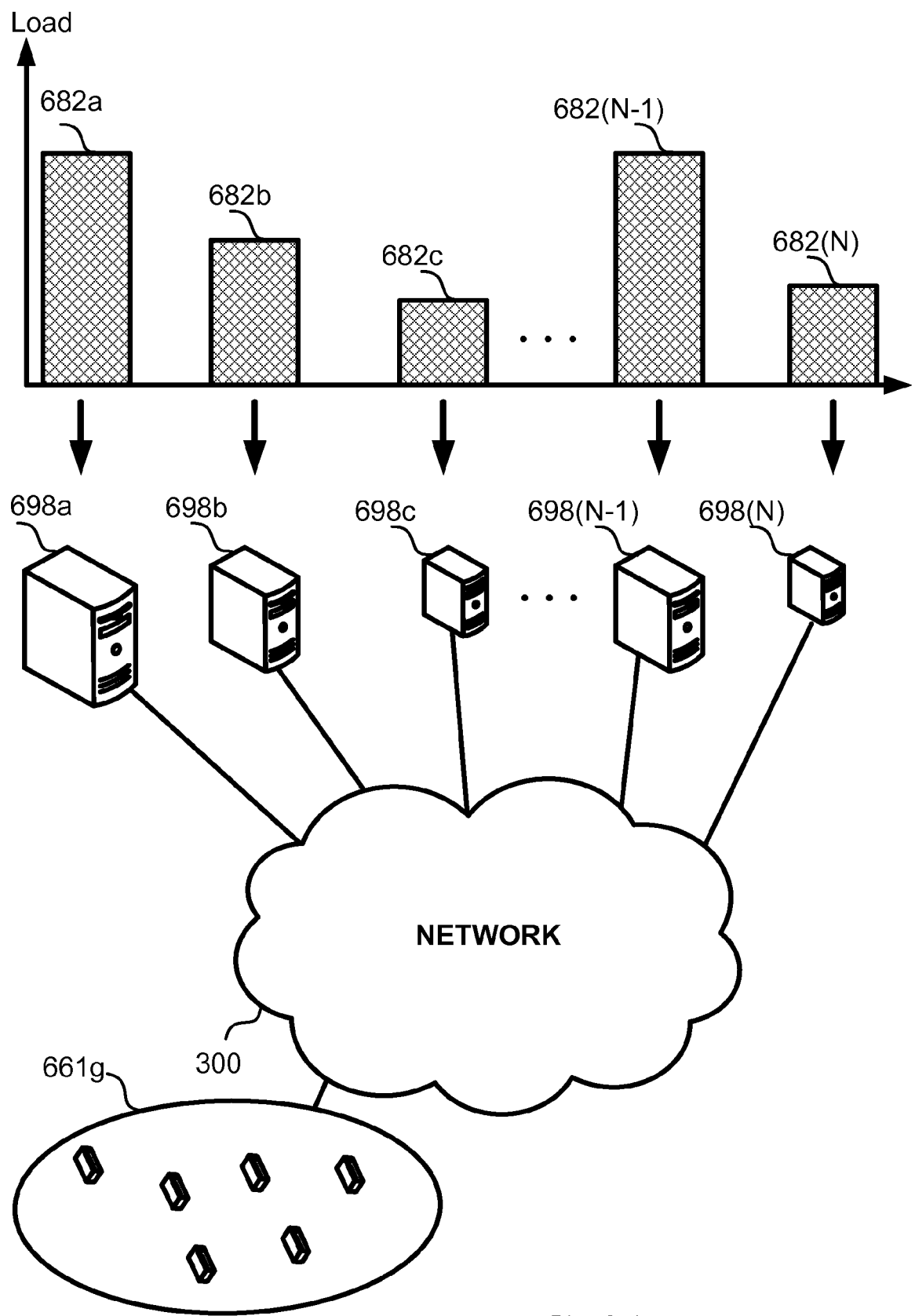
FIG. 31 and FIG. 32 illustrate a case where a fractional-storage server has failed.
Figure 32:
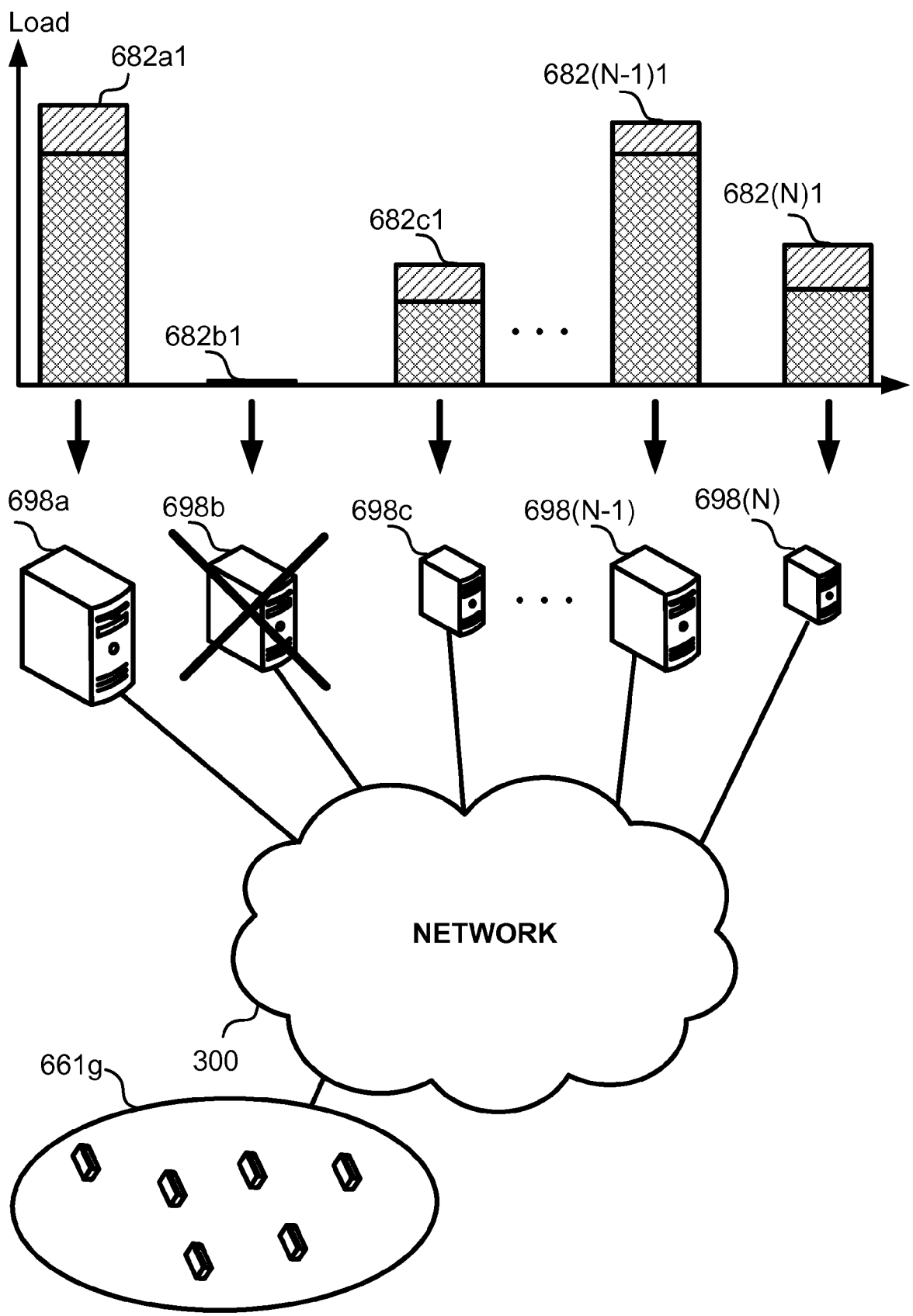

FIG. 31 illustrates one embodiment of a fractional-storage system. Assembling device group 661g obtain erasure-coded fragments from the servers, such that the resulting outgoing bandwidth utilizations of each server in the array is 682a to 682(N) correspondingly. FIG. 32 illustrates a case where server 698b has failed, its bandwidth capability 682b1 is zero, and is therefore unable to provide erasure-coded fragments. The assembling devices from group 661g, which previously obtained fragments from server 698b, may attempt to access it again for additional fragments, but are now unable to get a response. These assembling devices therefore obtain fragments from alternative servers. The end effect is that bandwidth 682b is now loaded on the still available servers, such that the total bandwidth 682a1 to 682(N)1 approximately increases by a total amount equal to 682b, optionally with no inter-server coordination, and simply by the fact that each assembling device selects alternative available servers for obtaining fragment on-the-fly. In one example, instead of obtaining from server 682b1, the assembling devices obtain from the least loaded available servers. In one embodiment, a control server selects the alternative server/s for the assembling devices. In one embodiment, the assembling devices use a fragment pull protocol to obtain the fragments, and approach the alternative servers. In one embodiment, the assembling devices use a push protocol to obtain the fragments, and approach alternative servers, possibly by obtaining multiple sub-transmissions comprising fragment sequences. In this case, the sub-transmissions of the faulty server are discontinued and compensated for by other sub-transmissions from the alternative servers.

Figure 33:
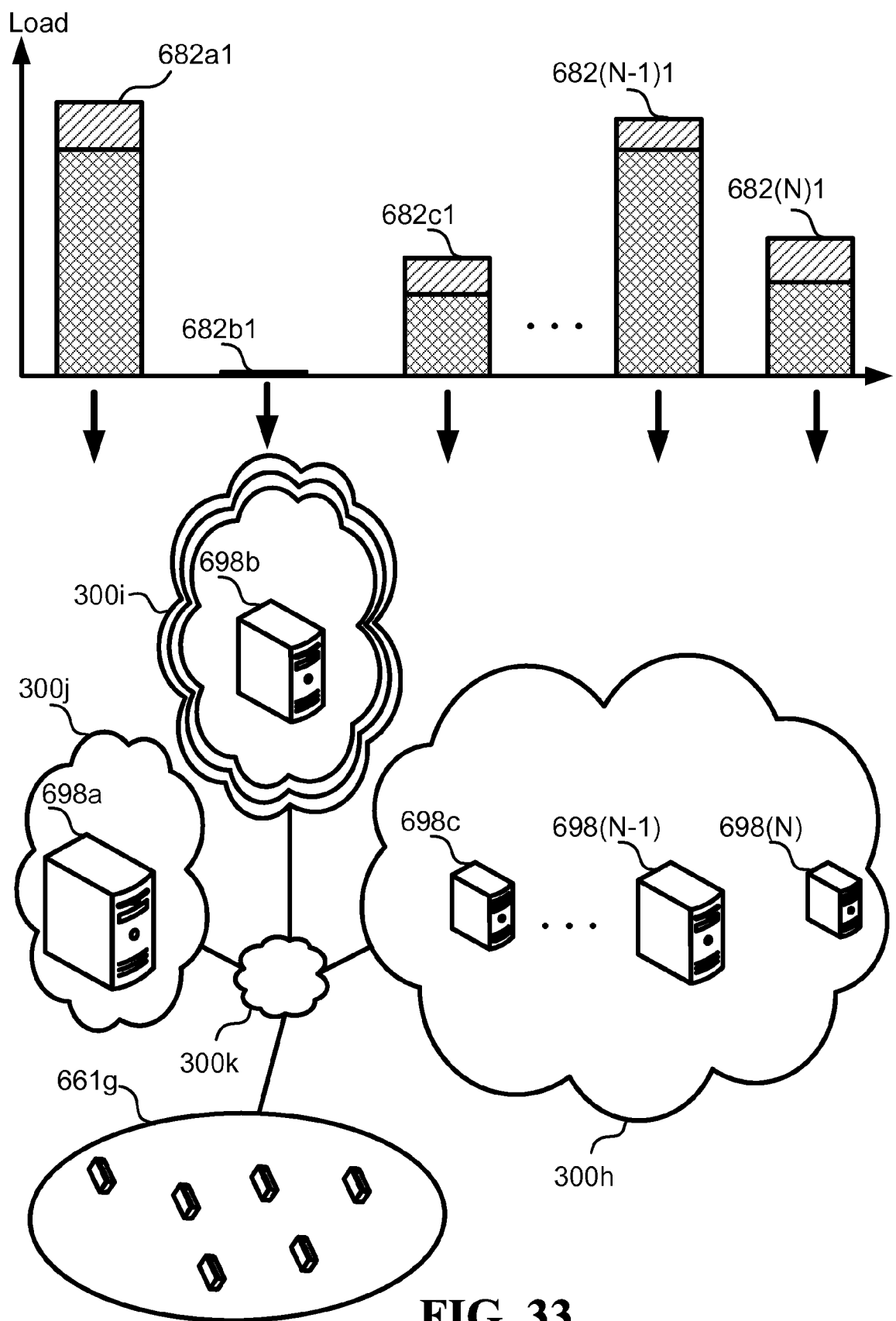
FIG. 33 illustrates a server failure due to network congestion.

FIG. 33 illustrates an example similar to FIG. 32 with the difference that servers 698a, 698b, and 698c to 698(N) reside within, or get serviced via, first, second, and third Internet backbone providers 300j, 300i, and 300h correspondingly. The group of assembling devices 661g is connected to the Internet via network 300k, which has access to all three backbones, such that communication between the assembling devices and servers 698a to 698(N) pass via at least one of the backbones, or more. If server 698b is made unavailable to the assembling devices, optionally not due to a server failure, but rather due to congestion or a failure of the second Internet backbone provider 300i, assembling devices 661g compensate for the lost bandwidth by switching to the available servers on-the-fly. In one embodiment, networks 300h, 300i, and 300j, are different physical sub-nets of one network connected to the Internet. In one embodiment, the assembling devices are connected to networks 300h, 300i, and 300j, via network 300k, and then via one or more Internet Exchange Points ("IX/IXP").

Figure 34:
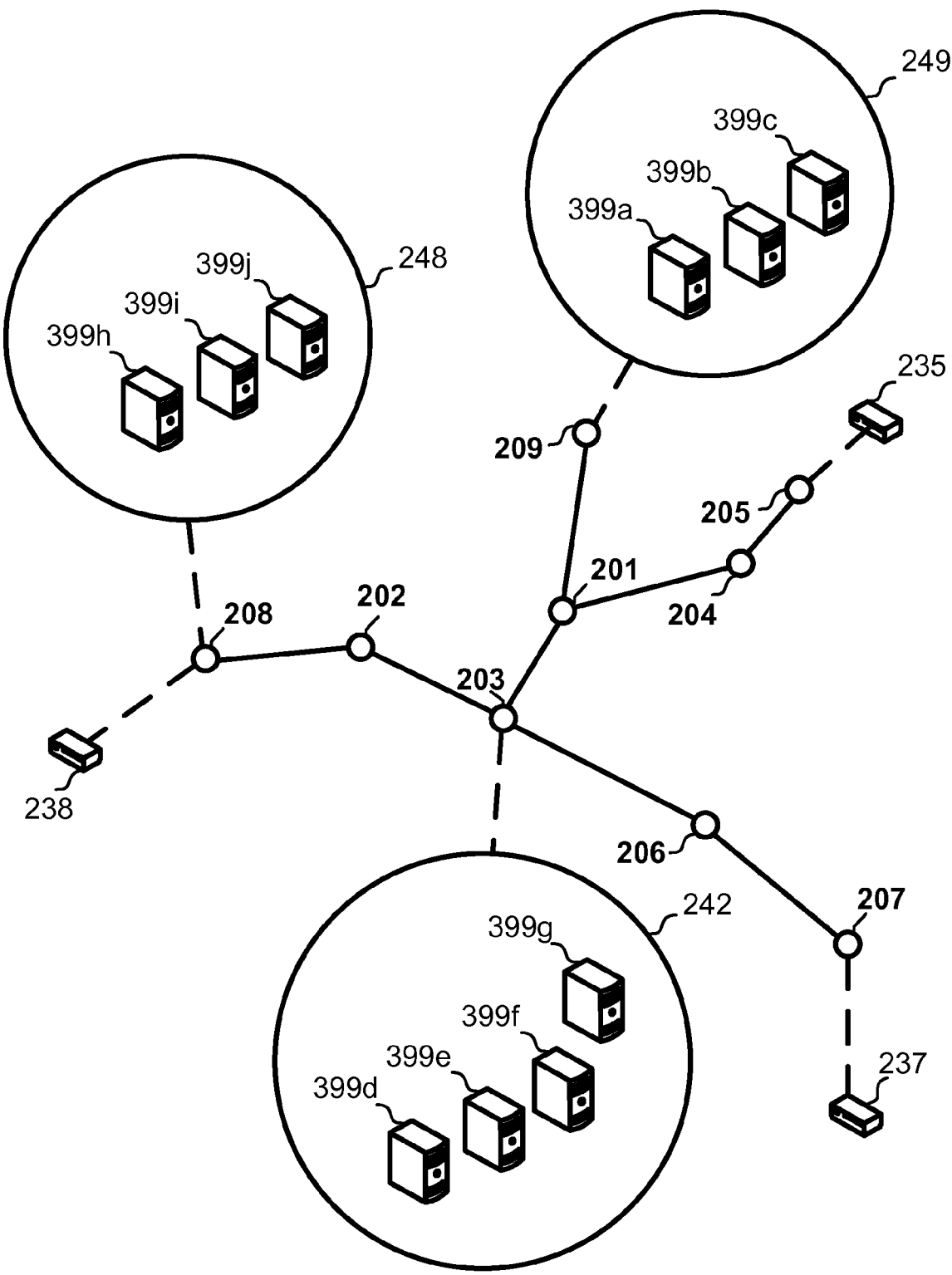
FIG. 34 illustrates retrieving fragments according to locality.

FIG. 34 illustrates a few examples of retrieving fragments according to locality. In one example, the fractional-storage servers are connected to a data network or networks comprising the routers 201 to 209. Assembling devices 235, 237, and 238 are connected to the same data network or networks, and K=3, meaning that any assembling device needs to obtain 3 erasure-coded fragments per segment from optionally 3 different servers out of the 10 in order to successfully reconstruct the segment.

Each assembling device tries to obtain erasure-coded fragments from fractional-storage servers that are closest to it topologically. In one embodiment, the topological distance is a function of the number of separating routers. Assembling device 238 can select three servers from groups 242, 248 or 249. According to the minimal path criterion, it retrieves the erasure-coded fragments from servers 399h to 399i of group 248, since they are only one router 208 away. Groups 242 and 249 are three (208, 202, 203) and five (208, 202, 203, 201, 209) routers away, and are therefore not selected for retrieval. Similarly, device 237 selects three servers out of group 242, and device 235 can select any three servers from groups 242 and 249, since both are located four routers away.

In one embodiment, if topologically close servers do not respond to the assembling device, or report a bandwidth limitation, the assembling device will attempt to obtain an erasure-coded fragment from the next topologically closest server.

In one embodiment, an assembling device attempts to obtain erasure-coded fragments from servers featuring the lowest latency. Upon no response, for whatever reason, the assembling device will attempt to retrieve from the next lowest latency server. In one embodiment, the assembling device obtains information regarding the unutilized fragment delivery bandwidths of servers, and then attempts to retrieve from the lowest latency servers out of the servers having enough unutilized bandwidth. In one embodiment, the assembling device obtains information regarding the unutilized fragment delivery bandwidths of the servers, and then attempts to retrieve from the topologically closest servers out of the servers having enough unutilized bandwidth.

Still referring to FIG. 34, in one embodiment the assembling devices select servers according to a latency criterion, such as selecting servers with the shortest time between fragment request and fragment delivery, or selecting servers having latency below a dynamic or static threshold. Assembling device 237 assembles content from servers 399c, 399f, 399g, and assembling device 235 assembles content from servers 399b, 399c, 399g (both use a mixture of servers from groups 242 and 249). At a certain point in time, router 209 becomes congested or blocked, and prevents the erasure-coded fragments from servers 399b and 399c from arriving at assembling devices 235 and 237, or causes the fragments to arrive with an increased delay. Therefore, assembling device 235 switches to three servers of group 242, and assembling device 237 switches from server 399c to server 399e.

In one embodiment, the assembling device selects fractional-storage servers according to the following criterion: first, servers with adequate unutilized fragment delivery bandwidth are considered, then out of these, those with latency below a threshold are considered, and out of these, the servers with minimal topological routing path are selected.

In some embodiments, the assembling devices use a fragment pull protocol to retrieve the fragments, and approach servers having low latency or low hop count as compared to other servers. In some embodiments, the assembling devices use a push protocol to retrieve the fragments, and approach servers having low latency or low hop count as compared to other servers, optionally by obtaining multiple sub-transmissions comprising fragment sequences.

In one embodiment, a plurality of unsynchronized retrieving assembling devices, which optionally use fragment pull protocol, choose the least loaded servers from which to retrieve the erasure-coded fragments. Optionally, the servers have almost no inter-communication between them and the load balancing calculation is performed by the retrieving assembling devices. Because the assembling devices can select the least loaded servers, the assembling devices manage the load balancing. When the erasure-coded fragments stored by the servers are unique erasure-coded fragments, the retrieving assembling device may retrieve erasure-coded fragments from any relevant server. Therefore, it may be enough for the retrieving assembling device to have indication of the load on its targeted servers, and retrieve enough erasure-coded fragments from the least loaded servers.

In one embodiment, a server signals the retrieving assembling device that it is close to its bandwidth limit and the assembling device searches for an alternative server. Optionally, the assembling device selects the server according to one or more of the following parameters: locality, cost, latency, or reliability. In one embodiment, the servers register their loads on a central server, and the assembling device selects the server to retrieve from, from the registered servers. In one embodiment, a central server, holding the loads of the various servers, determines for the assembling devices from which server to retrieve the erasure-coded fragments.

In one embodiment, assembling devices measure the latency of the different servers in responding to fragment requests, and then use the latency information to estimate the loads on the servers. In one example, a high latency may indicate a high load on the server.

In one embodiment, the topological router hop count between an assembling device and fragment delivering servers is used to estimate the latency of the servers in responding to fragment requests.

In one embodiment, the latency of fragment delivering servers in responding to fragment requests by an assembling device is used to estimate the topological router hop count between an assembling device and the servers.

In one embodiment, the assembling devices perform several latency measurements for the different servers in responding to fragment requests, and then use the latency variance information to estimate the loads on the servers. In one example, a high latency variance may suggest a high load on server.

In one embodiment, fractional-storage servers, from which the fragments are obtained for reconstructing a segment, are selected based on an approximately random selection algorithm from all of the servers storing the relevant fragments. In one example, an approximately random selection algorithm weighted according to the unutilized bandwidth of the servers is used for the approximately random selection of servers. The weighted random selection algorithm assigns servers with selection probabilities proportional to the amount of unutilized bandwidth for fragment delivery in each of the servers, such that the probability to select a server having a larger amount of unutilized bandwidth is higher than the probability to select a server having a lower amount of unutilized bandwidth.

The following embodiments describe processes for on-the-fly selection and re-selection of fractional-storage servers from which to obtain erasure-coded fragments.

In one embodiment, a method for selecting enough new servers from which to obtain fragments, based on the unutilized bandwidth of the servers, includes the following steps: (i) accessing data regarding servers storing relevant fragments (referred to as the relevant servers); (ii) accessing data regarding the unutilized bandwidth of the relevant servers. Optionally, the data is received by the assembling device from the relevant servers; and (iii) obtaining fragments from enough of the relevant servers having approximately the highest unutilized bandwidth; or obtaining fragments from enough of the relevant servers selected randomly and having unutilized bandwidth above a certain threshold.

In one embodiment, a method for selecting enough new servers from which to obtain fragments, based on latency, includes the following steps: (i) accessing data regarding the relevant servers; (ii) accessing data regarding the latencies from the relevant servers to the assembling device; and (iii) obtaining fragments from enough of the relevant servers having the lowest latencies; or obtaining fragments from enough of the relevant servers selected randomly and having latencies below a certain threshold.

In one embodiment, a method for selecting enough new servers from which to obtain fragments, based on bandwidth and latency, includes the following steps: (i) accessing data regarding the relevant servers; (ii) accessing data regarding the unutilized bandwidth of the relevant servers; (iii) identifying more than enough relevant servers having the most unutilized bandwidth; or randomly identifying more than enough relevant servers having unutilized bandwidth above a certain threshold; (iv) accessing data regarding the latencies from the identified servers to the assembling device; and (v) obtaining fragments from enough of the identified servers having the lowest latencies; or obtaining fragments from enough of the relevant servers selected randomly and having latencies below a certain threshold.

In one embodiment, a method for selecting enough new servers from which to obtain fragments, based on latency and bandwidth, includes the following steps: (i) accessing data regarding the relevant servers; (ii) identifying more than enough relevant servers having latencies to the assembling device below a certain threshold; or randomly identifying more than enough relevant servers having latencies to the assembling device below a certain threshold; (iii) accessing data regarding the unutilized bandwidth of the identified servers; and (iv) obtaining fragments from enough of the identified servers having the highest unutilized bandwidth; or obtaining fragments from enough of the relevant servers selected randomly and having the highest unutilized bandwidth.

In one embodiment, a method for selecting enough new servers from which to obtain fragments, based on locality, includes the following steps: (i) accessing data regarding the relevant servers; (ii) accessing data regarding the network topology distance (locality) from the relevant servers to the assembling device; and (iii) obtaining fragments from enough of the topologically closest relevant servers; or obtaining fragments from enough of the relevant servers that are located in the same sub-network as the assembling device, or located in the closest sub-networks.

In one embodiment, a method for selecting enough new servers from which to obtain fragments, based on bandwidth and locality, includes the following steps: (i) accessing data regarding the relevant servers; (ii) accessing data regarding the unutilized bandwidth of the relevant servers; (iii) identifying more than enough relevant servers having the most unutilized bandwidth; or randomly identifying more than enough relevant servers having unutilized bandwidth above a certain threshold; (iv) accessing data regarding the network topology distance from the relevant servers to the assembling device; and (v) obtaining fragments from enough of the topologically closest relevant servers; or obtaining fragments from enough of the relevant servers that are located in the same sub-network as the assembling device, or located in the closest sub-networks.

In one embodiment, a method for selecting enough new servers from which to obtain fragments, based on latency and locality, includes the following steps: (i) accessing data regarding the relevant servers; (ii) identifying more than enough relevant servers having latencies to the assembling device below a certain threshold; or randomly identifying more than enough relevant servers having latencies to the assembling device below a certain threshold; (iii) accessing data regarding the network topology distance from the relevant servers to the assembling device; and (iv) obtaining fragments from enough of the topologically closest relevant servers; or obtaining fragments from enough of the relevant servers that are located in the same sub-network as the assembling device, or located in the closest sub-networks.

In one embodiment, a method for selecting enough new servers from which to obtain fragments is based on bandwidth, latency, locality, and, optionally, one or more additional relevant parameters. The method may weigh the different parameters in various ways, all of them are intended to be covered by the embodiments. For example, the method may include the following steps: (i) accessing data regarding the relevant servers; (ii) receiving data regarding the unutilized bandwidth latencies to the assembling device, and topology distances to the assembling device; (iii) weighting the received data and identifying a quantity of the most proper relevant servers, which can provide enough fragments to reconstruct content; and (iv) obtaining the fragments from the identified servers. In another example, the method may include the following steps: (i) accessing data regarding the relevant servers; (ii) identifying a set of more than enough relevant servers having the most unutilized bandwidth; or randomly identifying a set of more than enough relevant servers having unutilized bandwidth above a certain threshold; (iii) from the set, identifying a sub-set of more than enough relevant servers having latencies to the assembling device below a certain threshold; or randomly identifying more than enough relevant servers having latencies to the assembling device below a certain threshold; and (iv) obtaining fragments from enough of the topologically closest relevant servers out of the sub-set; or obtaining fragments from enough of the relevant servers out of the sub-sets, which are located in the same sub-network as the assembling device, or located in the closest sub-networks.

In some embodiments, approximately random selection of fractional-storage servers is utilized for dealing with changes in network conditions, such as packets loss and/or server failure, without affecting the user experience, and optionally without prior knowledge of the type of the change in network condition. Optionally, new erasure-coded fragments are requested from the randomly selected servers instead of failed requests. Optionally, failed servers are replaced with other servers. Optionally, the combination and/or the number of fractional-storage servers from which the fragments are obtained changes over time. Optionally, the number of redundant fragment requests changes over time.

Referring again to FIG. 7 with device 6610 as a non-assembling CPE, such as a STB, PC or gaming console, capable of performing standard request, reception, and decoding of video over IP network. In one embodiment, server 661s—also referred to as proxy server, assembling server, and in some cases assembling device—performs three primary functions: (i) receipt of content requests from non-assembling client device 661o; (ii) assembly of content, as requested by client 661o, from the fractional-storage servers and optionally from the bandwidth amplification devices; (iii) optionally, conversion of the assembled content into a streaming format; and (iv) transmission of the streaming content to the requesting client 661o. Client 661o can then store the content, or present it. In one embodiment, the assembled content is a general web content, including HTML, FLASH or any other data format that can be found in a web-based site.

In one embodiment, although server 661s is illustrated as being connected to network 300 on one side and to network 300n on the other, server 661s may also be connected to another network element, such as a router, which makes the topological connection between networks 300 and 300n. In that case, server 661s communicates with both networks 300 and 300n via the other network element.

In one embodiment, a CDN is created by the aggregated bandwidth and storage capacity of the participating erasure-coded fractional-storage servers. In one example, a large scale CDN includes several hundreds or thousands of fractional-storage servers connected to the Internet. These servers send erasure-coded fragments to a large number, potentially millions, of assembling devices. In order to keep costs low for sending a large number of fragments from fractional-storage servers to assembling devices, the servers are located on the Internet backbone, or close to it.

Figure 35:
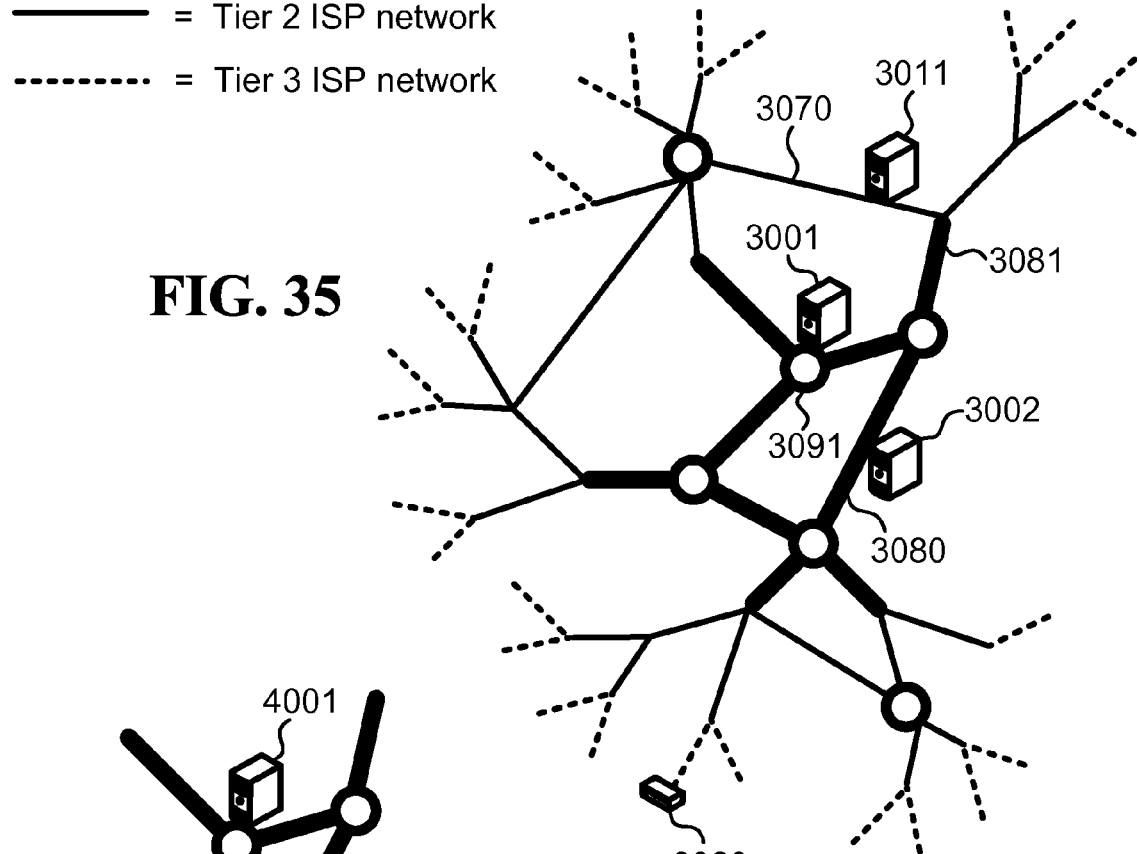
FIG. 35 illustrates fractional-storage servers located on the Internet backbone.

The current Internet backbone primarily comprises different Tier one ISP (or other) networks that interconnect at various Internet Exchange Points (IX or IXP), using peering agreements. Tier one ISPs, or other backbone-forming network entities, can reach any portion of the Internet via other Tier one ISPs or other backbone-forming networks, without paying any Internet transit fee, and solely by utilizing mutual peering agreements. In order to gain access to large amounts of inexpensive bandwidth, the fractional-storage servers are typically located on the Internet backbone. This means that the servers are either co-located (and connected) with a core switching router that interconnects the Internet backbone networks at an IXP, or, alternatively, co-located (and connected) with a router which is part of the backbone network, typically located at a data center or co-location center. Fractional-storage servers can also be located close to the Internet backbone, which means that they are co-located (and connected) with a router which is part of a Tier two ISP network, which has a high bandwidth connection with at least one Tier one operator, to which it pays transit fees in order to potentially reach all portions of the Internet. FIG. 35 illustrates one example of a fractional-storage server 3001, which is one of a plurality of servers forming a large-scale CDN, located on the Internet backbone by being connected to the Internet backbone via IXP 3091. In a second example, fractional-storage server 3002 is located on the Internet backbone by being connected to a Tier one backbone network 3080. In a third example, fractional-storage server 3011 is located close to the Internet backbone by being connected to a Tier two ISP network 3070, which is connected to the backbone via Tier one ISP network 3081. In one embodiment, a typical fractional-storage server is located on the backbone or close to the backbone by being attached to a switching router via a high bandwidth port, such as a 1 Gbps, 10 Gbps, or a higher bandwidth port, such as high-speed Ethernet port, usually carried over a fiber, or suitable short-distance copper lines. In one embodiment, in a typical deployment using high bandwidth connections (in 2009 terms), each of about 1,000 fractional-storage servers is located on the backbone or close to the backbone and is connected to the backbone via a dedicated (guaranteed bandwidth) 1 Gbps Ethernet port, resulting in an aggregated throughput of 1,000 Gbps, which can serve about one million subscribers of standard definition streaming video, such as client device 3020, simultaneously. Such aggregated bandwidths would have required a substantially larger number of fractional-storage servers, had they been connected to other locations in the Internet, such as at edges of the Internet (close to last mile networks), Tier 3 ISPs, or at the user premises. Moreover, in some embodiments, the cost of streaming the mentioned 1,000 Gbps when the fractional-storage servers are located on the Internet backbone, or close to the Internet backbone, is expected to be significantly lower than what is expected when the servers are located elsewhere as mentioned before.

Figure 36:
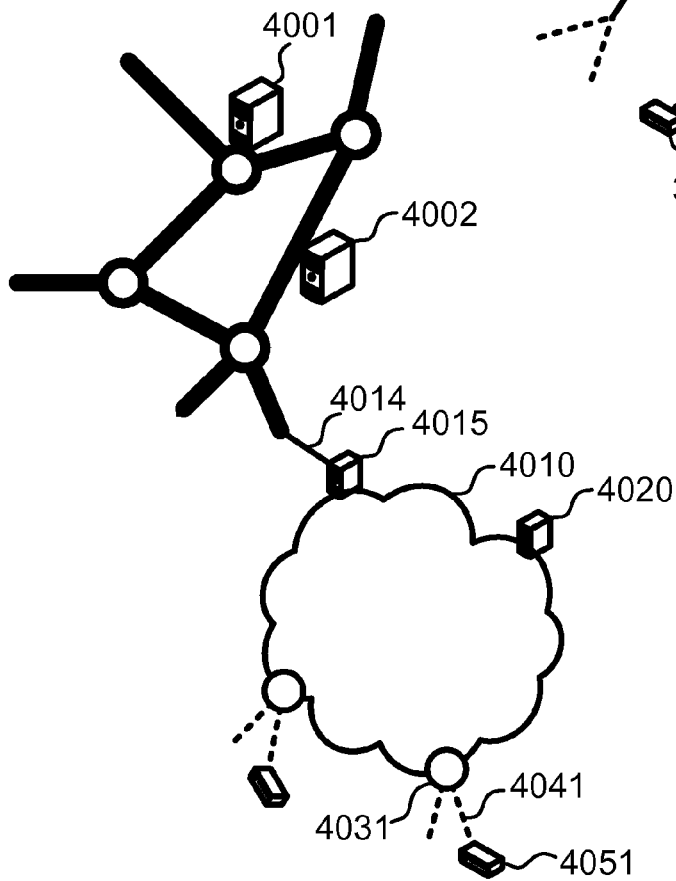
FIG. 36 illustrates an assembling server located at a network juncture.

FIG. 36 illustrates one example where an assembling server 4020 is located at the juncture 4010 between two networks: the first network is an ISP transit network 4014 that connects the juncture to the Internet and provides Internet transit via a switching router 4015, and the second is a last mile network 4041 that connects end users 4051 to the Internet via a switch 4031 (located, for example, inside a Central Office, a Head-End, or a street-level cabinet). In one embodiment, the juncture 4010 is a network operated by a local ISP that pays transit fees for Internet traffic passing through the transit network 4014, and last mile fees for traffic passing through the last mile network 4041. A unique property of the juncture 4010 is that it is possible for an assembling server 4020 located at the juncture to receive erasure-coded fragments sent by fractional-storage servers, such as 4001 and 4002, to assemble content, and to stream the content to a client 4051 via the last mile network 4041, without incurring any additional costs in comparison to other scenarios, such as where Internet packets flow from the Internet backbone to a Tier two ISP network to the Internet backbone and to the last mile network. In other words, since the assembling server 4020 is located at the juncture, it does not create any extra traffic via networks 4014 and 4041. The assembling server can also be located at or close to an edge of the Internet, which may include the juncture, or a point above server 4015, such as at the transit network 4014 connecting the juncture to the Internet. When located at or close to an edge of the Internet, the assembling server has the potential not to incur additional transit fees as a result of the relaying operation, since approximately the same traffic would have to pass via the same transit network in a normal scenario. Another beneficial location for the assembling server is at the home premises, since, clearly, a relaying operation performed there does not add any significant traffic to higher levels of the network. In contrast to the above-suggested locations, in some cases an assembling server may be located at an arbitrary point on the backbone, or at other high-level points of the Internet, where it incurs additional transit fees, as fragments assembled by the server flow once over an Internet transit network going from a fractional-storage server to the assembling server, and then a second time when streamed by the assembling server to a destination client over an Internet transit network.

In one embodiment, the fractional-storage system is approximately insensitive to the mixture of the consumed contents as long as the aggregated throughput is below the total throughput of the fractional-storage servers.

Figure 37:
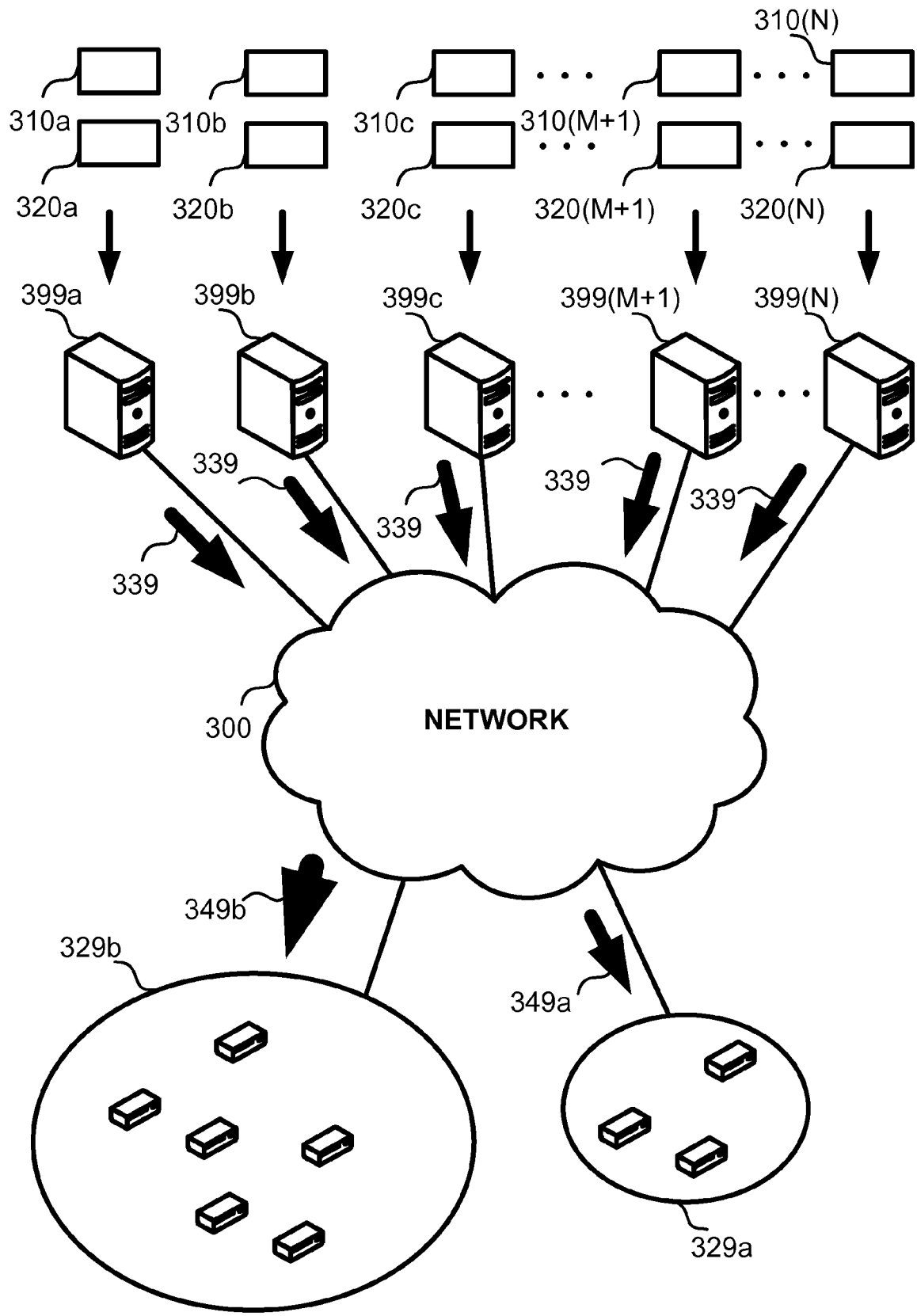
FIG. 37 to FIG. 39 illustrate changes in content consumption.

FIG. 37 illustrates one example of a server array, including N fractional-storage servers (399a to 399(N)), and storing content A, which includes erasure-coded fragments 310a to 310(N), and content B, which includes erasure-coded fragments 320a to 320(N). Each server is connected to the network 300 with a fragment delivery bandwidth capability B 339. Therefore, the N servers have an aggregated bandwidth of B×N. A first group of assembling devices 329a consumes content A at an average bandwidth Ba 349a. A second group of assembling devices 329b consumes content B at an average bandwidth Bb 349b. Since all of the servers participate in the transmission of the two contents, the first and second groups can potentially consume all server bandwidth, up to the limit where Ba+Bb=N×B, with any ratio of demand between the first and second contents, and with no special provisions to be made when storing the erasure-coded fragments related to the two contents in the fractional-storage server array.

Figure 38:
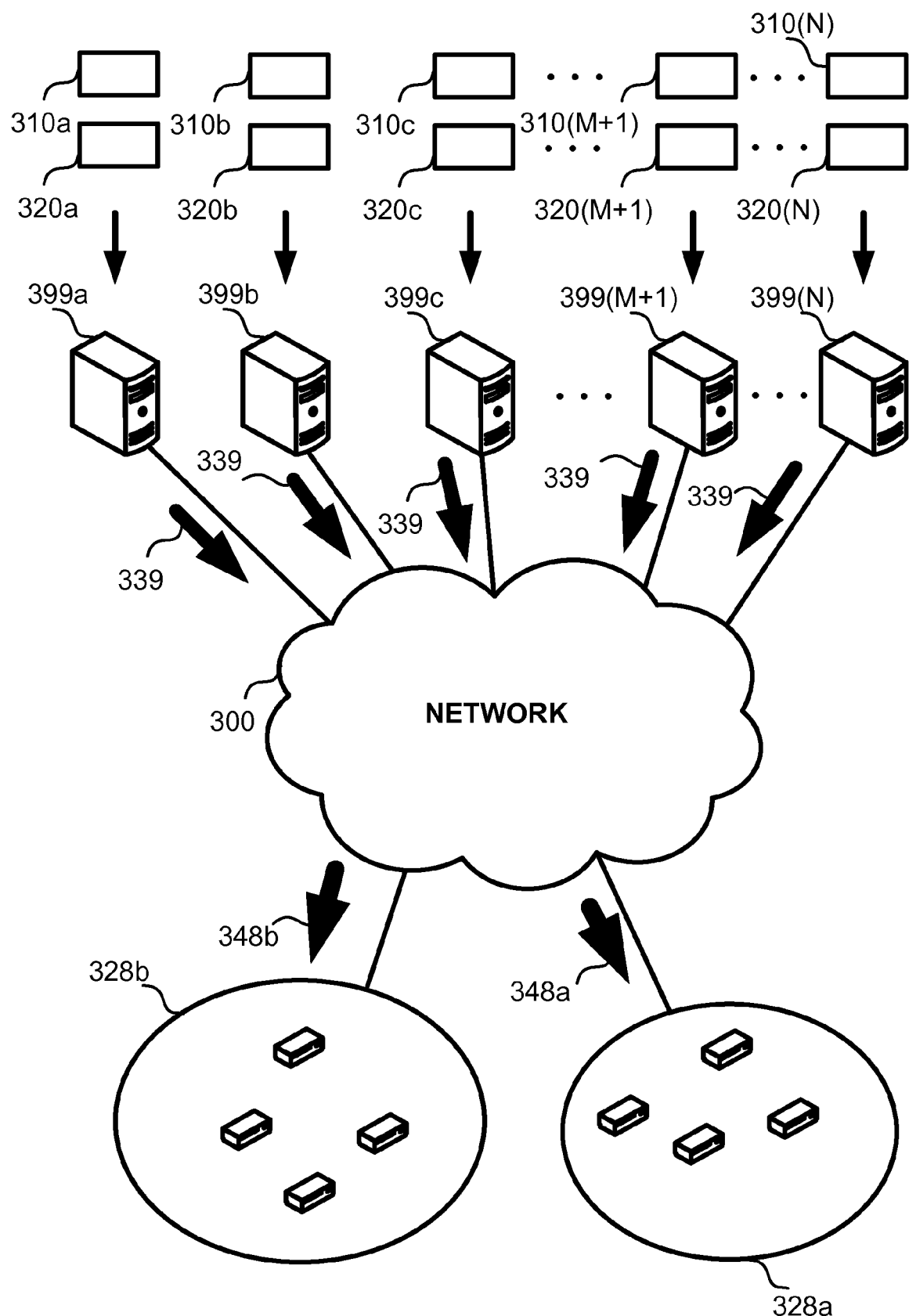
Figure 39:
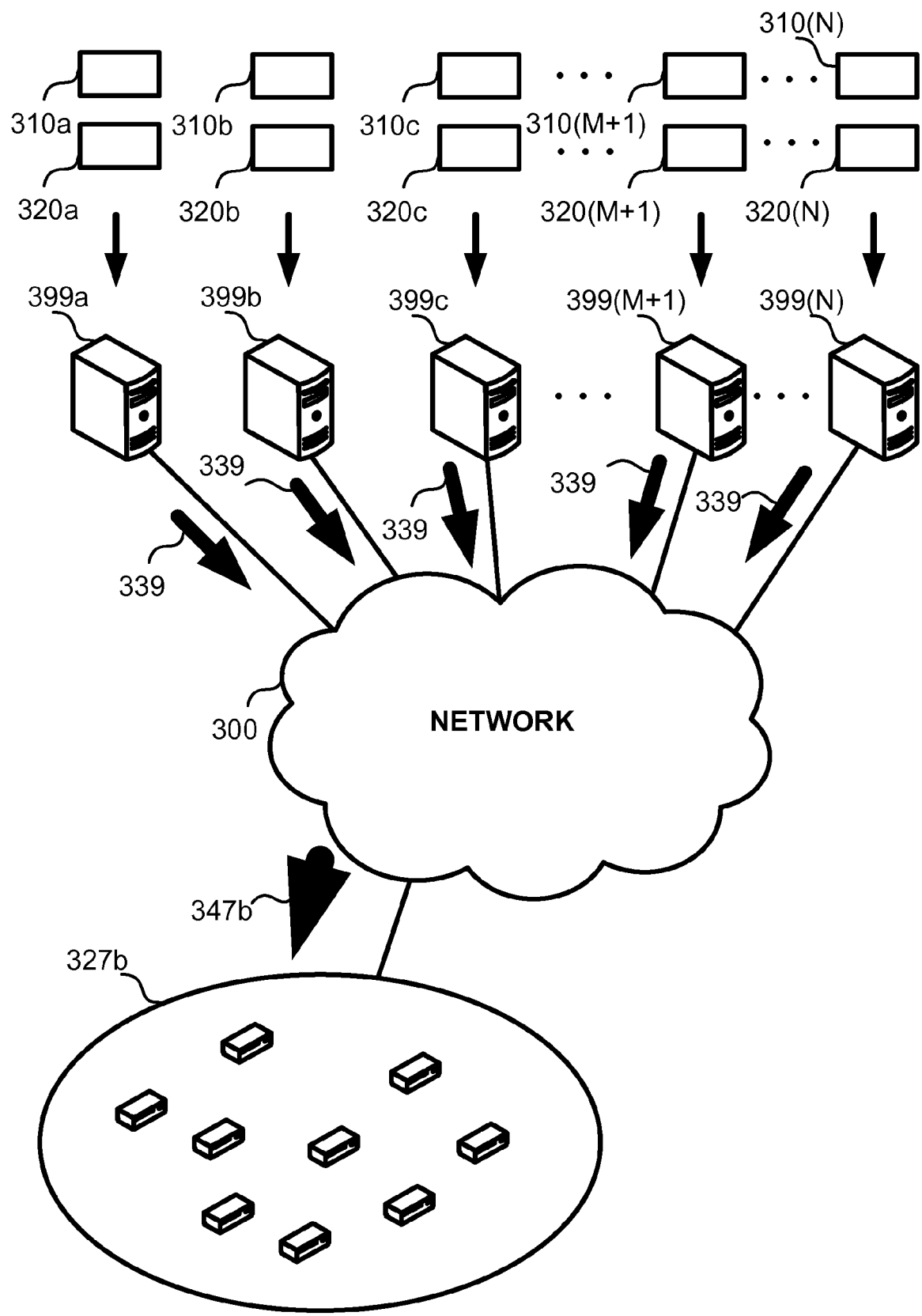

FIG. 38 illustrates the case where the first group 328a, which consumes content A, becomes larger than 329a, with a larger bandwidth Ba 348a. The second group 328b, which consumes content B, becomes smaller than 329b, with a smaller bandwidth Bb 348b, such that Ba is about the same as Bb. In this case, the array can still be exploited up to the aggregated bandwidth, since, as before, Ba+Bb can still be almost as high as N×B. FIG. 39 illustrates the case where the first group has disappeared, allowing the second group 327b, which consumes content B, to extract an aggregated bandwidth of Bb 347b that can potentially reach the limits of the server array, such that Bb=N×B. Again, this is achieved without updating the erasure-coded fragments associated with content A and content B, and without using inter-server interaction.

In some embodiments, the ability to utilize the aggregated bandwidth of approximately all of the participating servers, for the delivery of about any mixture of contents with about any mixture of content bandwidth demand, is made possible by one or more of the following: (i) each assembling device selecting a subgroup of the least loaded fractional-storage servers from which to retrieve the necessary number of erasure-coded fragments to reconstruct a segment or several segments (least-loaded server selection criterion); or (ii) each assembling device approximately randomly selecting a subgroup from which to reconstruct a segment or several segments, such that when many assembling devices select at random, the various fractional-storage servers are selected approximately the same number of times (or in proportion to their available resources, such as unutilized bandwidth), which in turn balances the load between the participating servers (random server selection criterion). It is noted that (i) the selections may be made by either the assembling devices themselves, or may be made for the assembling devices by a control server, which then communicates the selections to each of the assembling devices; (ii) the selections may be made approximately for each segment, or for a group of segments, or only once per content at the beginning of the content; (iii) some assembling devices may use an approximately random server selection criterion, while other assembling devices may use least-loaded server selection criterion; (iv) the least-loaded selected servers may be selected out of a portion of all available fractional-storage servers. For example, the least-loaded servers may be selected from fractional-storage servers with low latency response or with low hop count to the assembling device; (v) the least-loaded servers may include servers having the most unutilized bandwidth. Additionally or alternatively, it may include servers having any unutilized bandwidth left to serve additional assembling devices; (vi) an approximately random or least-loaded selection of servers may be made such that all servers are selected to determine a subgroup, or it can be made such that every time selections are made, only some servers are selected, while the others remain as before. In these cases, the assembling device runs a process in which only a small portion of the servers currently in the serving subgroup are reselected. In the case of approximately random selection, the assembling device may randomly select the number of servers in the serving subgroup for random selection (reselection in this case, since they are replacing other servers already in the serving subgroup of the specific assembling device), such that eventually, over time, all servers within the serving subgroup have the chance to be randomly reselected. In the case of least-loaded server selection, only the most loaded servers within the serving subgroup may be selected and replaced by less-loaded servers.

By using a pull protocol or a push protocol with multiple sub-transmissions, the assembling device can obtain erasure-coded fragments from one, two or more different arrays of CDN servers and/or bandwidth amplification devices seamlessly.

In one embodiment, when a CDN server receives a request for an erasure-coded fragment, it may supply the erasure-coded fragment or supply an address of a bandwidth amplification device having an image of the requested erasure-coded fragment. Optionally, a bandwidth amplification device storing one erasure-coded fragment of a specific content also stores an image of some or all other erasure-coded fragments associated with the specific content (which are stored on the specific CDN server). Alternatively, the bandwidth amplification device stores unique erasure-coded fragments generated from the same segments used for generating the erasure-coded fragments stored on the specific CDN server. In these cases, the assembling device may approach the bandwidth amplification devices instead of the CDN server for the relevant erasure-coded fragments of the specific content until (i) the end of the content; (ii) a predefined time period elapses; (iii) receiving an appropriate message; or (iv) a combination of the aforementioned.

In one embodiment, an assembling device tries to obtain an erasure-coded fragment or sub-transmission from the relevant server, and if the server does not have the necessary bandwidth to respond with fragment/s, the server relays the fragment request/s to relevant bandwidth amplification devices. The relevant bandwidth amplification devices can then send the fragment/s directly to the assembling device.

In one embodiment, unique erasure-coded fragments can be distributed between two types of devices: (i) high bandwidth fractional-storage servers, such as CDN servers, and (ii) relatively low bandwidth and storage devices acting as bandwidth amplification devices, such as peer-to-peer (P2P) devices. Since the fragments distributed between the two types of devices are unique, any combination of devices, from both types, can be used to obtain a decodable set of fragments, if the combination of devices stores a decodable set of fragments. In one embodiment, there are at least ten times more bandwidth amplification devices than high bandwidth servers, and the redundancy factor used in decoding the fragments is greater than 10. In this case, the servers can be used all or most of the time, and the bandwidth amplification devices can be used from time to time, according to bandwidth requirements, and according to the availability of the bandwidth amplification devices. In one embodiment, the processes of obtaining a fragment from a server and from a bandwidth amplification device are essentially the same, and the fragments are essentially identical in construction and format. In one embodiment, the high redundancy factor needed to support a large hybrid array of servers and bandwidth amplification devices is achieved using rateless coding techniques.

In the claims, a sentence such as "erasure-coded fragments encoded with a redundancy factor $R>1$ and associated with segments of streaming contents" is to be interpreted as erasure-coded fragments encoded with one redundancy factor or with a plurality of redundancy factors greater than one. For example, some fragments associated with a first set of segments of content may have a redundancy factor of two, and some fragments associated with a second set of segments of the same content may have a redundancy factor of three.

In the claims, a sentence such as "the erasure-coded fragments support source-selection diversity" is to be interpreted as fragments encoded using any kind of erasure-code that can produce N unique fragments, from which C combinations of decodable sets of fragments can be selected, wherein C is much greater than N. Standard parity checks, standard checksums, and standard cyclic redundancy checks (CRC) are examples of codes that do not support source-selection diversity.

In this description, numerous specific details are set forth. However, the embodiments of the invention may be practiced without some of these specific details. In other instances, well-known hardware, software, materials, structures and techniques have not been shown in detail in order not to obscure the understanding of this description. In this description, references to "one embodiment" mean that the feature being referred to may be included in at least one embodiment of the invention. Moreover, separate references to "one embodiment" or "some embodiments" in this description do not necessarily refer to the same embodiment. Illustrated embodiments are not mutually exclusive, unless so stated and except as will be readily apparent to those of ordinary skill in the art. Thus, the invention may include any variety of combinations and/or integrations of the features of the embodiments described herein.

Although some embodiments may depict serial operations, the embodiments may perform certain operations in parallel and/or in different orders from those depicted. Moreover, the use of repeated reference numerals and/or letters in the text and/or drawings is for the purpose of simplicity and clarity and does not in itself dictate a relationship between the various embodiments and/or configurations discussed. The embodiments are not limited in their applications to the details of the order or sequence of steps of operation of methods, or to details of implementation of devices, set in the description, drawings, or examples. Moreover, individual blocks illustrated in the figures may be functional in nature and do not necessarily correspond to discrete hardware elements. While the methods disclosed herein have been described and shown with reference to particular steps performed in a particular order, it is understood that these steps may be combined, sub-divided, or reordered to form an equivalent method without departing from the teachings of the embodiments. Accordingly, unless specifically indicated herein, the order and grouping of the steps is not a limitation of the embodiments. Furthermore, methods and mechanisms of the embodiments will sometimes be described in singular form for clarity. However, some embodiments may include multiple iterations of a method or multiple instantiations of a mechanism unless noted otherwise. For example, when a controller or an interface are disclosed in an embodiment, the scope of the embodiment is intended to also cover the use of multiple controllers or interfaces.

Certain features of the embodiments, which may have been, for clarity, described in the context of separate embodiments, may also be provided in various combinations in a single embodiment. Conversely, various features of the embodiments, which may have been, for brevity, described in the context of a single embodiment, may also be provided separately or in any suitable sub-combination.

Embodiments described in conjunction with specific examples are presented by way of example, and not limitation. Moreover, it is evident that many alternatives, modifications and variations will be apparent to those skilled in the art. It is to be understood that other embodiments may be utilized and structural changes may be made without departing from the scope of the embodiments. Accordingly, it is intended to embrace all such alternatives, modifications and variations that fall within the spirit and scope of the appended claims and their equivalents.

What is claimed is:

1. A method comprising: receiving, by an assembling device, a first set of erasure-coded fragments associated with segments via a transmission using push protocol, whereby the first set is not sufficient for reconstructing some of the segments; wherein erasure-coding denotes a process in which a sequence of erasure-coded fragments are generated from a segment such that the segment can be reconstructed from essentially any subset of the erasure-coded fragments of minimum size not smaller than the size of the segment; and
    pulling on-the-fly, by the assembling device, a second set of erasure-coded fragments usable to decode the segments, each fragment pull request associated with a specific segment; wherein the first and the second sets together are sufficient for reconstructing the segments, wherein the received erasure-coded fragments and the additional pulled erasure-coded fragments are of essentially the same erasure-coding and therefore the received erasure-coded fragments and the additional pulled erasure-coded fragments can be decoded together.

2. The method of claim 1, wherein the transmission is a broadcast transmission.

3. The method of claim 1, wherein the second set of fragments is retrieved from at least one fractional-storage Content Delivery Network (CDN) server configured to store at least one erasure-coded fragment but less than the minimum data required to reconstruct the segments.

4. The method of claim 3, wherein the first set of fragments is received from at least two fractional-storage CDN servers, wherein each fractional-storage CDN server configured to store at least one erasure-coded fragment but less than the minimum data required to reconstruct the segments.

5. The method of claim 3, wherein the first set of fragments is received from at least one streaming server using an HTTP or an RTP session.

6. The method of claim 3, wherein at least a portion of the first set and at least a portion of the second set are obtained from the same server.

7. The method of claim 3, further comprising determining the magnitude of the second set based on the fragment loss associated with the transmission.

8. The method of claim 1, further comprising reconstructing the segments from the received and retrieved fragments, and starting to present the reconstructed segments while fragments are still being received and retrieved.

9. The method of claim 1, wherein the erasure-coded fragments are rateless-coded fragments associated with segments of streaming content, and the first set of rateless-coded fragments is transmitted according to the sequential order of the segments.

10. The method of claim 9, wherein the push protocol does not require a feedback channel from the receiver.

11. An apparatus comprising: an assembling device configured to receive a first set of erasure-coded fragments associated with segments from at least one server using a push protocol, wherein from time to time the first set is insufficient to decode the received fragments, and erasure-coding denotes a process in which a sequence of erasure-coded fragments are generated from a segment such that the segment can be reconstructed from essentially any subset of the erasure-coded fragments of size not smaller than the size of the segment;
    the assembling device is further configured to pull on-the-fly a second set of erasure-coded fragments usable to decode the segments associated with the first set of erasure-coded fragments, wherein each fragment pull request associated with a specific segment, and the first and second sets together comprise enough fragments to decode the fragments, wherein the received erasure-coded fragments and the additional pulled erasure-coded fragments are of essentially the same erasure-coding and therefore the received erasure-coded fragments and the additional pulled erasure-coded fragments can be decoded together.

12. The apparatus of claim 11, wherein the erasure-coded fragments are associated with segments of streaming content, the fragments of the first set are transmitted essentially according to the sequential order of their associated segments, and the assembling device retrieves the second set of fragments from the at least one server.

13. The apparatus of claim 12, wherein the magnitude of the second set is based on the fragment loss associated with the transmission of the first set.

14. The apparatus of claim 11, wherein the fragments are associated with segments of streaming content, the fragments of the first set are transmitted essentially according to the sequential order of their associated segments, and the assembling device retrieves the second set of fragments from a fractional-storage server configured to store at least one erasure-coded fragment but less than the minimum data required to reconstruct the segments.

15. The apparatus of claim 14, wherein the fractional-storage server is a fractional-storage Content Delivery Network (CDN) server, and the erasure-coding is rateless-coding.

16. The apparatus of claim 14, wherein the first set is received via a broadcast or a multicast transmission.

17. The apparatus of claim 14, wherein the push protocol does not require a feedback channel from the receiver.

18. The apparatus of claim 14, wherein the first set is transmitted using a TCP/IP session or an RTP stream.

19. The apparatus of claim 14, wherein the first set is transmitted using at least one sub-transmission.

20. The apparatus of claim 14, wherein the magnitude of the second set is based on the fragment loss associated with the transmission of the first set.

* * * * *